(12) United States Patent  (10) Patent No.: US 9,175,868 B2
Fadell et al.                    (45) Date of Patent:     *Nov. 3, 2015

(54) THERMOSTAT USER INTERFACE

(71) Applicant: Google Inc., Mountain View, CA (US)

(72) Inventors: Anthony M. Fadell, Portola Valley, CA (US); Matthew L. Rogers, Los Gatos, CA (US); David Sloo, Menlo Park, CA (US); Michael Plitkins, Berkeley, CA (US); Shigefumi Honjo, Santa Cruz, CA (US); John B. Filson, Mountain View, CA (US); Michael J. Matas, San Francisco, CA (US); Fred Bould, Menlo Park, CA (US); Brian Huppi, San Francisco, CA (US)

(73) Assignee: GOOGLE INC., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/457,492

(22) Filed: Aug. 12, 2014

(65) Prior Publication Data

US 2014/0358297 A1    Dec. 4, 2014

Related U.S. Application Data

(63) Continuation of application No. 13/656,189, filed on Oct. 19, 2012.

(60) Provisional application No. 61/627,996, filed on Oct. 21, 2011.

(51) Int. Cl.
   *G05B 21/00*  (2006.01)
   *G01M 1/38*   (2006.01)
   (Continued)

(52) U.S. Cl.
   CPC ............ *F24F 11/0009* (2013.01); *F24F 11/00* (2013.01); *F24F 11/001* (2013.01);
   (Continued)

(58) Field of Classification Search
   CPC ... F24F 11/0009; F24F 11/006; F24F 11/001; F24F 11/0076; F24F 11/0034; F24F 11/0086; G05B 15/02; G01K 1/02; H04L 67/10; G06N 99/005; G01J 5/041; G01J 5/0025; G05D 23/1919; G05D 23/1932; G05D 23/2434; G05D 23/2723
   USPC ..................... 700/15, 276, 277; 165/237, 238
   See application file for complete search history.

(56) References Cited

U.S. PATENT DOCUMENTS 3,991,357 A   11/1976  Kaminski
4,157,506 A    6/1979  Spencer
(Continued)

FOREIGN PATENT DOCUMENTS

EP   0207295   1/1987
EP   1184804   3/2002
(Continued)

OTHER PUBLICATIONS

International Search Report and Written Opinion mailed Jul. 6, 2012 for International Patent Application No. PCT/US2012/030084 filed Mar. 22, 2012, 6 pages.

(Continued)

*Primary Examiner* — Mohammad Ali
*Assistant Examiner* — Ziaul Karim
(74) *Attorney, Agent, or Firm* — Kilpatrick Townsend & Stockton LLP

(57) ABSTRACT

A user-friendly, network-connected learning thermostat is described. The thermostat is made up of (1) a wall-mountable backplate that includes a low-power consuming microcontroller used for activities such as polling sensors and switching on and off the HVAC functions, and (2) separable head unit that includes a higher-power consuming microprocessor, color LCD backlit display, user input devices, and wireless communications modules. The thermostat also includes a rechargeable battery and power-stealing circuitry adapted to harvest power from HVAC triggering circuits. By maintaining the microprocessor in a "sleep" state often compared to the lower-power microcontroller, high-power consuming activities, such as learning computations, wireless network communications and interfacing with a user, can be temporarily performed by the microprocessor even though the activities use energy at a greater rate than is available from the power stealing circuitry.

18 Claims, 37 Drawing Sheets

(51) Int. Cl.

| | | |
|---|---|---|
| *G05B 13/00* | (2006.01) | |
| *G05B 15/00* | (2006.01) | |
| *G05D 23/00* | (2006.01) | |
| *F24F 11/00* | (2006.01) | |
| *G05D 23/19* | (2006.01) | |
| *G05D 23/27* | (2006.01) | |
| *G06F 3/0487* | (2013.01) | |
| *G05D 23/24* | (2006.01) | |
| *G01J 5/00* | (2006.01) | |
| *G01J 5/04* | (2006.01) | |
| *G06N 99/00* | (2010.01) | |
| *H04L 29/08* | (2006.01) | |
| *G01K 1/02* | (2006.01) | |
| *G05B 15/02* | (2006.01) | |

(52) U.S. Cl.
CPC .......... *F24F11/006* (2013.01); *F24F 11/0012* (2013.01); *F24F 11/0034* (2013.01); *F24F 11/0076* (2013.01); *F24F 11/0086* (2013.01); *G01J 5/0025* (2013.01); *G01J 5/041* (2013.01); *G01K 1/02* (2013.01); *G05B 15/02* (2013.01); *G05D 23/19* (2013.01); *G05D 23/1902* (2013.01); *G05D 23/1919* (2013.01); *G05D 23/1932* (2013.01); *G05D 23/2434* (2013.01); *G05D 23/2723* (2013.01); *G06F 3/0487* (2013.01); *G06N 99/005* (2013.01); *H04L 67/10* (2013.01); *F24F 2011/0035* (2013.01); *F24F 2011/0036* (2013.01); *F24F 2011/0071* (2013.01); *F24F 2011/0091* (2013.01); *Y02B 60/50* (2013.01); *Y02T 10/88* (2013.01)

(56) References Cited

U.S. PATENT DOCUMENTS

| | | | |
|---|---|---|---|
| 4,308,991 A | 1/1982 | Peinetti et al. | |
| 4,695,246 A | 9/1987 | Beilfuss et al. | |
| 4,842,510 A | 6/1989 | Grunden et al. | |
| 4,872,828 A | 10/1989 | Mierzwinski et al. | |
| 4,948,044 A | 8/1990 | Cacciatore | |
| 4,955,806 A | 9/1990 | Grunden et al. | |
| 5,127,464 A | 7/1992 | Butler et al. | |
| 5,158,477 A | 10/1992 | Testa et al. | |
| 5,175,439 A | 12/1992 | Haerer et al. | |
| 5,255,179 A | 10/1993 | Zekan et al. | |
| 5,347,982 A | 9/1994 | Binzer et al. | |
| 5,352,930 A | 10/1994 | Ratz | |
| 5,422,808 A | 6/1995 | Catanese, Jr. et al. | |
| 5,506,569 A | 4/1996 | Rowlette | |
| 5,544,036 A | 8/1996 | Brown, Jr. et al. | |
| 5,570,837 A | 11/1996 | Brown et al. | |
| 5,697,552 A | 12/1997 | McHugh et al. | |
| 5,736,795 A | 4/1998 | Zuehlke et al. | |
| 5,903,139 A | 5/1999 | Kompelien | |
| 6,060,719 A | 5/2000 | DiTucci et al. | |
| 6,072,784 A | 6/2000 | Agrawal et al. | |
| 6,084,518 A | 7/2000 | Jamieson | |
| 6,222,719 B1 | 4/2001 | Kadah | |
| 6,275,160 B1 | 8/2001 | Ha | |
| 6,356,038 B2 | 3/2002 | Bishel | |
| 6,509,838 B1 | 1/2003 | Payne et al. | |
| 6,513,723 B1 | 2/2003 | Mueller et al. | |
| 6,566,768 B2 | 5/2003 | Zimmerman et al. | |
| 6,622,925 B2 | 9/2003 | Carner et al. | |
| 6,657,418 B2 | 12/2003 | Atherton | |
| 6,743,010 B2 | 6/2004 | Bridgeman et al. | |
| 6,794,771 B2 | 9/2004 | Orloff | |
| 6,886,754 B2 | 5/2005 | Smith et al. | |
| 7,200,467 B2 | 4/2007 | Schanin et al. | |
| 7,476,988 B2 | 1/2009 | Mulhouse et al. | |
| 7,510,126 B2 | 3/2009 | Rossi et al. | |
| 7,537,171 B2 | 5/2009 | Mueller et al. | |
| 7,571,865 B2 | 8/2009 | Nicodem et al. | |
| 7,755,220 B2 | 7/2010 | Sorg et al. | |
| 8,265,798 B2 | 9/2012 | Imes | |
| 8,415,829 B2 | 4/2013 | Di Cristofaro | |
| 8,442,693 B2 * | 5/2013 | Mirza et al. | 700/276 |
| 8,706,270 B2 | 4/2014 | Fadell et al. | |
| 2002/0074865 A1 | 6/2002 | Zimmerman et al. | |
| 2003/0037555 A1 | 2/2003 | Street et al. | |
| 2003/0064335 A1 | 4/2003 | Canon | |
| 2003/0090243 A1 | 5/2003 | Atherton | |
| 2003/0231001 A1 | 12/2003 | Bruning | |
| 2004/0120084 A1 | 6/2004 | Readio et al. | |
| 2004/0209209 A1 | 10/2004 | Chodacki et al. | |
| 2004/0245349 A1 | 12/2004 | Smith | |
| 2005/0195757 A1 | 9/2005 | Kidder et al. | |
| 2006/0102731 A1 | 5/2006 | Mueller et al. | |
| 2006/0124759 A1 | 6/2006 | Rossi et al. | |
| 2007/0045433 A1 * | 3/2007 | Chapman et al. | 236/46 R |
| 2007/0084941 A1 * | 4/2007 | de Pauw et al. | 236/94 |
| 2007/0114848 A1 | 5/2007 | Mulhouse et al. | |
| 2007/0241203 A1 | 10/2007 | Wagner et al. | |
| 2007/0296280 A1 | 12/2007 | Sorg et al. | |
| 2008/0054084 A1 | 3/2008 | Olson | |
| 2008/0094010 A1 | 4/2008 | Black | |
| 2008/0133956 A1 | 6/2008 | Fadell | |
| 2008/0147242 A1 | 6/2008 | Roher et al. | |
| 2009/0195349 A1 | 8/2009 | Frader-Thompson et al. | |
| 2010/0070089 A1 | 3/2010 | Harrod et al. | |
| 2010/0084918 A1 | 4/2010 | Fells et al. | |
| 2010/0106305 A1 | 4/2010 | Pavlak et al. | |
| 2010/0106322 A1 | 4/2010 | Grohman | |
| 2011/0025257 A1 | 2/2011 | Weng | |
| 2011/0152024 A1 | 6/2011 | Kuehl | |
| 2012/0026726 A1 * | 2/2012 | Recker et al. | 362/157 |
| 2014/0358293 A1 | 12/2014 | Fadell et al. | |

FOREIGN PATENT DOCUMENTS

| | | |
|---|---|---|
| EP | 2769275 | 8/2014 |
| GB | 2294828 | 5/1996 |
| WO | 2008054938 | 5/2008 |
| WO | 2013058820 | 4/2013 |

OTHER PUBLICATIONS

International Preliminary Report on Patentability issued Apr. 22, 2014 for International Patent Application No. PCT/US2012/030084 filed Mar. 22, 2012, 5 pages.

Detroitborg, Nest Learning Thermostat: Unboxing and Review, [online], retrieved from the Internet: <URL: http://www.youtube.com/watch?v=KrgcOL4oLzc> [retrieved on Aug. 22, 2013], Feb. 10, 2012, 6 pages.

* cited by examiner

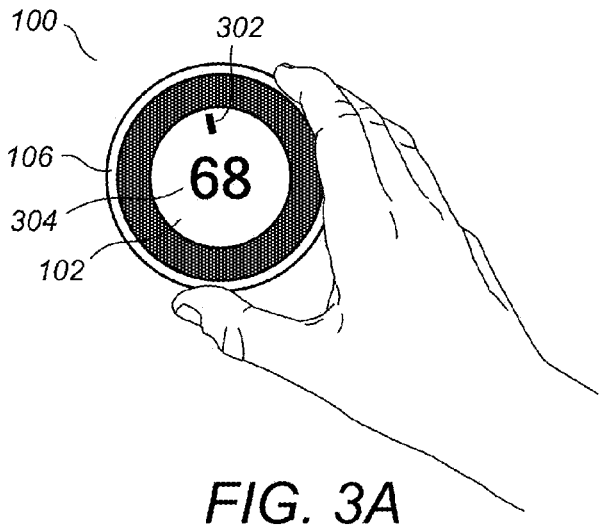
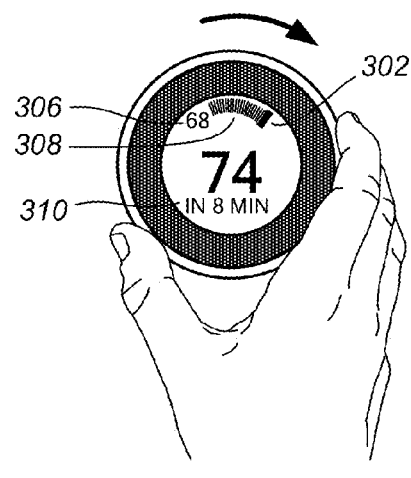
FIG. 3A  FIG. 3B
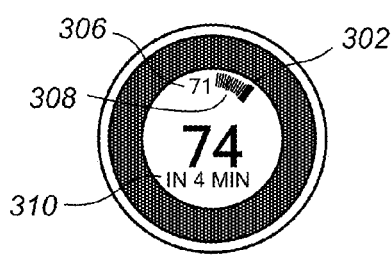  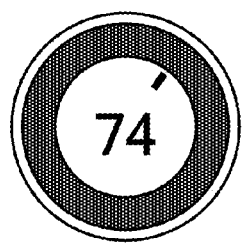
FIG. 3C  FIG. 3D  FIG. 3E
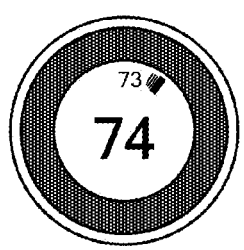  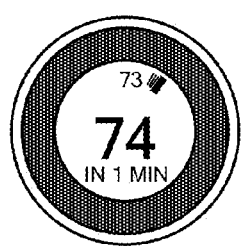
FIG. 3F  FIG. 3G  FIG. 3H
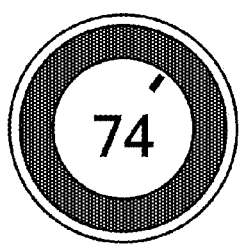 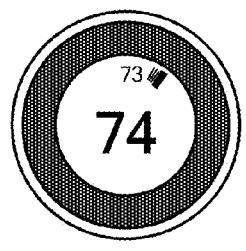 
FIG. 3I  FIG. 3J  FIG. 3K

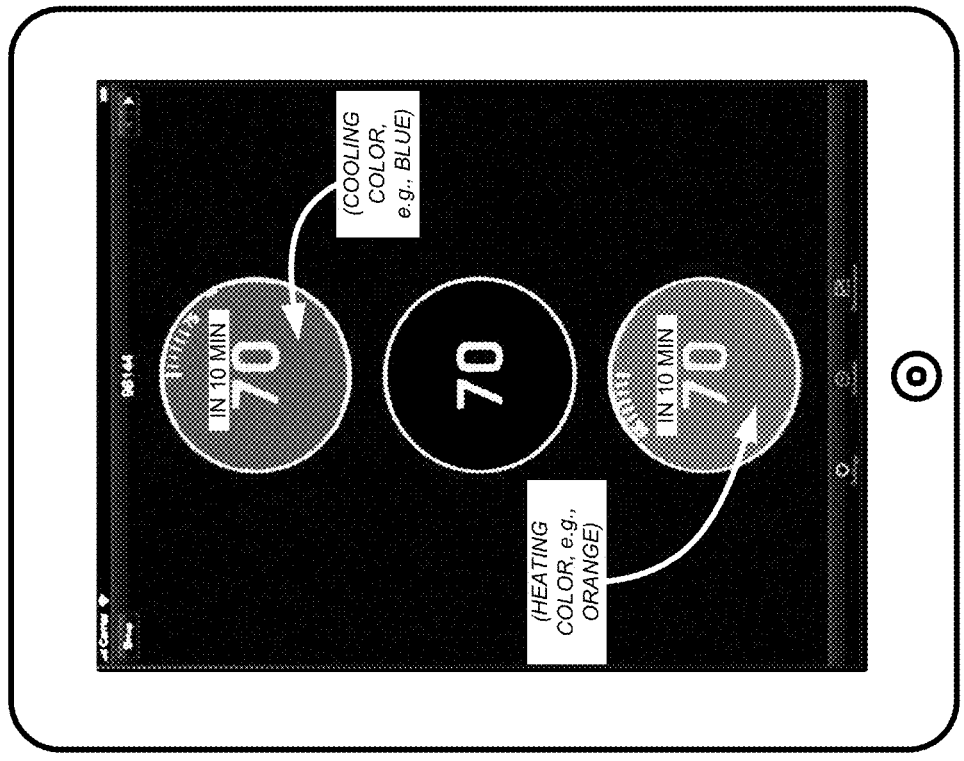
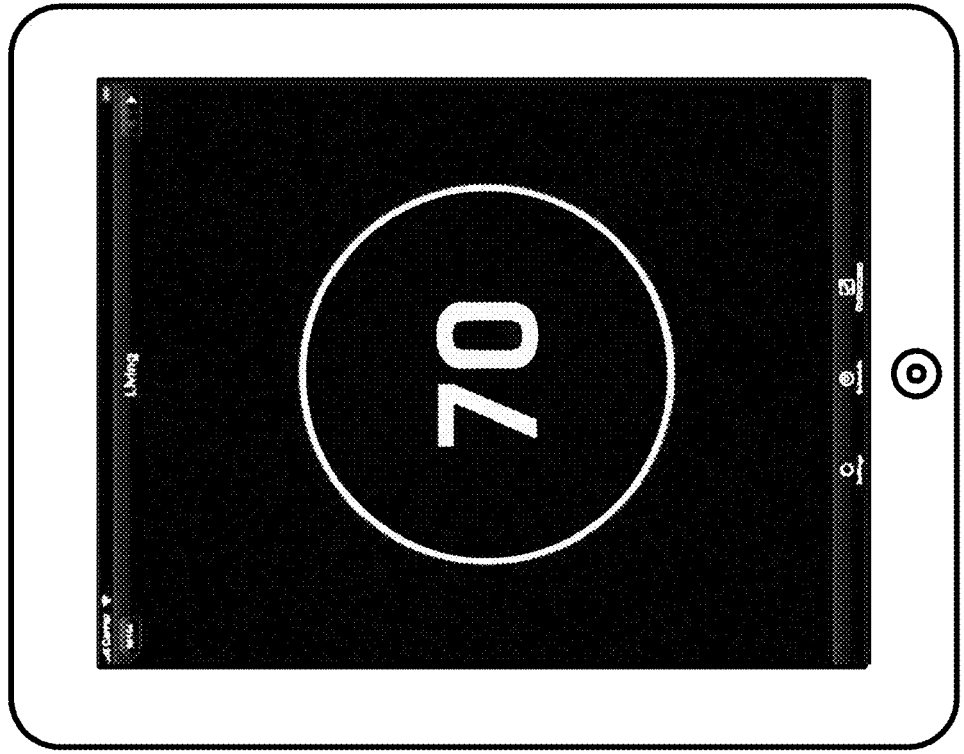
FIG. 14B

THERMOSTAT USER INTERFACE

CROSS REFERENCES

This patent application is a continuation of U.S. Ser. No. 13/656,189 filed Oct. 19, 2012. U.S. application Ser. No. 13/656,189 is a non-provisional application claiming priority to U.S. Prov. Pat. No. 61/627,996, filed on Oct. 21, 2011. Priority to each of these applications is claimed and each of the above-listed applications is hereby incorporated by reference in its entirety for all purposes.

FIELD

This patent specification relates to the judicious monitoring and control of resource usage. For some embodiments, this patent specification relates to the judicious monitoring and control of heating, cooling, and air conditioning (HVAC) system energy usage in a manner that promotes an optimal combination of energy savings and human comfort. The teachings of this patent specification are readily applied in other resource usage contexts as well (e.g., water usage, air usage, usage of other natural resources, and usage of various forms of energy).

BACKGROUND AND SUMMARY

While substantial effort and attention continues toward the development of newer and more sustainable energy supplies, the conservation of energy by increased energy efficiency remains crucial to the world's energy future. According to an October 2010 report from the U.S. Department of Energy, heating and cooling account for 56% of the energy use in a typical U.S. home, making it the largest energy expense for most homes. Along with improvements in the physical plant associated with home heating and cooling (e.g., improved insulation, higher efficiency furnaces), substantial increases in energy efficiency can be achieved by better control and regulation of home heating and cooling equipment. By activating heating, ventilation, and air conditioning (HVAC) equipment for judiciously selected time intervals and carefully chosen operating levels, substantial energy can be saved while at the same time keeping the living space suitably comfortable for its occupants.

Historically, however, most known HVAC thermostatic control systems have tended to fall into one of two opposing categories, neither of which is believed be optimal in most practical home environments. In a first category are many simple, non-programmable home thermostats, each typically consisting of a single mechanical or electrical dial for setting a desired temperature and a single HEAT-FAN-OFF-AC switch. While being easy to use for even the most unsophisticated occupant, any energy-saving control activity, such as adjusting the nighttime temperature or turning off all heating/cooling just before departing the home, must be performed manually by the user. As such, substantial energy-saving opportunities are often missed for all but the most vigilant users. Moreover, more advanced energy-saving settings are not provided, such as the ability to specify a custom temperature swing, i.e., the difference between the desired set temperature and actual current temperature (such as 1 to 3 degrees) required to trigger turn-on of the heating/cooling unit.

In a second category, on the other hand, are many programmable thermostats, which have become more prevalent in recent years in view of Energy Star (US) and TCO (Europe) standards, and which have progressed considerably in the number of different settings for an HVAC system that can be individually manipulated. Unfortunately, however, users are often intimidated by a dizzying array of switches and controls laid out in various configurations on the face of the thermostat or behind a panel door on the thermostat, and seldom adjust the manufacturer defaults to optimize their own energy usage. Thus, even though the installed programmable thermostats in a large number of homes are technologically capable of operating the HVAC equipment with energy-saving profiles, it is often the case that only the one-size-fits-all manufacturer default profiles are ever implemented in a large number of homes. Indeed, in an unfortunately large number of cases, a home user may permanently operate the unit in a "temporary" or "hold" mode, manually manipulating the displayed set temperature as if the unit were a simple, non-programmable thermostat.

At a more general level, because of the fact that human beings must inevitably be involved, there is a tension that arises between (i) the amount of energy-saving sophistication that can be offered by an HVAC control system, and (ii) the extent to which that energy-saving sophistication can be put to practical, everyday use in a large number of homes. Similar issues arise in the context of multi-unit apartment buildings, hotels, retail stores, office buildings, industrial buildings, and more generally any living space or work space having one or more HVAC systems. Other issues arise as would be apparent to one skilled in the art upon reading the present disclosure.

It is to be appreciated that although exemplary embodiments are presented herein for the particular context of HVAC system control, there are a wide variety of other resource usage contexts for which the embodiments are readily applicable including, but not limited to, water usage, air usage, the usage of other natural resources, and the usage of other (i.e., non-HVAC-related) forms of energy, as would be apparent to the skilled artisan in view of the present disclosure. Therefore, such application of the embodiments in such other resource usage contexts is not outside the scope of the present teachings.

Provided according to some embodiments is programmable device, such a thermostat, for controlling an HVAC system. The programmable device includes high-power consuming circuitry adapted and programmed to perform while in an active state a plurality of high power activities including interfacing with a user, the high-power consuming circuitry using substantially less power while in an inactive state or sleep state. The device also includes low-power consuming circuitry adapted and programmed to perform a plurality of low power activities, including for example causing the high-power circuitry to transition from the inactive to active states; polling sensors such as temperature and occupancy sensors; and switching on or off an HVAC functions. The device also includes power stealing circuitry adapted to harvest power from an HVAC triggering circuit for turning on and off an HVAC system function; and a power storage medium, such as a rechargeable battery, adapted to store power harvested by the power stealing circuitry for use by at least the high-power consuming circuitry such that the high-power consuming circuitry can temporarily operate in an active state while using energy at a greater rate than can be safely harvested by the power stealing circuitry without inadvertently switching the HVAC function. Examples of the high power activities includes wireless communication; driving display circuitry; displaying a graphical information to a user; and performing calculations relating to learning.

According to some embodiments, the high-power consuming circuitry includes a microprocessor and is located on a head unit, and the low-power consuming circuitry includes a microcontroller and is located on a backplate.

BRIEF DESCRIPTION OF THE DRAWINGS

FIGS. 3A-3K illustrate user temperature adjustment based on rotation of the outer ring along with an ensuing user interface display according to one embodiment;

FIGS. 13A-13B and FIGS. 14A-14B illustrate examples of remote graphical user interface displays presented to the user on their data appliance for managing their one or more VSCU units and/or otherwise interacting with their VSCU Efficiency Platform equipment or data according to an embodiment;

DETAILED DESCRIPTION OF THE INVENTION

Figure 1A:
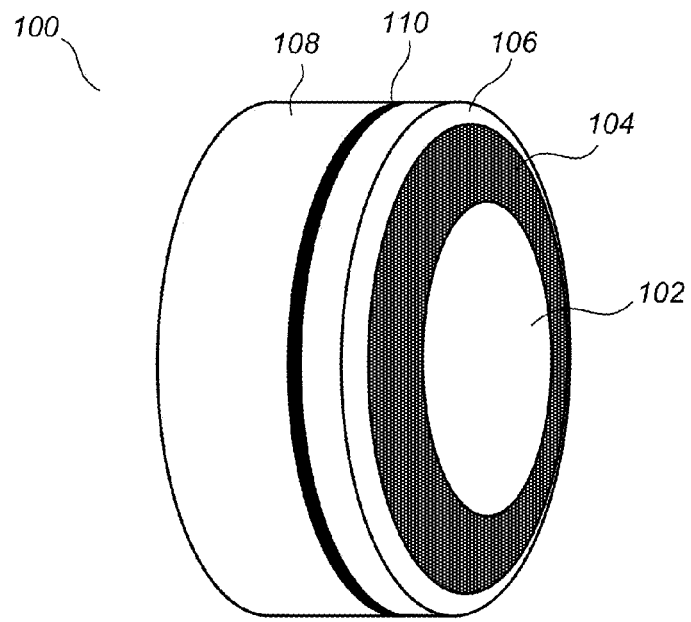
FIG. 1A illustrates a perspective view of a versatile sensing and control unit (VSCU unit) according to an embodiment.

The subject matter of this patent specification relates to the subject matter of the following commonly assigned applications, each of which is incorporated by reference herein: U.S. Ser. No. 12/984,602 filed Jan. 4, 2011; U.S. Ser. No. 12/987,257 filed Jan. 10, 2011; U.S. Ser. No. 13/033,573 filed Feb. 23, 2011; U.S. Ser. No. 13/034,666 filed Feb. 24, 2011; U.S. Ser. No. 13/034,674 filed Feb. 24, 2011; U.S. Ser. No. 13/034,678 filed Feb. 24, 2011; U.S. Ser. No. 13/038,191 filed Mar. 1, 2011; U.S. Ser. No. 13/038,206 filed Mar. 1, 2011; U.S. Ser. No. 13/199,108, filed Aug. 17, 2011; U.S. Ser. No. 13/267,871 filed Oct. 6, 2011; U.S. Ser. No. 13/267,877 filed Oct. 6, 2011; U.S. Ser. No. 13/269,501, filed Oct. 7, 2011; U.S. Ser. No. 13/275,307 filed Oct. 17, 2011; U.S. Ser. No. 13/275,311 filed Oct. 17, 2011; U.S. Ser. No. 13/317,423 filed Oct. 17, 2011; U.S. Ser. No. 13/279,151 filed Oct. 21, 2011; U.S. Ser. No. 13/317,557 filed Oct. 21, 2011; and International Application No. PCT/US12/30084 filed 22 Mar. 2012. One or more of the above-referenced commonly assigned applications claims the benefit of U.S. Prov. Ser. No. 61/415,771 filed Nov. 19, 2010 and U.S. Prov. Ser. No. 61/429,093 filed Dec. 31, 2010, each of which is incorporated by reference herein. The above-referenced patent applications are collectively referenced herein as "the commonly assigned incorporated applications."

Provided according to one or more embodiments are systems, methods, computer program products, and related business methods for controlling one or more HVAC systems based on one or more versatile sensing and control units (VSCU units), each VSCU unit being configured and adapted to provide sophisticated, customized, energy-saving HVAC control functionality while at the same time being visually appealing, non-intimidating, elegant to behold, and delightfully easy to use. Each VSCU unit is advantageously provided with a selectively layered functionality, such that unsophisticated users are only exposed to a simple user interface, but such that advanced users can access and manipulate many different energy-saving and energy tracking capabilities. Importantly, even for the case of unsophisticated users who are only exposed to the simple user interface, the VSCU unit provides advanced energy-saving functionality that runs in the background, the VSCU unit quietly using multi-sensor technology to "learn" about the home's heating and cooling environment and optimizing the energy-saving settings accordingly.

The VSCU unit also "learns" about the users themselves, beginning with a congenial "setup interview" in which the user answers a few simple questions, and then continuing over time using multi-sensor technology to detect user occupancy patterns (e.g., what times of day they are home and away) and by tracking the way the user controls the set temperature on the dial over time. The multi-sensor technology is advantageously hidden away inside the VSCU unit itself, thus avoiding the hassle, complexity, and intimidation factors associated with multiple external sensor-node units. On an ongoing basis, the VSCU unit processes the learned and sensed information according to one or more advanced control algorithms, and then automatically adjusts its environmental control settings to optimize energy usage while at the same time maintaining the living space at optimal levels according to the learned occupancy patterns and comfort preferences of the user. Even further, the VSCU unit is programmed to promote energy-saving behavior in the users themselves by virtue of displaying, at judiciously selected times on its visually appealing user interface, information that encourages reduced energy usage, such as historical energy cost performance, forecasted energy costs, and even fun game-style displays of congratulations and encouragement.

Advantageously, the selectively layered functionality of the VSCU unit allows it to be effective for a variety of different technological circumstances in home and business environments, thereby making the same VSCU unit readily saleable to a wide variety of customers. For simple environments having no wireless home network or internet connectivity, the VSCU unit operates effectively in a standalone mode, being capable of learning and adapting to its environment based on multi-sensor technology and user input, and optimizing HVAC settings accordingly. However, for environments that do indeed have home network or internet connectivity, the VSCU unit operates effectively in a network-connected mode to offer a rich variety of additional capabilities.

When the VSCU unit is connected to the internet via a home network, such as through IEEE 802.11 (Wi-Fi) connectivity, additional capabilities provided according to one or more embodiments include, but are not limited to: providing real time or aggregated home energy performance data to a utility company, VSCU data service provider, VSCU units in other homes, or other data destinations; receiving real time or aggregated home energy performance data from a utility company, VSCU data service provider, VSCU units in other homes, or other data sources; receiving new energy control algorithms or other software/firmware upgrades from one or more VSCU data service providers or other sources; receiving current and forecasted weather information for inclusion in energy-saving control algorithm processing; receiving user control commands from the user's computer, network-connected television, smart phone, or other stationary or portable data communication appliance (hereinafter collectively referenced as the user's "digital appliance"); providing an interactive user interface to the user through their digital appliance; receiving control commands and information from an external energy management advisor, such as a subscription-based service aimed at leveraging collected information from multiple sources to generate the best possible energy-saving control commands or profiles for their subscribers; receiving control commands and information from an external energy management authority, such as a utility company to whom limited authority has been voluntarily given to control the VSCU in exchange for rebates or other cost incentives (e.g., for energy emergencies, "spare the air" days, etc.); providing alarms, alerts, or other information to the user on their digital appliance (and/or a user designee such as a home repair service) based on VSCU-sensed HVAC-related events (e.g., the house is not heating up or cooling down as expected); providing alarms, alerts, or other information to the user on their digital appliance (and/or a user designee such as a home security service or the local police department) based on VSCU-sensed non-HVAC related events (e.g., an intruder alert as sensed by the VSCU's multi-sensor technology); and a variety of other useful functions enabled by network connectivity as disclosed in one or more of the examples provided further hereinbelow.

It is to be appreciated that while one or more embodiments is detailed herein for the context of a residential home, such as a single-family house, the scope of the present teachings is not so limited, the present teachings being likewise applicable, without limitation, to duplexes, townhomes, multi-unit apartment buildings, hotels, retail stores, office buildings, industrial buildings, and more generally any living space or work space having one or more HVAC systems. It is to be further appreciated that while the terms user, customer, installer, homeowner, occupant, guest, tenant, landlord, repair person, and the like may be used to refer to the person or persons who are interacting with the VSCU unit or other device or user interface in the context of some particularly advantageous situations described herein, these references are by no means to be considered as limiting the scope of the present teachings with respect to the person or persons who are performing such actions. Thus, for example, the terms user, customer, purchaser, installer, subscriber, and homeowner may often refer to the same person in the case of a single-family residential dwelling, because the head of the household is often the person who makes the purchasing decision, buys the unit, and installs and configures the unit, and is also one of the users of the unit and is a customer of the utility company and/or VSCU data service provider. However, in other scenarios, such as a landlord-tenant environment, the customer may be the landlord with respect to purchasing the unit, the installer may be a local apartment supervisor, a first user may be the tenant, and a second user may again be the landlord with respect to remote control functionality. Importantly, while the identity of the person performing the action may be germane to a particular advantage provided by one or more of the embodiments—for example, the password-protected temperature governance functionality described further herein may be particularly advantageous where the landlord holds the sole password and can prevent energy waste by the tenant—such identity should not be construed in the descriptions that follow as necessarily limiting the scope of the present teachings to those particular individuals having those particular identities.

As used herein, "set point" or "temperature set point" refers to a target temperature setting of a temperature control system, such as one or more of the VSCU units described herein, as set by a user or automatically according to a schedule. As would be readily appreciated by a person skilled in the art, many of the disclosed thermostatic functionalities described hereinbelow apply, in counterpart application, to both the heating and cooling contexts, with the only different being in the particular set points and directions of temperature movement. To avoid unnecessary repetition, some examples of the embodiments may be presented herein in only one of these contexts, without mentioning the other. Therefore, where a particular embodiment or example is set forth hereinbelow in the context of home heating, the scope of the present teachings is likewise applicable to the counterpart context of home cooling, and vice versa, to the extent such counterpart application would be logically consistent with the disclosed principles as adjudged by the skilled artisan.

FIG. 1A illustrates a perspective view of a versatile sensing and control unit (VSCU unit) 100 according to an embodiment. Unlike so many prior art thermostats, the VSCU unit 100 preferably has a sleek, elegant appearance that does not detract from home decoration, and indeed can serve as a visually pleasing centerpiece for the immediate location in which it is installed. The VSCU unit 100 comprises a main body 108 that is preferably circular with a diameter of about 8 cm, and that has a visually pleasing outer finish, such as a satin nickel or chrome finish. Separated from the main body 108 by a small peripheral gap 110 is a cap-like structure comprising a rotatable outer ring 106, a sensor ring 104, and a circular display monitor 102. The outer ring 106 preferably has an outer finish identical to that of the main body 108, while the sensor ring 104 and circular display monitor 102 have a common circular glass (or plastic) outer covering that is gently arced in an outward direction and that provides a sleek yet solid and durable-looking overall appearance. The sensor ring 104 contains any of a wide variety of sensors including, without limitation, infrared sensors, visible-light sensors, and acoustic sensors. Preferably, the glass (or plastic) that covers the sensor ring 104 is smoked or mirrored such that the sensors themselves are not visible to the user. An air venting functionality is preferably provided, such as by virtue of the peripheral gap 110, which allows the ambient air to be sensed by the internal sensors without the need for visually unattractive "gills" or grill-like vents.

Figure 1B:
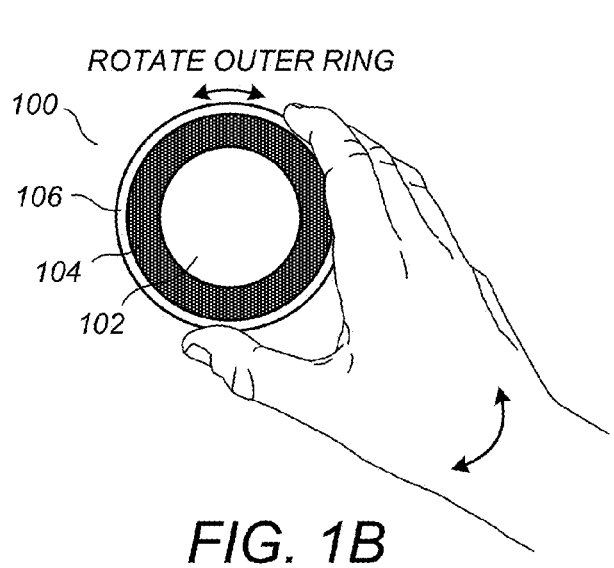
FIGS. 1B-1C illustrate the VSCU unit as it is being controlled by the hand of a user according to an embodiment.
Figure 1C:
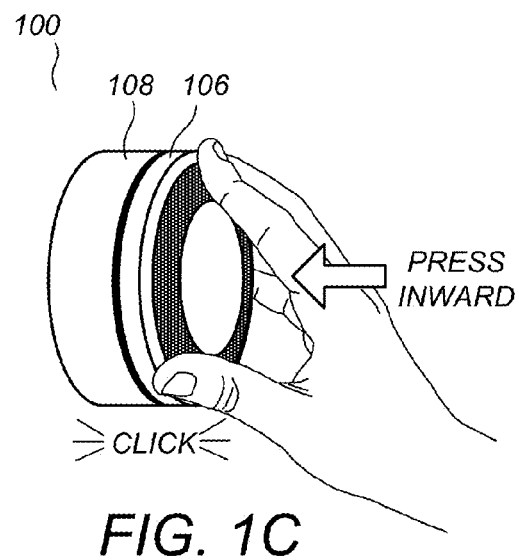

FIGS. 1B-1C illustrate the VSCU unit 100 as it is being controlled by the hand of a user according to an embodiment. In one embodiment, for the combined purposes of inspiring user confidence and further promoting visual and functional elegance, the VSCU unit 100 is controlled by only two types of user input, the first being a rotation of the outer ring 106 (FIG. 1B), and the second being an inward push on the outer ring 106 (FIG. 1C) until an audible and/or tactile "click" occurs. For one embodiment, the inward push of FIG. 1C only causes the outer ring 106 to move forward, while in another embodiment the entire cap-like structure, including both the outer ring 106 and the glass covering of the sensor ring 104 and circular display monitor 102, move inwardly together when pushed. Preferably, the sensor ring 104, the circular display monitor 102, and their common glass covering do not rotate with outer ring 106.

By virtue of user rotation of the outer ring 106 (referenced hereafter as a "ring rotation") and the inward pushing of the outer ring 106 (referenced hereinafter as an "inward click") responsive to intuitive and easy-to-read prompts on the circular display monitor 102, the VSCU unit 100 is advantageously capable of receiving all necessary information from the user for basic setup and operation. Preferably, the outer ring 106 is mechanically mounted in a manner that provides a smooth yet viscous feel to the user, for further promoting an overall feeling of elegance while also reducing spurious or unwanted rotational inputs. For one embodiment, the VSCU unit 100 recognizes three fundamental user inputs by virtue of the ring rotation and inward click: (1) ring rotate left, (2) ring rotate right, and (3) inward click. For other embodiments, more complex fundamental user inputs can be recognized, such as "double-click" or "triple-click" inward presses, and such as speed-sensitive or acceleration-sensitive rotational inputs (e.g., a very large and fast leftward rotation specifies an "Away" occupancy state, while a very large and fast rightward rotation specifies an "Occupied" occupancy state).

Although the scope of the present teachings is not so limited, it is preferred that there not be provided a discrete mechanical HEAT-COOL toggle switch, or HEAT-OFF-COOL selection switch, or HEAT-FAN-OFF-COOL switch anywhere on the VSCU unit 100, this omission contributing to the overall visual simplicity and elegance of the VSCU unit 100 while also facilitating the provision of advanced control abilities that would otherwise not be permitted by the existence of such a switch. It is further highly preferred that there be no electrical proxy for such a discrete mechanical switch (e.g., an electrical push button or electrical limit switch directly driving a mechanical relay). Instead, it is preferred that the switching between these settings be performed under computerized control of the VSCU unit 100 responsive to its multi-sensor readings, its programming (optionally in conjunction with externally provided commands/data provided over a data network), and/or the above-described "ring rotation" and "inward click" user inputs.

The VSCU unit 100 comprises physical hardware and firmware configurations, along with hardware, firmware, and software programming that is capable of carrying out the functionalities described in the instant disclosure. In view of the instant disclosure, a person skilled in the art would be able to realize the physical hardware and firmware configurations and the hardware, firmware, and software programming that embody the physical and functional features described herein without undue experimentation using publicly available hardware and firmware components and known programming tools and development platforms. Similar comments apply to described devices and functionalities extrinsic to the VSCU unit 100, such as devices and programs used in remote data storage and data processing centers that receive data communications from and/or that provide data communications to the VSCU unit 100. By way of example, references hereinbelow to one or more preinstalled databases inside the VSCU unit 100 that are keyed to different ZIP codes can be carried out using flash memory technology similar to that used in global positioning based navigation devices. By way of further example, references hereinbelow to machine learning and mathematical optimization algorithms, as carried out respectively by the VSCU unit 100 in relation to home occupancy prediction and set point optimization, for example, can be carried out using one or more known technologies, models, and/or mathematical strategies including, but not limited to, artificial neural networks, Bayesian networks, genetic programming, inductive logic programming, support vector machines, decision tree learning, clustering analysis, dynamic programming, stochastic optimization, linear regression, quadratic regression, binomial regression, logistic regression, simulated annealing, and other learning, forecasting, and optimization techniques.

Figure 2A:
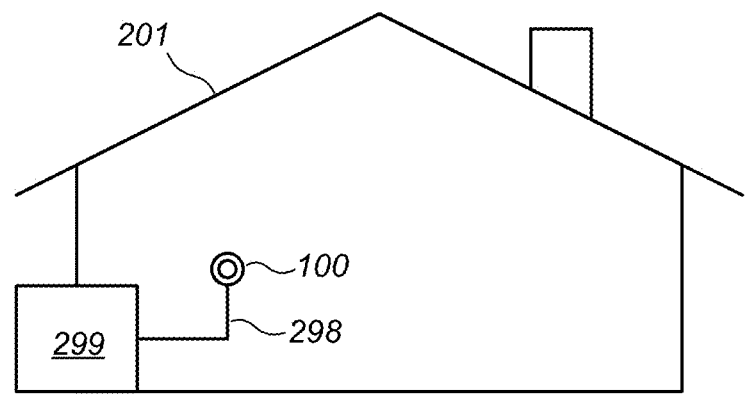
FIG. 2A illustrates the VSCU unit as installed in a house having an HVAC system and a set of control wires extending therefrom.

FIG. 2A illustrates the VSCU unit 100 as installed in a house 201 having an HVAC system 299 and a set of control wires 298 extending therefrom. The VSCU unit 100 is, of course, extremely well suited for installation by contractors in new home construction and/or in the context of complete HVAC system replacement. However, one alternative key business opportunity leveraged according to one embodiment is the marketing and retailing of the VSCU unit 100 as a replacement thermostat in an existing homes, wherein the customer (and/or an HVAC professional) disconnects their old thermostat from the existing wires 298 and substitutes in the VSCU unit 100.

In either case, the VSCU unit 100 can advantageously serve as an "inertial wedge" for inserting an entire energy-saving technology platform into the home. Simply stated, because most homeowners understand and accept the need for home to have a thermostat, even the most curmudgeonly and techno-phobic homeowners will readily accept the simple, non-intimidating, and easy-to-use VSCU unit 100 into their homes. Once in the home, of course, the VSCU unit 100 will advantageously begin saving energy for a sustainable planet and saving money for the homeowner, including the curmudgeons. Additionally, however, as homeowners "warm up" to the VSCU unit 100 platform and begin to further appreciate its delightful elegance and seamless operation, they will be more inclined to take advantage of its advanced features, and they will furthermore be more open and willing to embrace a variety of compatible follow-on products and services as are described further hereinbelow. This is an advantageous win-win situation on many fronts, because the planet is benefitting from the propagation of energy-efficient technology, while at the same time the manufacturer of the VSCU unit and/or their authorized business partners can further expand their business revenues and prospects. For clarity of disclosure, the term "VSCU Efficiency Platform" refers herein to products and services that are technologically compatible with the VSCU unit 100 and/or with devices and programs that support the operation of the VSCU unit 100.

Figure 2B:
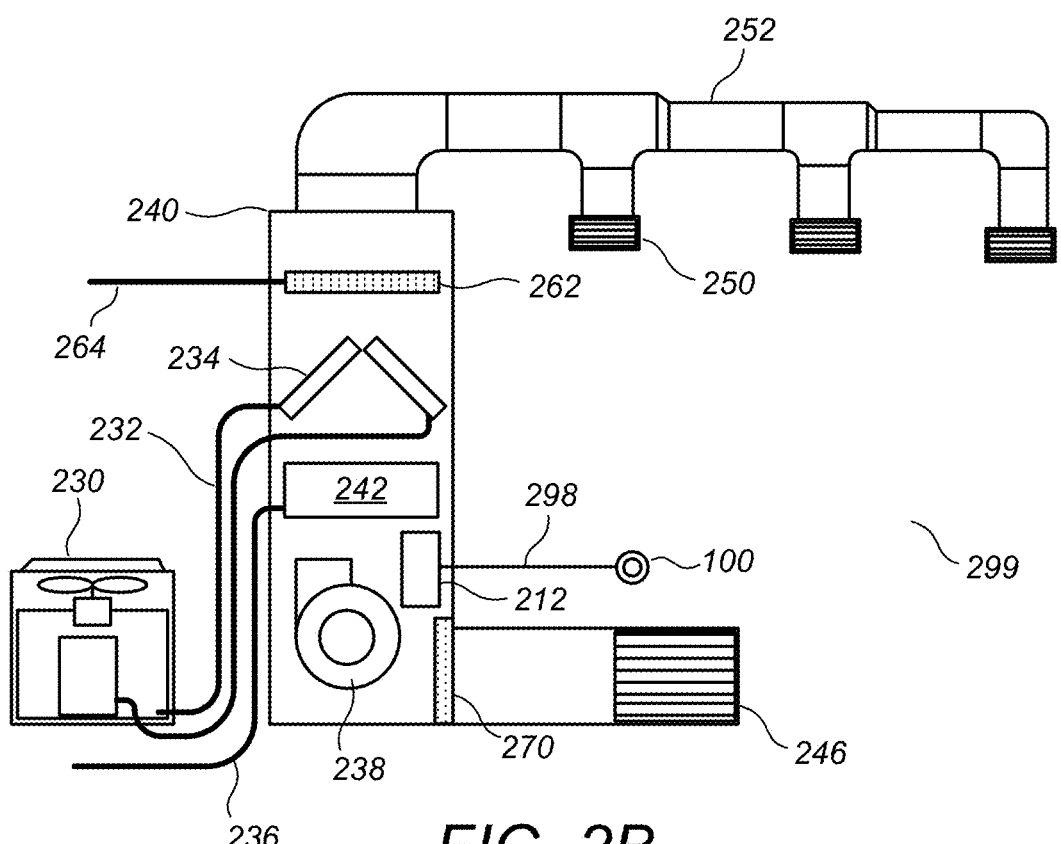
FIG. 2B illustrates an exemplary diagram of the HVAC system of FIG. 2A.

FIG. 2B illustrates an exemplary diagram of the HVAC system 299 of FIG. 2A. HVAC system 299 provides heating, cooling, ventilation, and/or air handling for an enclosure, such as the single-family home 201 depicted in FIG. 2A. The HVAC system 299 depicts a forced air type heating system, although according to other embodiments, other types of systems could be used. In heating, heating coils or elements 242 within air handler 240 provide a source of heat using electricity or gas via line 236. Cool air is drawn from the enclosure via return air duct 246 through filter 270 using fan 238 and is heated by the heating coils or elements 242. The heated air flows back into the enclosure at one or more locations through a supply air duct system 252 and supply air grills such as grill 250. In cooling, an outside compressor 230 passes a gas such as Freon through a set of heat exchanger coils to cool the gas. The gas then goes via line 232 to the cooling coils 234 in the air handlers 240 where it expands, cools and cools the air being circulated through the enclosure via fan 238. According to some embodiments a humidifier 262 is also provided which moistens the air using water provided by a water line 264. Although not shown in FIG. 2B, according to some embodiments the HVAC system for the enclosure has other known components such as dedicated outside vents to pass air to and from the outside, one or more dampers to control airflow within the duct systems, an emergency heating unit, and a dehumidifier. The HVAC system is selectively actuated via control electronics 212 that communicate with the VSCU 100 over control wires 298.

FIGS. 3A-3K illustrate user temperature adjustment based on rotation of the outer ring 106 along with an ensuing user interface display according to one embodiment. For one embodiment, prior to the time depicted in FIG. 3A in which the user has walked up to the VSCU unit 100, the VSCU unit 100 has set the circular display monitor 102 to be entirely blank ("dark"), which corresponds to a state of inactivity when no person has come near the unit. As the user walks up to the display, their presence is detected by one or more sensors in the VSCU unit 100 at which point the circular display monitor 102 is automatically turned on. When this happens, as illustrated in FIG. 3A, the circular display monitor 102 displays the current set point in a large font at a center readout 304. Also displayed is a set point icon 302 disposed along a periphery of the circular display monitor 102 at a location that is spatially representative the current set point. Although it is purely electronic, the set point icon 302 is reminiscent of older mechanical thermostat dials, and advantageously imparts a feeling of familiarity for many users as well as a sense of tangible control.

Notably, the example of FIG. 3A assumes a scenario for which the actual current temperature of 68 is equal to the set point temperature of 68 when the user has walked up to the VSCU unit 100. For a case in which the user walks up to the VSCU unit 100 when the actual current temperature is different than the set point temperature, the display would also include an actual temperature readout and a trailing icon, which are described further below in the context of FIGS. 3B-3K.

Referring now to FIG. 3B, as the user turns the outer ring 106 clockwise, the increasing value of the set point temperature is instantaneously provided at the center readout 304, and the set point icon 302 moves in a clockwise direction around the periphery of the circular display monitor 102 to a location representative of the increasing set point. Whenever the actual current temperature is different than the set point temperature, an actual temperature readout 306 is provided in relatively small digits along the periphery of the circular a location spatially representative the actual current temperature. Further provided is a trailing icon 308, which could alternatively be termed a tail icon or difference-indicating, that extends between the location of the actual temperature readout 306 and the set point icon 302. Further provided is a time-to-temperature readout 310 that is indicative of a prediction, as computed by the VSCU unit 100, of the time interval required for the HVAC system to bring the temperature from the actual current temperature to the set point temperature.

FIGS. 3C-3K illustrate views of the circular display monitor 102 at exemplary instants in time after the user set point change that was completed in FIG. 3B (assuming, of course, that the circular display monitor 102 has remained active, such as during a preset post-activity time period, responsive to the continued proximity of the user, or responsive the detected proximity of another occupant). Thus, at FIG. 3C, the current actual temperature is about halfway up from the old set point to the new set point, and in FIG. 3D the current actual temperature is almost at the set point temperature. As illustrated in FIG. 3E, both the trailing icon 308 and the actual temperature readout 306 disappear when the current actual temperature reaches the set point temperature and the heating system is turned off. Then, as typically happens in home heating situations, the actual temperature begins to sag (FIG. 3F) until the permissible temperature swing is reached (which is 2 degrees in this example, see FIG. 3G), at which point the heating system is again turned on and the temperature rises to the set point (FIGS. 3H-3I) and the heating system is turned off. The current actual temperature then begins to sag again (FIGS. 3J-3K), and the cycle continues. Advantageously, by virtue of the user interface functionality of FIGS. 3A-3K including the time-to-temperature readout 310, the user is provided with a fast, intuitive, visually pleasing overview of system operation, as well as a quick indication of how much longer the heating system (or cooling system in counterpart embodiments) will remain turned on. It is to be appreciated that the use of 2 degrees as the permissible temperature swing in FIGS. 3C-3K is only for purposes of example, and that different amounts of permissible temperature swing may be applicable at different times according to the particular automated control algorithms, defaults, user settings, user overrides, etc. that may then be in application at those times.

For one embodiment, the VSCU unit 100 is designed to be entirely silent unless a user has walked up and begun controlling the unit. Advantageously, there are no clicking-type annoyances when the heating or cooling units are activated as with conventional prior art thermostats. Optionally, the VSCU unit 100 can be configured to synthesize artificial audible clicks, such as can be output through a piezoelectric speaker, to provide "tick" feedback as the user dials through different temperature settings.

Figure 4:
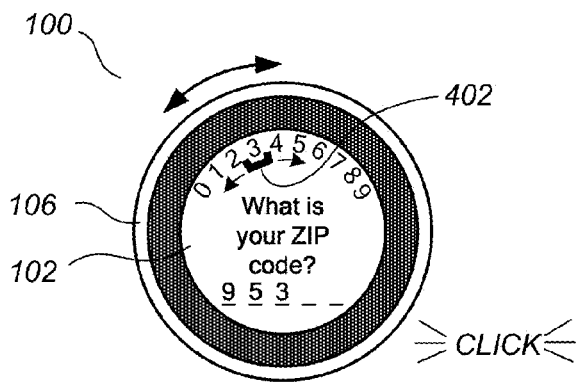
FIG. 4 illustrates a data input functionality provided by the user interface of the VSCU unit according to an embodiment.

FIG. 4 illustrates a data input functionality provided by the user interface of the VSCU unit 100 according to an embodiment, for a particular non-limiting example in which the user is asked, during a congenial setup interview (which can occur at initial VSCU unit installation or at any subsequent time that the user may request), to enter their ZIP code. Responsive to a display of digits 0-9 distributed around a periphery of the circular display monitor 102 along with a selection icon 402, the user turns the outer ring 106 to move the selection icon 402 to the appropriate digit, and then provides an inward click command to enter that digit.

For one embodiment, the VSCU unit 100 is programmed to provide a software lockout functionality, wherein a person is required to enter a password or combination before the VSCU unit 100 will accept their control inputs. The user interface for password request and entry can be similar to that shown in FIG. 4. The software lockout functionality can be highly useful, for example, for Mom and Dad in preventing their teenager from making unwanted changes to the set temperature, for various landlord-tenant scenarios, and in a variety of other situations.

Figure 5A:
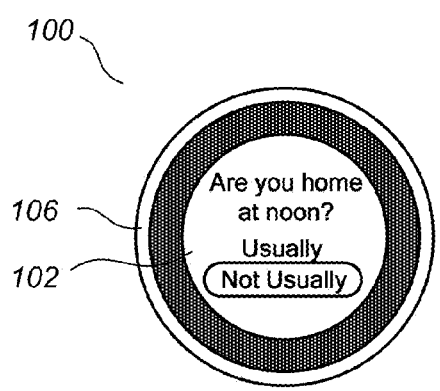
FIGS. 5A-5B illustrate a similar data input functionality provided by the user interface of the VSCU unit for answering various questions during the set up interview.
Figure 5B:
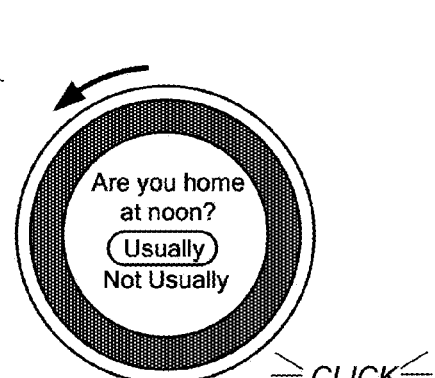

FIGS. 5A-5B illustrate a similar data input functionality provided by the user interface of the VSCU unit 100 for answering various questions during the set up interview. The user rotates the outer ring 106 until the desired answer is highlighted, and then provides an inward click command to enter that answer.

Figure 6A:
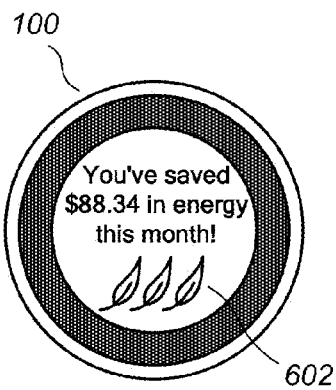
FIGS. 6A-6C illustrate some of the many examples of user interface displays provided by the VSCU unit according to embodiments.
Figure 6B:
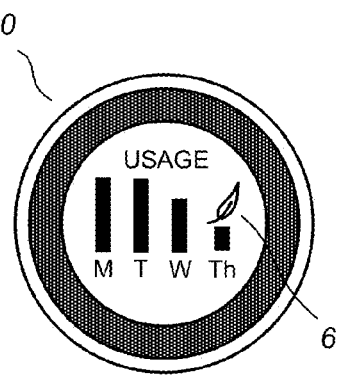
Figure 6C:
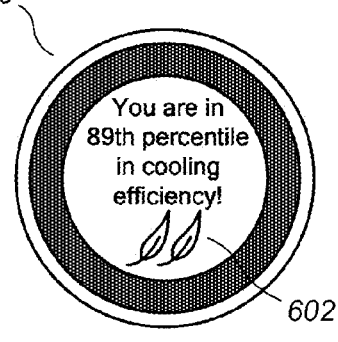

FIGS. 6A-6C illustrate some of the many examples of user interface displays provided by the VSCU unit 100 according to embodiments directed to influencing energy-conscious behavior on the part of the user. At judiciously selected times (for example, on the same day that the monthly utility bill is e-mailed to the homeowner), or upon user request, or at other times including random points in time, the VSCU unit 100 displays information on its visually appealing user interface that encourages reduced energy usage. In one example shown in FIG. 6A, the user is shown a message of congratulations regarding a particular energy-saving (and therefore money-saving) accomplishment they have achieved for their household. It has been found particularly effective to include pictures or symbols, such as leaf icons 602, that evoke pleasant feelings or emotions in the user for providing positive reinforcement of energy-saving behavior. Although not believed to be as advantageous as positive reinforcement, it is within the scope of the present teachings for the VSCU unit 100 to show messages of negative reinforcement as well, such as by displaying unpleasant pictures of smokestacks churning out black smoke to depict energy-hogging performance.

FIG. 6B illustrates another example of an energy performance display that can influence user energy-saving behavior, comprising a display of the household's recent energy use on a daily basis (or weekly, monthly, etc.) and providing a positive-feedback leaf icon 602 for days of relatively low energy usage. Notably, messages such as those of FIG. 6A can be displayed for customers who are not Wi-Fi enabled, based on the known cycle times and durations of the home HVAC equipment as tracked by the VSCU unit 100. Indeed, although a bit more involved, messages such as those of FIG. 6A could also be displayed for customers who are not Wi-Fi enabled, based on the known HVAC cycle times and durations combined with pre-programmed estimates of energy costs for their ZIP code and/or user-entered historical energy cost information from their past utility bills as may be provided, for example, during the congenial setup interview.

For another example shown in FIG. 6C, the user is shown information about their energy performance status or progress relative to a population of other VSCU-equipped owners who are similarly situated from an energy usage perspective. For this type of display, and similar displays in which data from other homes and/or central databases is required, it is required that the VSCU unit 100 be network-enabled. It has been found particularly effective to provide competitive or game-style information to the user as an additional means to influence their energy-saving behavior. As illustrated in FIG. 6B, positive-feedback leaf icons 602 can be added to the display if the user's competitive results are positive. Optionally, the leaf icons 602 can be associated with a frequent flyer miles-type point-collection scheme or carbon credit-type business method, as administered for example by an external VSCU data service provider (see FIG. 12, infra) such there is a tangible, fiscal reward that is also associated with the emotional reward.

For some embodiments, the VSCU unit 100 is manufactured and sold as a single, monolithic structure containing all of the required electrical and mechanical connections on the back of the unit. For some embodiments, the VSCU 100 is manufactured and/or sold in different versions or packaging groups depending on the particular capabilities of the manufacturer(s) and the particular needs of the customer. For example, the VSCU unit 100 is provided in some embodiments as the principal component of a two-part combination consisting of the VSCU 100 and one of a variety of dedicated docking devices, as described further hereinbelow.

Figure 7:
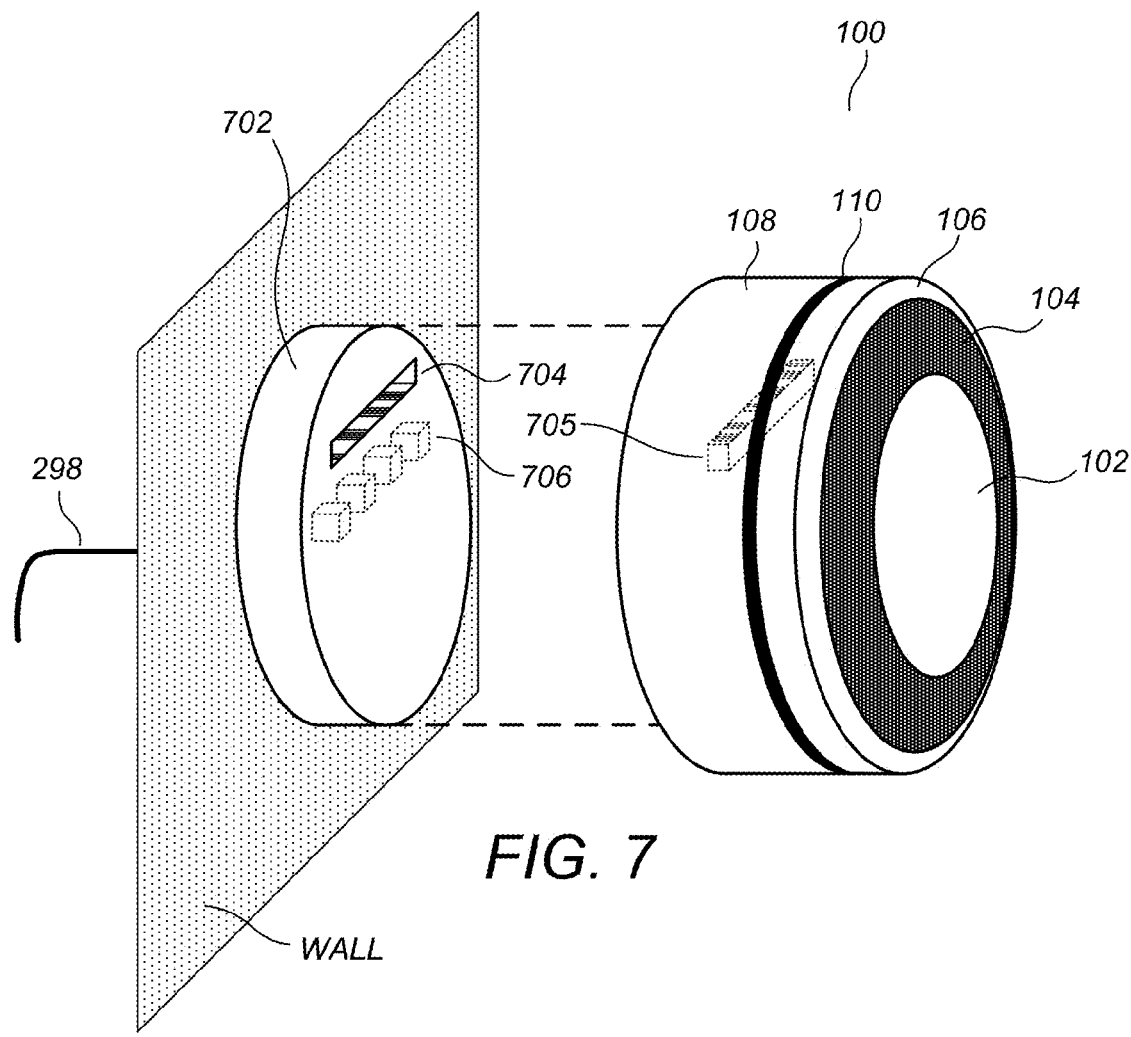
FIG. 7 illustrates an exploded perspective view of the VSCU unit and an HVAC-coupling wall dock according to an embodiment.

FIG. 7 illustrates an exploded perspective view of the VSCU unit 100 and an HVAC-coupling wall dock 702 according to an embodiment. For first-time customers who are going to be replacing their old thermostat, the VSCU unit 100 is provided in combination with HVAC-coupling wall dock 702. The HVAC-coupling wall dock 702 comprises mechanical hardware for attaching to the wall and electrical terminals for connecting to the HVAC wiring 298 that will be extending out of the wall in a disconnected state when the old thermostat is removed. The HVAC-coupling wall dock 702 is configured with an electrical connector 704 that mates to a counterpart electrical connector 705 in the VSCU 100.

For the initial installation process, the customer (or their handyman, or an HVAC professional, etc.) first installs the HVAC-coupling wall dock 702, including all of the necessary mechanical connections to the wall and HVAC wiring connections to the HVAC wiring 298. Once the HVAC-coupling wall dock 702 is installed, which represents the "hard work" of the installation process, the next task is relatively easy, which is simply to slide the VSCU unit 100 thereover to mate the electrical connectors 704/705. Preferably, the components are configured such that the HVAC-connecting wall dock 702 is entirely hidden underneath and inside the VSCU unit 100, such that only the visually appealing VSCU unit 100 is visible.

For one embodiment, the HVAC-connecting wall dock 702 is a relatively "bare bones" device having the sole essential function of facilitating electrical connectivity between the HVAC wiring 298 and the VSCU unit 100. For another embodiment, the HVAC-coupling wall dock 702 is equipped to perform and/or facilitate, in either a duplicative sense and/or a primary sense without limitation, one or more of the functionalities attributed to the VSCU unit 100 in the instant disclosure, using a set of electrical, mechanical, and/or electromechanical components 706. One particularly useful functionality is for the components 706 to include power-extraction circuitry for judiciously extracting usable power from the HVAC wiring 298, at least one of which will be carrying a 24-volt AC signals in accordance with common HVAC wiring practice. The power-extraction circuitry converts the 24-volt AC signal into DC power (such as at 5 VDC, 3.3 VDC, etc.) that is usable by the processing circuitry and display components of the main unit 701.

The division and/or duplication of functionality between the VSCU unit 100 and the HVAC-coupling wall dock 702 can be provided in many different ways without departing from the scope of the present teachings. For another embodiment, the components 706 of the HVAC-coupling wall dock 702 can include one or more sensing devices, such as an acoustic sensor, for complementing the sensors provided on the sensor ring 104 of the VSCU unit 100. For another embodiment, the components 706 can include wireless communication circuitry compatible with one or more wireless communication protocols, such as the Wi-Fi and/or ZigBee protocols. For another embodiment, the components 706 can include external AC or DC power connectors. For another embodiment, the components 706 can include wired data communications jacks, such as an RJ45 Ethernet jack, an RJ11 telephone jack, or a USB connector.

The docking capability of the VSCU unit 100 according to the embodiment of FIG. 7 provides many advantages and opportunities in both a technology sense and a business sense. Because the VSCU unit 100 can be easily removed and replaced by even the most non-technically-savvy customer, many upgrading and upselling opportunities are provided. For example, many different versions of the VSCU unit 100 can be separately sold, the different versions having different colors, styles, themes, and so forth. Upgrading to a new VSCU unit 100 having more advanced capabilities becomes a very easy task, and so the customer will be readily able to take advantage of the newest display technology, sensor technology, more memory, and so forth as the technology improves over time.

Provided in accordance with one or more embodiments related to the docking capability shown in FIG. 7 are further devices and features that advantageously promote expandability of the number of sensing and control nodes that can be provided throughout the home. For one embodiment, a tabletop docking station (not shown) is provided that is capable of docking to a second instance of the VSCU unit 100, which is termed herein an auxiliary VSCU unit (not shown). The tabletop docking station and the auxiliary VSCU unit can be separately purchased by the user, either at the same time they purchase their original VSCU unit 100, or at a later time. The tabletop docking station is similar in functionality to the HVAC-coupling wall dock 702, except that it does not require connection to the HVAC wiring 298 and is conveniently powered by a standard wall outlet. For another embodiment, instead of being identical to the original VSCU unit 100, the auxiliary VSCU unit can be a differently labeled and/or differently abled version thereof.

As used herein, the term "primary VSCU unit" refers to one that is electrically connected to actuate an HVAC system in whole or in part, which would necessarily include the first VSCU unit purchased for any home, while the term "auxiliary VSCU unit" refers to one or more additional VSCU units not electrically connected to actuate an HVAC system in whole or in part. An auxiliary VSCU unit, when docked, will automatically detect the primary VSCU unit and will automatically be detected by the primary VSCU unit, such as by Wi-Fi or ZigBee wireless communication. Although the primary VSCU unit will remain the sole provider of electrical actuation signals to the HVAC system, the two VSCU units will otherwise cooperate in unison for improved control heating and cooling control functionality, such improvement being enabled by virtue of the added multi-sensing functionality provided by the auxiliary VSCU unit, as well as by virtue of the additional processing power provided to accommodate more powerful and precise control algorithms. Because the auxiliary VSCU unit can accept user control inputs just like the primary VSCU unit, user convenience is also enhanced. Thus, for example, where the tabletop docking station and the auxiliary VSCU unit are placed on a nightstand next to the user's bed, the user is not required to get up and walk to the location of the primary VSCU unit if they wish to manipulate the temperature set point, view their energy usage, or otherwise interact with the system.

A variety of different VSCU-compatible docking stations are within the scope of the present teachings. For example, in another embodiment there is provided an auxiliary wall dock (not shown) that allows an auxiliary VSCU unit to be mounted on a wall. The auxiliary wall dock is similar in functionality to the tabletop docking station in that it does not provide HVAC wiring connections, but does serve as a physical mounting point and provides electrical power derived from a standard wall outlet.

For one embodiment, all VSCU units sold by the manufacturer are identical in their core functionality, each being able to serve as either a primary VSCU unit or auxiliary VSCU unit as the case requires, although the different VSCU units may have different colors, ornamental designs, memory capacities, and so forth. For this embodiment, the user is advantageously able, if they desire, to interchange the positions of their VSCU units by simple removal of each one from its existing docking station and placement into a different docking station. Among other advantages, there is an environmentally, technically, and commercially appealing ability for the customer to upgrade to the newest, latest VSCU designs and technologies without the need to throw away the existing VSCU unit. For example, a customer with a single VSCU unit (which is necessarily serving as a primary VSCU unit) may be getting tired of its color or its TFT display, and may be attracted to a newly released VSCU unit with a different color and a sleek new OLED display. For this case, in addition to buying the newly released VSCU, the customer can buy a tabletop docking station to put on their nightstand. The customer can then insert their new VSCU unit into the existing HVAC-coupling wall dock, and then take their old VSCU unit and insert it into the tabletop docking station. Advantageously, in addition to avoiding the wastefulness of discarding the old VSCU unit, there is now a new auxiliary VSCU unit at the bedside that not only provides increased comfort and convenience, but that also promotes increased energy efficiency by virtue of the additional multi-sensor information and processing power provided.

For other embodiments, different VSCU units sold by the manufacturer can have different functionalities in terms of their ability to serve as primary versus auxiliary VSCU units. This may be advantageous from a pricing perspective, since the hardware cost of an auxiliary-only VSCU unit may be substantially less than that of a dual-capability primary/auxiliary VSCU unit. In other embodiments there is provided distinct docking station capability for primary versus auxiliary VSCU units, with primary VSCU units using one kind of docking connection system and auxiliary VSCU units using a different kind of docking connection system. In still other embodiments there is provided the docking station capability of FIG. 7 for primary VSCU units, but no docking station capability for auxiliary VSCU units, wherein auxiliary VSCU units are simply provided in monolithic form as dedicated auxiliary tabletop VSCU units, dedicated auxiliary wall-mounted VSCU units, and so forth. One advantage of providing an auxiliary VSCU unit, such as a tabletop VSCU unit, without a docking functionality would be its simplicity and non-intimidating nature for users, since the user would simply be required to place it on a table (their nightstand, for example) and just plug it in, just as easily as they would a clock radio.

In still other embodiments, all VSCU units are provided as non-docking types, but are interchangeable in their abilities as primary and auxiliary VSCU units. In still other embodiments, all VSCU units are provided as non-docking types and are non-interchangeable in their primary versus auxiliary abilities, that is, there is a first set of VSCU units that can only serve as primary VSCU units and a second set of VSCU units that can only serve as auxiliary VSCU units. For embodiments in which primary VSCU units are provided as non-docking types, their physical architecture may still be separable into two components for the purpose of streamlining the installation process, with one component being similar to the HVAC-coupling wall dock 702 of FIG. 7 and the second component being the main unit as shown in FIG. 7, except that the assembly is not intended for docking-style user separability after installation is complete. For convenience of description hereinbelow and so as not to unnecessarily limit the scope of the present teachings, the classification of one or more described VSCU units as being of (i) a non-docking type versus a docking type, and/or (ii) a primary type versus an auxiliary type, may not be specified, in which case VSCU units of any of these classifications may be used with such embodiments, or in which case such classification will readily inferable by the skilled artisan from the context of the description.

Figure 8A:
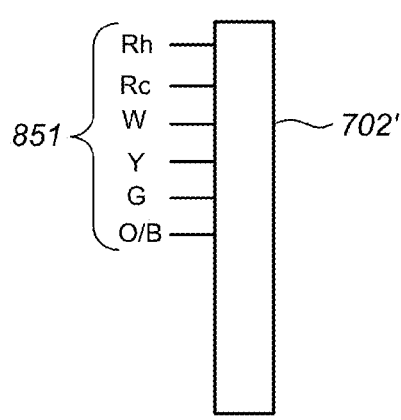
FIGS. 8A-B illustrates conceptual diagrams of HVAC-coupling wall docks, according to some embodiments.

FIG. 8A illustrates a conceptual diagram of an HVAC-coupling wall dock 702' with particular reference to a set of input wiring ports 851 thereof, and which represents a first version of the HVAC-coupling wall dock 702 of FIG. 7 that is manufactured and sold in a "simple" or "DIY (do-it-yourself)" product package in conjunction with the VSCU unit 100. The input wiring ports 851 of the HVAC-coupling wall dock 702' are judiciously limited in number and selection to represent a business and technical compromise between (i) providing enough control signal inputs to meet the needs of a reasonably large number of HVAC systems in a reasonably large number of households, while also (ii) not intimidating or overwhelming the do-it-yourself customer with an overly complex array of connection points. For one embodiment, the judicious selection of input wiring ports 851 consists of the following set: Rh (24 VAC heating call switch power); Rc (24 VAC cooling call switch power); W (heating call); Y (cooling call); G (fan); and O/B (heat pump).

The HVAC-coupling wall dock 702' is configured and designed in conjunction with the VSCU unit 100, including both hardware aspects and programming aspects, to provide a DIY installation process that is simple, non-intimidating, and perhaps even fun for many DIY installers, and that further provides an appreciable degree of foolproofing capability for protecting the HVAC system from damage and for ensuring that the correct signals are going to the correct equipment. For one embodiment, the HVAC-coupling wall dock 702' is equipped with a small mechanical detection switch (not shown) for each distinct input port, such that the insertion of a wire (and, of course, the non-insertion of a wire) is automatically detected and a corresponding indication signal is provided to the VSCU 100 upon initial docking. In this way, the VSCU 100 has knowledge for each individual input port whether a wire has, or has not been, inserted into that port. Preferably, the VSCU unit 100 is also provided with electrical sensors (e.g., voltmeter, ammeter, and ohmmeter) corresponding to each of the input wiring ports 851. The VSCU 100 is thereby enabled, by suitable programming, to perform some fundamental "sanity checks" at initial installation. By way of example, if there is no input wire at either the Rc or Rh terminal, or if there is no AC voltage sensed at either of these terminals, further initialization activity can be immediately halted, and the user notified on the circular display monitor 102, because there is either no power at all or the user has inserted the Rc and/or Rh wires into the wrong terminal. By way of further example, if there is a live voltage on the order of 24 VAC detected at any of the W, Y, and G terminals, then it can be concluded that the user has placed the Rc and/or Rh wire in the wrong place, and appropriate installation halting and user notification can be made.

One particularly advantageous feature from a safety and equipment preservation perspective provided according to one embodiment relates to automated opening versus automated shunting of the Rc and Rh terminals by the VSCU unit 100. In many common home installations, instead of there being separate wires provided for Rc (24 VAC heating call switch power) and Rh (24 VAC cooling call switch power), there is only a single 24 VAC call switch power lead provided. This single 24 VAC lead, which might be labeled R, V, Rh, or Rc depending on the unique history and geographical location of the home, provides the call switch power for both heating and cooling. For such cases, it is electrically necessary for any thermostat to have its Rc and Rh input ports shunted together so that the power from that single lead can be respectively accessed by the heating and cooling call switches. However, in many other common home installations, there are separate 24 VAC wires provided for Rc and Rh running from separate transformers and, when so provided, it is important not to shunt them together to avoid equipment damage. These situations are resolved historically by (i) the professional installer examining the HVAC system and ensuring that a shunting lead (or equivalent DIP switch setting) is properly installed or not installed as appropriate, and/or (ii)

the historical presence on most thermostats of a discrete user-toggled mechanical or electromechanical switch (e.g., HEAT-OFF-COOL) to ensure that heating and cooling are never simultaneously activated. Notably, it is desired to omit any discrete mechanical HEAT-OFF-COOL in most embodiments and to eliminate the need for a professional installer for the instant DIY product version environment. Advantageously, according to an embodiment, the VSCU 100 is advantageously equipped and programmed to (i) automatically test the inserted wiring to classify the user's HVAC system into one of the above two types (i.e., single call power lead versus dual call power leads), (ii) to automatically ensure that the Rc and Rh input ports remain electrically segregated if the if the user's HVAC system is determined to be of the dual call power lead type, and (iii) to automatically shunt the Rc and Rh input ports together if the user's HVAC system is determined to be of the single call power lead type. The automatic testing can comprise, without limitation, electrical sensing such as that provided by voltmeter, ammeters, ohm-meters, and reactance-sensing circuitry, as well as functional detection as described further below.

Also provided at installation time according to an embodiment, which is particularly useful and advantageous in the DIY scenario, is automated functional testing of the HVAC system by the VSCU unit 100 based on the wiring insertions made by the installer as detected by the small mechanical detection switches at each distinct input port. Thus, for example, where an insertion into the W (heating call) input port is mechanically sensed at initial startup, the VSCU unit 100 actuates the furnace (by coupling W to Rh) and then automatically monitors the temperature over a predetermined period, such as ten minutes. If the temperature is found to be rising over that predetermined period, then it is determined that the W (heating call) lead has been properly connected to the W (heating call) input port. However, if the temperature is found to be falling over that predetermined period, then it is determined that Y (cooling call) lead has likely been erroneously connected to the W (heating call) input port. For one embodiment, when such error is detected, the system is shut down and the user is notified and advised of the error on the circular display monitor 102. For another embodiment, when such error is detected, the VSCU unit 100 automatically reassigns the W (heating call) input port as a Y (cooling call) input port to automatically correct the error. Similarly, according to an embodiment, where the Y (cooling call) lead is mechanically sensed at initial startup, the VSCU unit 100 actuates the air conditioner (by coupling Y to Rc) and then automatically monitors the temperature, validating the Y connection if the temperature is sensed to be falling and invalidating the Y connection (and, optionally, automatically correcting the error by reassigning the Y input port as a W input port) if the temperature is sensed to be rising. In view of the present disclosure, the determination and incorporation of other automated functional tests into the above-described method for other HVAC functionality would be achievable by the skilled artisan and are within the scope of the present teachings. By way of example, for one embodiment there can be a statistical study done on the electrical noise patterns associated with the different control wires and a unique or partially unique "noise fingerprint" associated with the different wires, and then the VSCU unit 100 can automatically sense the noise on each of the existing control wires to assist in the automated testing and verification process.

Also provided at installation time according to an embodiment, which is likewise particularly advantageous in the DIY scenario, is automated determination of the homeowner's pre-existing heat pump wiring convention when an insertion onto the O/B (heat pump) input port is mechanically sensed at initial startup. Depending on a combination of several factors such as the history of the home, the geographical region of the home, and the particular manufacturer and installation year of the home's heat pump, there may be a different heat pump signal convention used with respect to the direction of operation (heating or cooling) of the heat pump. According to an embodiment, the VSCU unit 100 automatically and systematically applies, for each of a plurality of preselected candidate heat pump actuation signal conventions, a cooling actuation command and a heating actuation command, each actuation command being followed by a predetermined time period over which the temperature change is sensed. If the cooling command according to the presently selected candidate convention is followed by a sensed period of falling temperature, and the heating command according to the presently selected candidate convention is followed by a sensed period of rising temperature, then the presently selected candidate convention is determined to be the actual heat pump signal convention for that home. If, on the other hand, the cooling command was not followed by a sensed period of cooling and/or the heating command was not followed by a sensed period of heating, then the presently selected candidate convention is discarded and the VSCU unit 100 repeats the process for the next candidate heat pump actuation signal convention. For one example, a first candidate heat pump actuation signal convention is (a) for cooling, leave O/B open and connect Y to Rc, and (b) for heating, connect O/B to Rh, while a second candidate heat pump actuation signal convention is (a) for cooling, connect O/B to Rc, and (b) for heating, leave O/B open and connect W to Rh. In view of the present disclosure, the determination and incorporation of other candidate heat pump actuation signal conventions into the above-described method would be achievable by the skilled artisan and are within the scope of the present teachings.

Figure 8B:
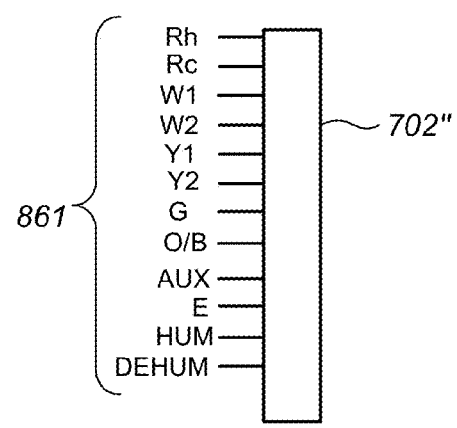

FIG. 8B illustrates a conceptual diagram of an HVAC-coupling wall dock 702" with particular reference to a set of input wiring ports 861 thereof, and which represents a second version of the HVAC-coupling wall dock 702 of FIG. 7 that is manufactured and sold in a "professional" product package in conjunction with the VSCU unit 100. The professional product package is preferably manufactured and marketed with professional installation in mind, such as by direct marketing to HVAC service companies, general contractors involved in the construction of new homes, or to homeowners having more complex HVAC systems with a recommendation for professional installation. The input wiring ports 861 of the HVAC-coupling wall dock 702" are selected to be sufficient to accommodate both simple and complex HVAC systems alike. For one embodiment, the input wiring ports 861 include the following set: Rh (24 VAC heating call switch power); Rc (24 VAC cooling call switch power); W1 (first stage heating call); W2 (second stage heating call); Y1 (first stage cooling call); Y2 (second stage cooling call); G (fan); O/B (heat pump); AUX (auxiliary device call); E (emergency heating call); HUM (humidifier call); and DEHUM (dehumidifier call). For one embodiment, even though professional installation is contemplated, the HVAC-coupling wall dock 702" is nevertheless provided with small mechanical detection switches (not shown) at the respective input wiring ports for wire insertion sensing, and the VSCU unit 100 is provided with one or more of the various automated testing and automated configuration capabilities associated with the DIY package described above, which may be useful for some professional installers and/or more technically savvy do-it-yourselfers confident enough to perform the professional-model installation for their more advanced HVAC systems.

Figure 9:
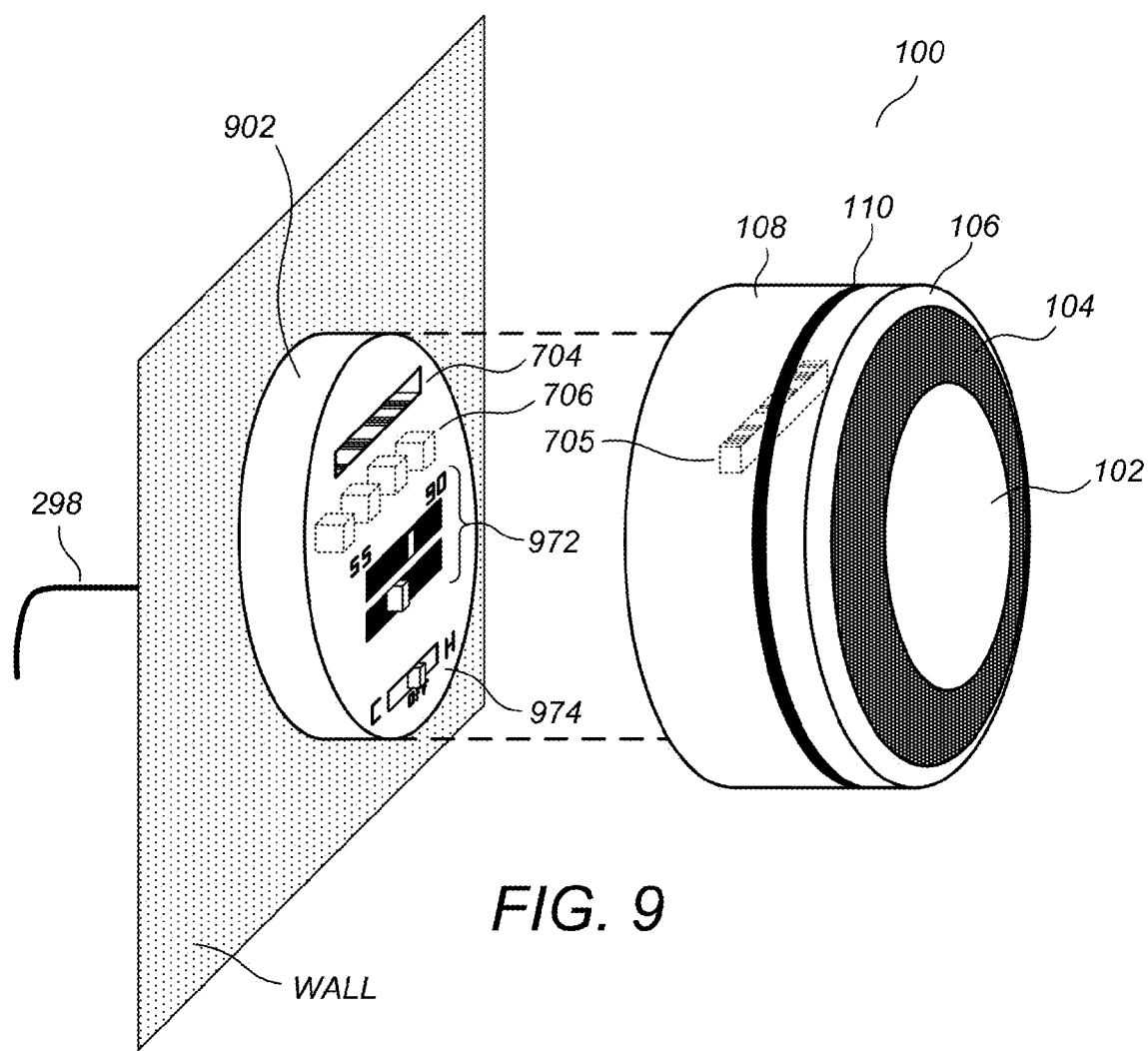
FIG. 9 illustrates an exploded perspective view of the VSCU unit and an HVAC-coupling wall dock according to an embodiment.

FIG. 9 illustrates an exploded perspective view of the VSCU unit 100 and an HVAC-coupling wall dock 902 according to an embodiment. The HVAC-coupling wall dock 902 is similar to the HVAC-coupling wall dock 702 of FIG. 7, supra, except that it has an additional functionality as a very simple, elemental, standalone thermostat when the VSCU unit 100 is removed, the elemental thermostat including a standard temperature readout/setting dial 972 and a simple COOL-OFF-HEAT switch 974. This can prove useful for a variety of situations, such as if the VSCU 100 needs to be removed for service or repair for an extended period of time over which the occupants would still like to remain reasonably comfortable. For one embodiment, the elemental thermostat components 972 and 974 are entirely mechanical in nature, such that no electrical power is needed to trip the control relays. For other embodiments, simple electronic controls such as electrical up/down buttons and/or an LCD readout are provided. For other embodiments, some subset of the advanced functionalities of the VSCU unit 100 can be provided, such as elemental network access to allow remote control, to provide a sort of "brain stem" functionality while the "brain" (the VSCU unit 100) is temporarily away.

Figure 10A:
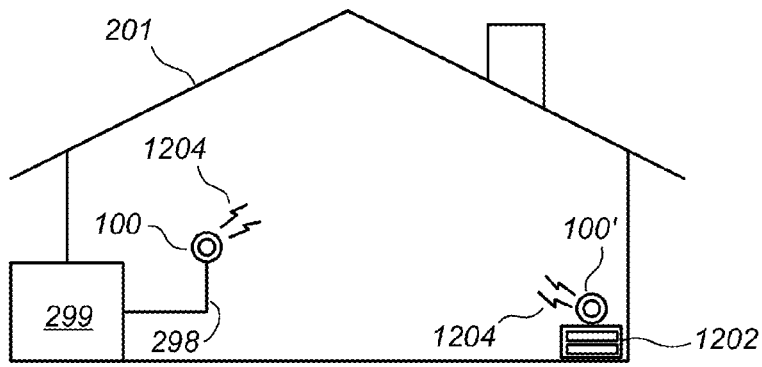
FIGS. 10A-10C illustrate conceptual diagrams representative of advantageous scenarios in which multiple VSCU units are installed in a home or other space according to embodiments in which the home (or other space) does not have a wireless data network.
Figure 10B:
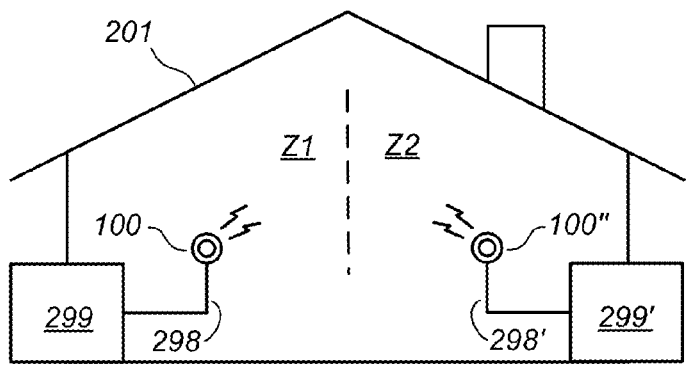
Figure 10C:
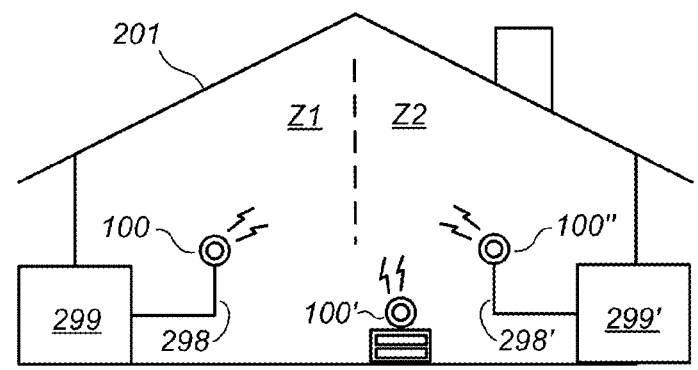

FIGS. 10A-10C illustrate conceptual diagrams representative of advantageous scenarios in which multiple VSCU units are installed in a home 201 (or other space such as retail stores, office buildings, industrial buildings, and more generally any living space or work space having one or more HVAC systems) according to embodiments in which the home (or other space) does not have a wireless data network. For the embodiment of FIG. 10A in which the home 201 has a single HVAC system 298, a primary VSCU unit 100 is installed and connected thereto via the control wires 298, which an auxiliary VSCU unit 100' is placed, by way of example, on a nightstand 1202. The primary VSCU unit 100 and auxiliary VSCU unit 100' are each configured to automatically recognize the presence of the other and to communicate with each other using a wireless communication protocol such as Wi-Fi or ZigBee running in an ad hoc mode.

Many advantageous capabilities are programmed into the VSCU units 100 and 100' to leverage their communication and multi-sensing capabilities such that they jointly, in a cooperative manner, perform the many VSCU unit functionalities described herein (e.g., "learning" about the home HVAC environment, performing occupancy sensing and prediction, "learning" user comfort preferences, etc.) that do not require Internet access. By way of simple example, in one embodiment the primary VSCU unit 100 receives temperature data from the auxiliary VSCU unit 100' and computes an average of the two temperatures, controlling the HVAC system 299 such that the average temperature of the home 201 is maintained at the current temperature set point level. One or more additional auxiliary VSCU units (not shown) may also be positioned at one or more additional locations throughout the home and can become part the ad hoc "home VSCU network." The scope of the present teachings not being limited to any particular maximum number of auxiliary VSCU units. Among other advantages, adding more auxiliary VSCU units is advantageous in that more accurate occupancy detection is promoted, better determination of spatial temperature gradients and thermal characteristics is facilitated, and additional data processing power is provided.

Preferably, the primary/auxiliary VSCU units 100/100' are programmed to establish a master/slave relationship, wherein any conflicts in their automated control determinations are resolved in favor of the master VSCU unit, and/or such that any user inputs at the master unit take precedence over any conflicting user inputs made at the slave VSCU unit. Although the primary VSCU unit 100 will likely be the "master" VSCU unit in a beginning or default scenario, the status of any particular VSCU unit as a "master" or "slave" is not dictated solely by its status as a primary or auxiliary VSCU unit. Moreover, the status of any particular VSCU unit as "master" or "slave" is not permanent, but rather is dynamically established to best meet current HVAC control needs as can be best sensed and/or predicted by the VSCU units. For one preferred embodiment, the establishment of "master" versus "slave" status is optimized to best meet the comfort desires of the human occupants as can be best sensed and/or predicted by the VSCU units. By way of example, if each VSCU unit is sensing the presence of multiple occupants in their respective areas, then the primary VSCU unit is established as the master unit and controls the HVAC system 299 such that the average temperature reading of the two VSCU units is maintained at the current set point temperature according to a currently active template schedule (i.e., a schedule of time intervals and set point temperatures for each time interval). However, if no occupants in the home are sensed except for a person in the bedroom (as sensed by the auxiliary VSCU unit 100' which is positioned on a nightstand in this example), then the auxiliary VSCU unit 100' becomes the "master" VSCU unit, which commands the "slave" VSCU unit 100 to control the HVAC system 299 such that the temperature in the bedroom, as sensed by the "master" unit, stays at a current set point temperature.

Many other automated master/slave establishment scenarios and control determinations based on human behavioral studies, statistical compilations, and the like are within the scope of the present teachings. In one example, the master-slave determination can be made and/or influenced or supported based on an automated determination of which thermostat is in a better place to more reliably govern the temperature, based on historical and/or testing-observed cycling behavior or other criteria. For example, sensors that are immediately over a heat register will not be reliable and will keep cycling the furnace too often. Nodes that are in bathrooms and in direct sunlight are also less reliable. When there are multiple sensors/nodes, there is an algorithm that determines which one is more reliable, and there is master-slave determination based on those determinations. For some related embodiments, VSCU units automatically determined to be near bathrooms and dishwashers can be assigned custom templates designed to at least partially ameliorate the adverse effects of such placement.

The establishment of master-slave status for the primary/auxiliary VSCU units 100/100' can also be based upon human control inputs. By way of example, if each VSCU unit is sensing the presence of multiple occupants in their respective areas, and then a user manually changes the current set point temperature on one of the two units, that VSCU unit can output the question, "Master Override?" on its circular display monitor 102 (analogous to the query capability shown at FIGS. 5A-5B, supra), along with two answer options "Yes" and "Let VSCU Decide," with the latter being circled as the default response. On the other hand, if the two VSCUs collectively sense only the presence of that user in the home and no other occupants, then whichever unit was controlled by the user can be established as the master unit, without the need for asking the user for a resolution. By way of further example, the VSCU units 100/100' can be programmed such that the establishment of master/slave status can be explicitly dictated by the user at system setup time (such as during a setup interview), or at a subsequent configuration time using the menu-driven user interface (see FIGS. 4-5B, supra) of one of the two VSCU units. When combined with lockout functionality and/or user-specific identification as described elsewhere in the instant specification, this can be particularly useful where Mom and Dad wish to control the house temperature at night using the VSCU unit in their bedroom, and not for their teenage daughter to control the house temperature at night using the VSCU unit in her bedroom.

Also provided according to an embodiment is an ability for the multiple VSCU units to judiciously share computing tasks among them in an optimal manner based on power availability and/or circuitry heating criteria. Many of the advanced sensing, prediction, and control algorithms provided with the VSCU unit are relatively complex and computationally intensive, and can result in high power usage and/or device heating if carried out unthrottled. For one embodiment, the intensive computations are automatically distributed such that a majority (or plurality) of them are carried out on a subset of the VSCU units known to have the best power source(s) available at that time, and/or to have known to have the highest amount of stored battery power available. Thus, for example, because it is generally preferable for each primary VSCU unit not to require household AC power for simplicity of installation as well as for equipment safety concerns, the primary VSCU unit 100 of FIG. 10A will often be powered by energy harvesting from one or more of the 24 VAC call relay power signals, and therefore may only have a limited amount of extra power available for carrying out intensive computations. In contrast, a typical auxiliary VSCU unit may be a nightstand unit that can be plugged in as easily as a clock radio. In such cases, much of the computational load can be assigned to the auxiliary VSCU unit so that power is preserved in the primary VSCU unit. In another embodiment, the speed of the intensive data computations carried out by the auxiliary VSCU unit (or, more generally, any VSCU unit to which the heavier computing load is assigned) can be automatically throttled using known techniques to avoid excessive device heating, such that temperature sensing errors in that unit are avoided. In yet another embodiment, the temperature sensing functionality of the VSCU unit(s) to which the heavier computing load is assigned can be temporarily suspended for an interval that includes the duration of the computing time, such that no erroneous control decisions are made if substantial circuitry heating does occur.

Referring now to FIG. 10B, it is often the case that a home or business will have two or more HVAC systems, each of them being responsible for a different zone in the house and being controlled by its own thermostat. Thus, shown in FIG. 10B is a first HVAC system 299 associated with a first zone Z1, and a second HVAC system 299' associated with a second zone Z2. According to an embodiment, first and second primary VSCU units 100 and 100" are provided for controlling the respective HVAC units 299 and 299'. The first and second primary VSCU units 100 and 100" are configured to leverage their communication and multi-sensing capabilities such that they jointly, in a cooperative manner, perform many cooperative communication-based VSCU unit functionalities similar or analogous to those described above with respect to FIG. 10A, and still further cooperative VSCU unit functionalities for multi-zone control as described herein. As illustrated in FIG. 10C, the cooperative functionality of the first and second primary VSCU units 100 and 100" can be further enhanced by the addition of one or more auxiliary VSCU units 100' according to further embodiments.

It is to be appreciated that there are other multiple-thermostat scenarios that exist in some homes other than ones for which each thermostat controls a distinct HVAC system, and that multiple VSCU unit installations capable of controlling such systems are within the scope of the present teachings. In some existing home installations there may only be a single furnace or a single air conditioning unit, but the home may still be separated into plural "zones" by virtue of actuated flaps in the ductwork, each "zone" being controlled by its own thermostat. In such settings, two primary VSCU units can be installed and configured to cooperate, optionally in conjunction with one or more auxiliary VSCU units, to provide optimal HVAC system control according to the described embodiments.

Figure 10D:
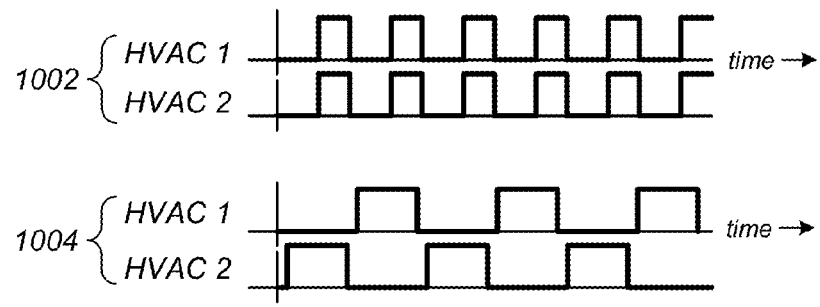
FIG. 10D illustrates cycle time plots for two HVAC systems in a two-zone home heating (or cooling) configuration, according to an embodiment.

FIG. 10D illustrates cycle time plots for two HVAC systems in a two-zone home heating (or cooling) configuration, for purposes of illustrating an advantageous, energy-saving dual-zone control method implemented by dual primary VSCU units such as the VSCU units 100 and 100" of FIGS. 10B-10C, according to an embodiment. According to an embodiment, the VSCU units 100 and 100" are configured to mutually cooperate such that their actuation cycle times are staggered with respect to each other to be generally about 180 degrees ($\pi$ radians) out of phase with each other. Shown in FIG. 10D are two cycle time plots 1002 and 1004 that are identical with respect to the total percentage of time (e.g., the total number of minutes in an hour) that the heating (or cooling) units are "ON". For two adjacent zones such as Z1 and Z2 that are in thermal communication with each other, it has been found that running their heating (or cooling) units without mutually controlled operation can allow the system to stray into a sort of high frequency resonance response (FIG. 10D, plot 1002) characterized by rapid temperature fluctuations between the swing points and a relatively high number of cycles per hour, which can reduce energy efficiency due to inertial start-up and shut-down losses. In contrast, when purposely controlled to be mutually out of phase with each other according an embodiment, it has been found that a more stable and lower frequency response behavior occurs (FIG. 10D, plot 1004) characterized by fewer cycles per hour and correspondingly increased energy efficiency.

For one embodiment that is particularly advantageous in the context of non-network-connected VSCU units, the VSCU unit is configured and programmed to use optically sensed information to determine an approximate time of day. For a large majority of installations, regardless of the particular location of installation in the home (the only exceptions being perhaps film photography development labs or other purposely darkened rooms), there will generally be a cyclical 24-hour pattern in terms of the amount of ambient light that is around the VSCU unit. This cyclical 24-hour pattern is automatically sensed, with spurious optical activity such as light fixture actuations being filtered out over many days or weeks if necessary, and optionally using ZIP code information, to establish a rough estimate of the actual time of day. This rough internal clock can be used advantageously for non-network-connected installations to verify and correct a gross clock setting error by the user (such as, but not limited to, reversing AM and PM), or as a basis for asking the user to double-check (using the circular display monitor 102), or to establish a time-of-day clock if the user did not enter a time.

Figure 11:
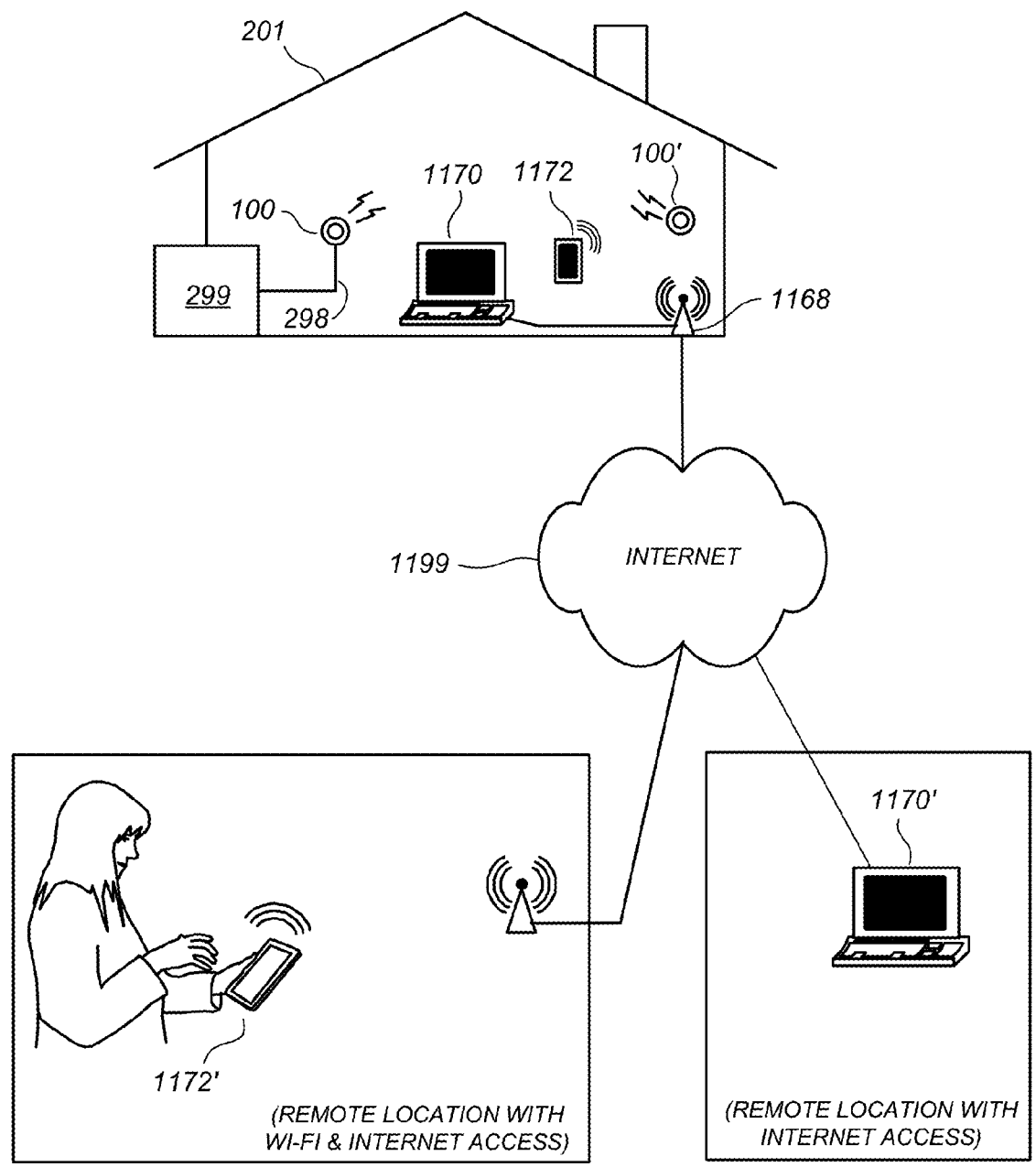
FIG. 11 illustrates a conceptual diagram representative of an advantageous scenario in which one or more VSCU units are installed in a home that is equipped with WiFi wireless connectivity and access to the Internet.

FIG. 11 illustrates a conceptual diagram representative of an advantageous scenario in which one or more VSCU units are installed in a home that is equipped with WiFi wireless connectivity and access to the Internet (or, in more general embodiments, any kind of data connectivity to each VSCU unit and access to a wide area network). Advantageously, in addition to providing the standalone, non-Internet connected functionalities described for FIGS. 10A-10C and elsewhere herein, the connection of one or more VSCU units to the Internet triggers their ability to provide a rich variety of additional capabilities. Shown in FIG. 11 is a primary VSCU unit 100 and auxiliary VSCU unit 100' having WiFi access to the Internet 1199 via a wireless router/Internet gateway 1168. Provided according to embodiments is the ability for the user to communicate with the VSCU units 100 and/or 100' via their home computer 1170, their smart phone 1172 or other portable data communication appliance 1172', or any other Internet-connected computer 1170'.

Figure 12:
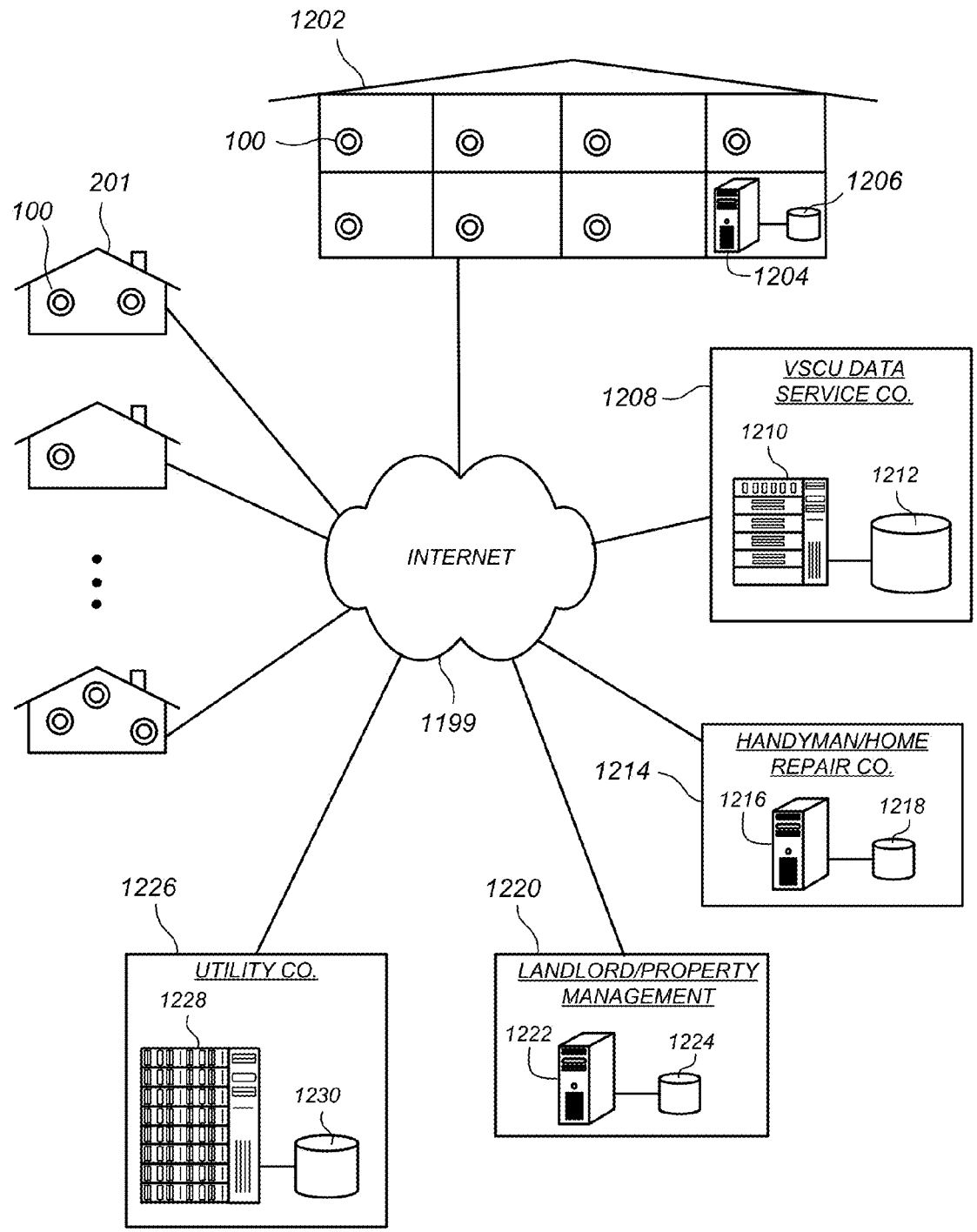
FIG. 12 illustrates a conceptual diagram of a larger overall energy management network as enabled by the VSCU units and VSCU Efficiency Platform described herein.

FIG. 12 illustrates a conceptual diagram of a larger overall energy management network as enabled by the VSCU units and VSCU Efficiency Platform described herein and for which one or more of the systems, methods, computer program products, and related business methods of one or more described embodiments is advantageous applied. The environment of FIG. 12, which could be applicable on any scale (neighborhood, regional, state-wide, country-wide, and even world-wide), includes the following: a plurality of homes 201 each having one or more network-enabled VSCU units 100; an exemplary hotel 1202 (or multi-unit apartment building, etc.) in which each room or unit has a VSCU unit 100, the hotel 1202 further having a computer system 1204 and database 1206 configured for managing the multiple VSCU units and running software programs, or accessing cloud-based services, provisioned and/or supported by the VSCU data service company 1208; a VSCU data service company 1208 having computing equipment 1210 and database equipment 1212 configured for facilitating provisioning and management of VSCU units, VSCU support equipment, and VSCU-related software and subscription services; a handyman or home repair company 1214 having a computer 1216 and database 1218 configured, for example, to remotely monitor and test VSCU operation and automatically trigger dispatch tickets for detected problems, the computer 1216 and database 1218 running software programs or accessing cloud-based services provisioned and/or supported by the VSCU data service company 1208; a landlord or property management company 1220 having a computer 1222 and database 1224 configured, for example, to remotely monitor and/or manage the VSCU operation of their tenants and/or clients, the computer 1222 and database 1224 running software programs, or accessing cloud-based services, provisioned and/or supported by the VSCU data service company 1208; and a utility company 1226 providing HVAC energy to their customers and having computing equipment 1228 and database equipment 1230 for monitoring VSCU unit operation, providing VSCU-usable energy usage data and statistics, and managing and/or controlling VSCU unit set points at peak load times or other times, the computing equipment 1228 and database equipment 1230 running software programs or accessing cloud-based services provisioned and/or supported by the VSCU data service company 1208.

According to one embodiment, each VSCU unit provides external data access at two different functionality levels, one for user-level access with all of the energy gaming and home management functionality described herein, and another for an installer/vendor ("professional") that lets the professional "check in" on your system, look at all the different remote sensing gauges, and offer to provide and/or automatically provide the user with a service visit.

Figure 13A:
Figure 13B:
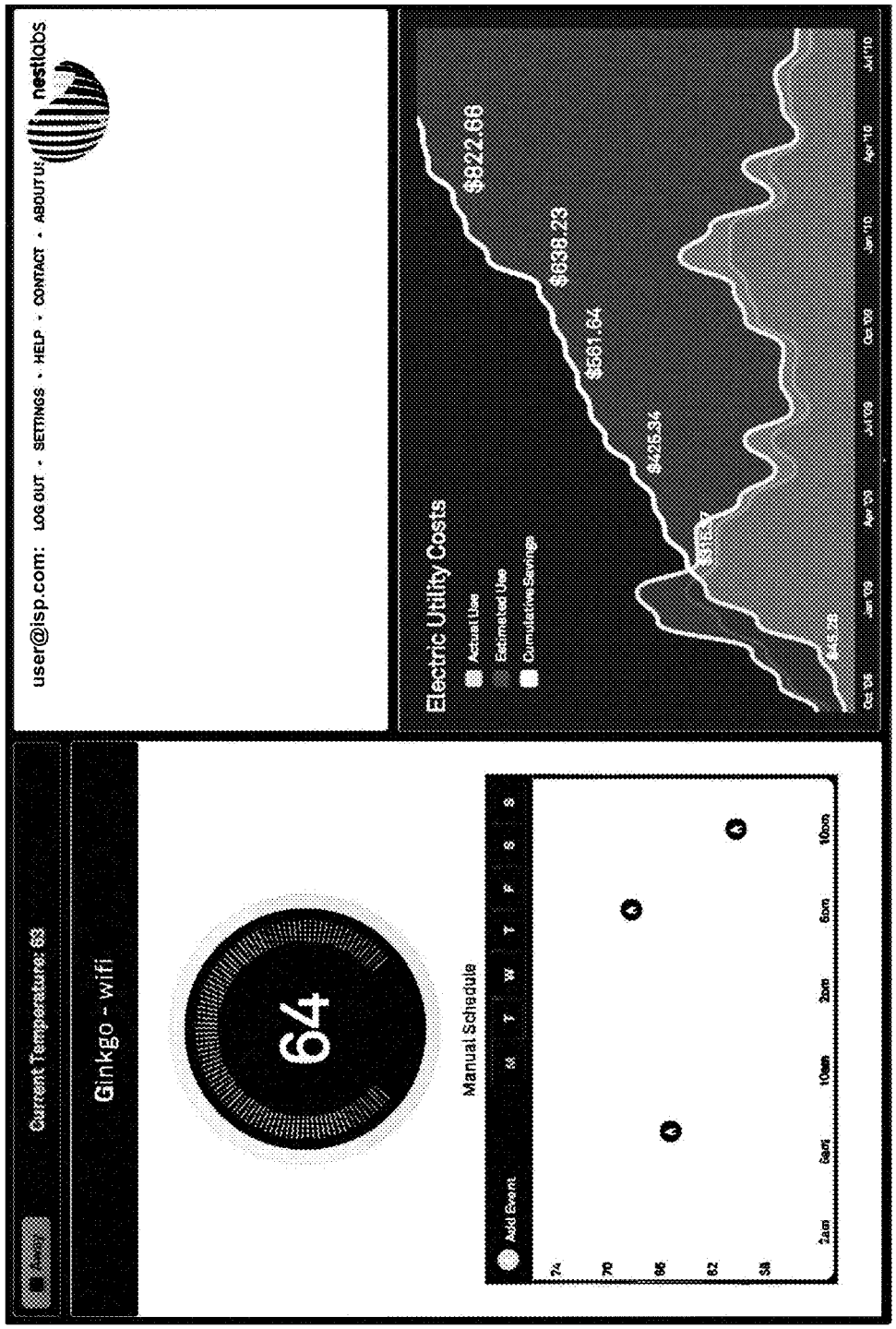
Figure 14A:
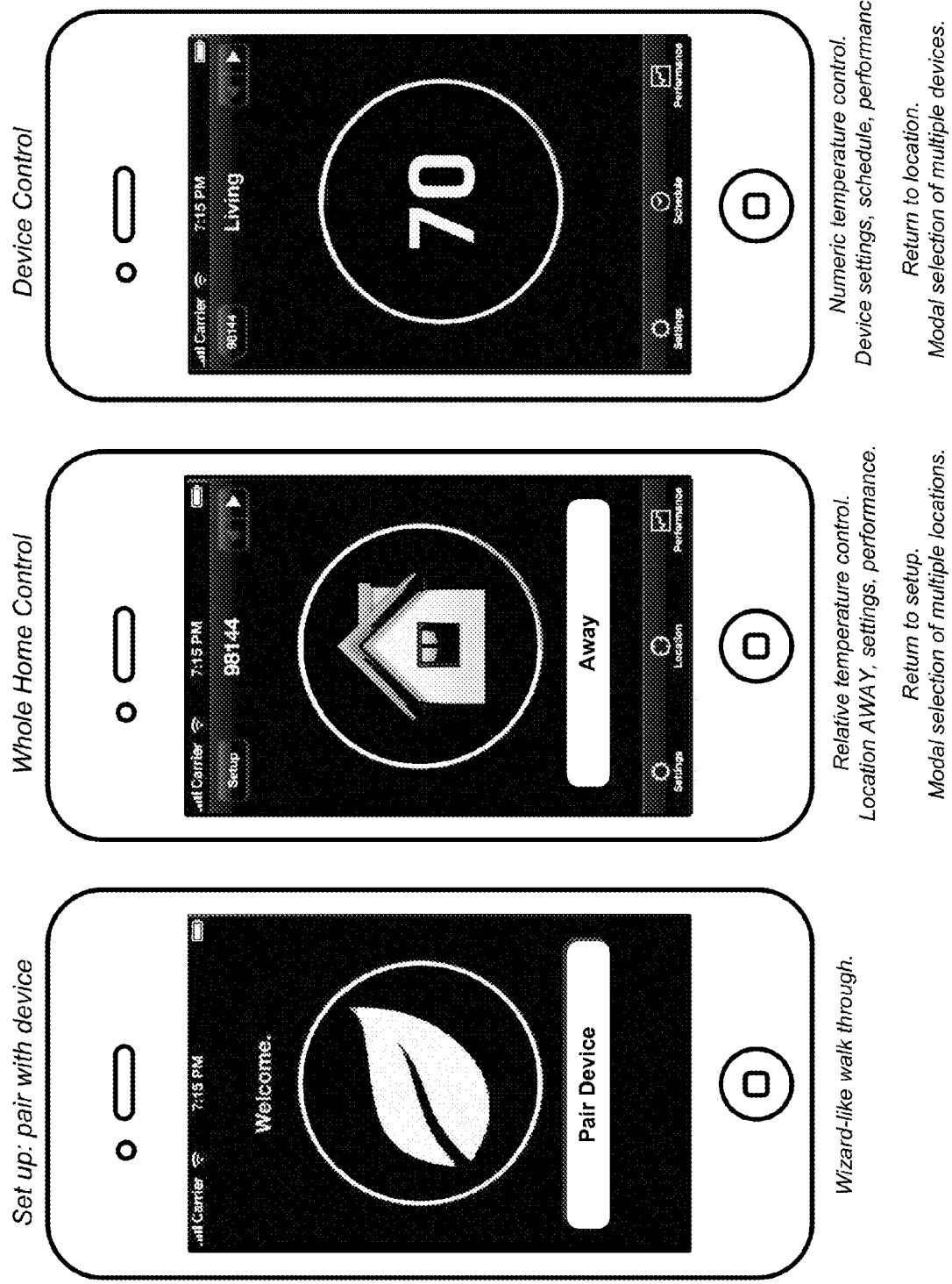

FIGS. 13A-13B and FIGS. 14A-14B illustrate examples of remote graphical user interface displays presented to the user on their data appliance for managing their one or more VSCU units and/or otherwise interacting with their VSCU Efficiency Platform equipment or data according to an embodiment. For one embodiment, one or more of the displays of FIGS. 13A-14B is provided directly by a designated one of the user's own VSCU units, the user logging directly into the device in the same way they can log on to their own home router. For another embodiment, one or more of the displays of FIGS. 13A-14B is displayed when the user logs on to a web site of a central, regional, or local service provider, such as the VSCU data service provider 1208 of FIG. 12, supra, which in turn communicates with the user's VSCU unit(s) over the Internet. Although the scope of the present teachings is not so limited, the examples of FIGS. 13A-13B are particularly suitable for display in a conventional browser window, the example of FIG. 14A is particularly suitable for display on a smaller portable data device such as an iPhone, and the example of FIG. 14B is particularly suitable for display on a larger portable data device such as an iPad. According to one embodiment, the remote user interface includes a relatively large image that is representative of what the user would actually see if they were standing in front of their VSCU unit at that time. Preferably, the user interface allows the user to enter "left ring rotate", "right ring rotate", and "inward press" commands thereon just as if they were standing in front of their VSCU unit, such as by suitable swipes, mouse click-and-drags, softbuttons, etc. The remote user interface can also graphically display, and allow the user to graphically manipulate, the set point temperatures and/or time interval limits of their template schedule(s) based on suitable graphs, plots, charts, or other types of data display and manipulation. The remote user interface can also graphically display a variety of other information related to the user's energy usage including, but not limited to, their utility bills and historical energy usage costs and trends, weather information, game-style information showing their performance against other similarly situated households or other suitable populations, and helpful hints, advice, links, and news related to energy conservation.

Provided according to some embodiments is a direct e-mail or text message command functionality for the remote user, such that they can send a brief control command to an e-mail address of the VSCU unit without being required to perform the full remote login and enter the command using the more complete user interfaces of FIGS. 13A-14B. The remotely sent commands can be very brief and consistent with a small list of common commands such as "Heat 78" or "Heat 78 @ 8:00 PM". For another embodiment, a natural language interpretation capability is provided, such that a natural language e-mail can be sent to the VSCU's e-mail address, such as "I am away now, go into away mode" or "I will return at 8 PM tonight instead of 6 PM as usual so keep it at 65 until then and preheat to 72 for when I get home."

As could be realized by a person skilled in the art upon reading the present disclosure and based on system components and methods disclosed hereinabove and illustrated in the accompany drawings, provided in conjunction with the VSCU 100 and/or the VSCU Efficiency Platform are one or more devices, features or functionalities as described further hereinbelow.

According to some embodiments, various systems and methods for detecting occupancy of an enclosure, such as a dwelling, are provided by one or more of the installed VSCU units in the manner described in Ser. No. 12/881,430, supra. Examples include: detecting motion, monitoring communication signals such as network traffic and/or mobile phone traffic, monitoring sound pressure information such as in the audible and/or ultrasonic ranges, monitoring utility information such powerline information or information from Smart Meters, monitoring motion in close proximity to the sensor, monitoring infrared signals that tend to indicate operation of infrared controllable devices, sudden changes in ambient light, and monitoring indoor air pressure (to distinguish from pressure mats used in security applications) information which tends to indicate occupancy.

According to one embodiment that represents a combination of business method and technical method, acoustic monitoring is used to facilitate detect occupancy sensing, but the acoustic-to-electrical transducer equipment is purposely hampered in its ability to convert the acoustic energy of human speech into electrical form in a way that the actual human speech could be extracted therefrom. Stated differently, while the acoustic monitoring would be able to detect the presence of audible human activity, including speech, there would be no possibility of any actual words be "heard" by the VSCU unit even if those acousto-electric patterns were somehow recorded. In this way, privacy concerns of occupants and civil liberty groups are not problematic to the rollout and acceptance of the VSCU units and the VSCU Efficiency Platform. In one business method, this feature is actually used as a selling point for the product, being marketed with a moniker such as "privacy-preserving pressure wave sensing technology" or the like.

Particular examples of the above-described occupancy detection methods are now presented by way of example and not by way of limitation. One occupancy detection method is to incorporate a Wi-Fi sniffer capability into the VSCU units, i.e., when a lot of data traffic is seen on the user's home network, a conclusion can be made or supported that the house is occupied. Conversely, if the VSCU units are receiving remote control commands or other communications from a known user using a data communication device whose IP address is different than that of the home network, or a cell phone whose GPS location is different than that of the house, then a determination can be made or supported that that known user is not in the house. Other local electromagnetic signals associated with local user activity, such as cordless phone signals in the 900 MHz and 5.8 GHz, can also be used to make or support a determination that the house is occupied. Another occupancy detection method incorporated into the VSCU units is to sense infrared television remote control radiation as emitted from television remote control units. Another occupancy detection method uses the temperature and humidity readings of the VSCU units themselves. For example, a temperature/humidity change accompanies a pressure change, it is more likely that somebody opened an outside door and is therefore entering or leaving the building. Another occupancy detection method includes the consideration of user controls onto the VSCU units themselves. In a simplest example, if someone just adjusted the thermostat, there is certainly someone present in the house. In a more complex example, if a user just turned down the thermostat temperature in wintertime, and this is followed by a sensed sudden pressure change, then a determination can be made or supported that the occupants are leaving the building for some period of time. Also, if there are controls being made over the internet, by a cell phone or laptop or whatever, and the IP address corresponds to that of the home network, that you can conclude that the user is entering that information from inside the home, and therefore that the house is occupied.

For some embodiments, current energy-saving decisions based on current outside temperatures and predicted outside temperatures are provided. For example, if it is a really hot day but it is predicted that the outside temperature will be going down precipitously quite soon, the set point temperature may be raised at that time, or the amount of permissible swing raised or other action that causes a reduction in the number of cycles per hour. As another example, for a place like Arizona, if it is 40 degrees outside at 6 AM but it is expected that the outside temperature will be 100 degrees at 10 AM, the heat is not turned on at 6 AM even if the inside temperature is below the heating set point.

For some embodiments, anticipatory heating or cooling based on expected energy cost changes is provided. If a determination is made that the instantaneous cost of electricity will go up in a few hours based on current weather patterns and/or other aggregated data, the immediate cooling set point is lowered, and the set points for the subsequent hours are raised (and/or the acceptable swing is increased) so that more energy is used now and less energy is used later. Another concrete example is "spare the air" days which can be anticipated based on stored information and the recent and forecasted outside temperatures.

For some embodiments, centralized web-based communication with internet-connected VSCU units is provided to avoid blackouts during a heat wave. For "opt-in" VSCU-enabled customers who have so elected in exchange for financial incentives, the utility company (or VSCU data service provider on their behalf, optionally for a negotiated fee) can automatically issue a command that those VSCU units raise their set point temperatures by 5 degrees and it will automatically happen.

For some embodiments, there is provided user control over energy saving aggressiveness. Regarding the internal decisions made by the VSCU units, (e.g., weather-specific set points, anticipatory heating/cooling, compliance with external overrides, etc.), the user can be allowed to set this aggressiveness level during their setup interview, and also can be allowed change it later on. The setting can be "very aggressive savings," "moderate savings", "none", and so forth. One example of automated weather-specific set point is that, for relatively cool days in which the outside temperature might be 84, the cooling set point is automatically set to 78, whereas if the outside temperature is greater than 95, the cooling set point is automatically set to 82. For some embodiments, the need for an increased (or decreased) level of aggressiveness can be automatically detected by the VSCU units and recommended to the user (e.g., on the circular user display 102 or on the remote control interface). In further embodiments, the level of aggressiveness can be automatically increased (or decreased) by the VSCU units, which then simply notify the user (e.g., on the circular user display 102 or on the remote control interface) that the aggressiveness change has been implemented.

According to some embodiments, the VSCU unit(s) installed in any particular home (or more generally "enclosure") are automatically able to characterize its HVAC-related characteristics such as thermal mass, heating capacity, cooling capacity, and thermal conductivity metrics between the inside and the outside, for example using one or more methods described in Ser. No. 12/881,463, supra. For one embodiment, this characterization is made by operating the HVAC in various predetermined heating and cooling modes for predetermined time intervals at initial system installation testing, or at some other point in time, and then processing (i) the resultant temperature (and optionally humidity) profiles as sensed at the one or more VSCU units in conjunction with (ii) extrinsic information, such as building size, square footage, and so forth as provided by (a) the user during the congenial setup interview (or a separate interview) and/or (b) automatically scraped from public data sources, such as zillow.com, based on the home address as provided by the user. The installed VSCU units, optionally in conjunction with information provided by a VSCU data service provider, are configured to model the thermal and thermodynamic behavior of the enclosure for use in optimizing energy usage while also keeping the occupants comfortable. According to some embodiments, weather forecast data predicting future weather conditions for a region including the location of the enclosure are received. A model for the enclosure that describes the behavior of the enclosure for use by the control system is updated based on the weather forecast data. The HVAC system for the enclosure is then controlled using the updated model for the enclosure.

According to some embodiments, the weather forecast data includes predictions more than 24 hours in the future, and can include predictions such as temperature, humidity and/or dew point, solar output, precipitation, wind and natural disasters. According to some embodiments the model for the enclosure is updated based also on historical weather data such as temperature, humidity, wind, solar output and precipitation. According to some embodiments, the model for the enclosure is updated based in part on the occupancy data, such as predicted and/or detected occupancy data. The model for the enclosure updating can also be based calendar data. According to some embodiments, the model for the enclosure is updated based also on the data from the one or more weather condition sensors that sense current parameters such as temperature, humidity, wind, precipitation, and/or solar output. According to some embodiments, the locations of the weather condition sensors can be automatically detected. According to some embodiments, the model for the enclosure is updated based also on an enclosure model stored in a database, and/or on enclosure information from a user.

According to some embodiments, the enclosure modeling includes actively inducing a change in the internal environment of the enclosure, measuring a response of the internal environment of the enclosure from the induced change, and updating a model for the enclosure that describes behavior of the enclosure for use by the control system based at least in part on the measurement of the response from the induced change. According to some embodiments the change is actively induced primarily for purposes of updating the model for the enclosure, rather than for conditioning the internal environment of the enclosure. The change can be actively induced in response to input by a user, or it can be induced automatically by the VSCU units for example due to the type of enclosure or a change in season. The change is preferably induced at a time when the enclosure is likely to be unoccupied.

As used herein the term "model" refers generally to a description or representation of a system. The description or representation can use mathematical language, such as in the case of mathematical models. Examples of types of models and/or characteristics of models, without limitation, include: lookup tables, linear, non-linear, deterministic, probabilistic, static, dynamic, and models having lumped parameters and/or distributed parameters. As used herein the terms "profile," "structure profile," "structure model," "enclosure profile," "enclosure model," "building profile," "building model" and the like refer to any numerical or mathematical description or models of at least some of thermodynamic behavioral characteristics of a building, enclosure and/or structure, for example for use in HVAC applications. As used herein the term "sensor" refers generally to a device or system that measures and/or registers a substance, physical phenomenon and/or physical quantity. The sensor may convert a measurement into a signal, which can be interpreted by an observer, instrument and/or system. A sensor can be implemented as a special purpose device and/or can be implemented as software running on a general-purpose computer system. As used herein the term "structure" includes enclosures and both non-buildings and buildings. As used herein the term "enclosure" means any structure having one or more enclosed areas, and also includes any building. Examples of structures and enclosures include, but are not limited to: residential buildings, commercial buildings and complexes, industrial buildings, sites and installations, and civil constructions. As used herein the term "thermodynamic" includes all state variables that can be used to characterize a physical system. Examples of thermodynamic variables include, but are not limited to: pressure, temperature, airflow, humidity, and particulate matter.

According to some embodiments, the VSCU units are configured and programmed to automatically determine, based on sensed performance data, when one or more air filters of the HVAC system (see, for example, filter 246 of FIG. 2B, supra) needs to be changed. For one embodiment, this is performed using only the multi-sensor capability provided on the VSCU units themselves, such as by recognizing a gradual pattern over time that it is taking the house longer to heat up or cool down than normal. For other embodiments, additional sensors are provided, such as air flow sensors installed in one or more ventilation ducts, the sensors being equipped which communicate wirelessly with the VSCU units such as by using the low-power ZigBee protocol (or other wireless protocol), such that a gradual pattern over time of slowing airflow can be sensed that is indicative of a clogged air filter. For still other embodiments, custom filters that are specially equipped with air flow sensors or other sensors whose readings can be used to detect clog-related behavior are provided, and are equipped to communicate wirelessly with the VSCU units such as by using the low-power ZigBee protocol. For one embodiment, the additional sensors are power using energy harvesting technology, such as by harvesting energy from oscillations or vibrations caused by airflow thereby. In one embodiment, an e-mail, text message, or machine audio voice call is sent to the customer to alert them of the need for a new filter. In one embodiment, a business method is provided in which the need for a new filter is automatically communicated to an external service provider, such as the handyman/home repair company 1214 of FIG. 12, supra, which triggers an automated maintenance ticket event, or such as the VSCU data service provider 1208 of FIG. 12 or a commercial warehouse, which triggers an automated shipping of a new filter to the customer's doorstep.

For other embodiments, similar automated detection, customer alerting, and maintenance event triggering as described in the preceding paragraph is provided for any type of HVAC system anomaly such as, but not limited to, the general failure of the house to heat or cool to the set point temperature or the clogging of a particular duct in the house (e.g., its airflow readings are grossly different than that of other sensors in other ducts). For one embodiment, acoustic signature sensing can be used to detect system anomalies, which takes advantage of the fact that a system's heating and cooling start up and shut down activity will often be characterized by unique yet repeatable noise signatures (e.g., fan noises, particular creaks and moans for older installations, etc), and that an onset of a variation in these noise signatures can be indicative of a system anomaly. In still other embodiments, baseline electrical noise patterns can be associated with each different HVAC control wire and stored, and then the VSCU unit 100 can automatically detect a potential system anomaly by sensing a significant variation in the noise pattern of one or more of the HVAC control wires.

For still other embodiments, other types of auxiliary sensors related to HVAC functionality, including both self-powering energy-harvesting sensors and those that get their power from other sources such as AC or batteries, are provided that are capable of ZigBee communication and are compatible with the VSCU Efficiency Platform, and used to sense system anomalies and/or maintenance-related information that the VSCU units can then act upon. In one example, a replacement cap for an outside propane or heating oil tank is provided that is capable of wirelessly sending fuel levels to the VSCU units, the cap optionally being powered by energy harvesting from the wind. In another example, a replacement cap for a coolant loop check valve is provided that is capable of wirelessly sending coolant loop pressure readings or a low-coolant alarms to the VSCU units, the cap optionally being powered by energy harvesting from compressor vibrations or other air conditioning system vibrations.

According to some embodiments, the initial setup interview includes the following interactive questioning flow. The VSCU unit display format will look similar to FIGS. 5A-5B, with a first prompt being "Set-up VSCU for a: {Home} {Business}" where the notional "{X}" is used herein to denote that "X" is one of the user choices. If the user chooses "Home" then a first set of questions is asked, whereas if the user chooses "Business" then a second set of questions is asked. The first set of questions proceeds as follows: "Are you home at noon? {Usually} {Not Usually}" followed by "Are you home at 4 PM? {Usually} {Not Usually}" followed by "Do you have electric heat?" {Electric} {Not Electric} {I Don't Know}" followed by a request for location information such as the ZIP code and street address of the home. The second set of questions applicable to a business proceeds as follows: "Is this business open evenings? {Usually} {Not Usually}" followed by "Open Saturdays? {Usually} {Not Usually}" followed by "Open Sundays? {Usually} {Not Usually}" followed by "Do you have electric heat?" {Electric} {Not Electric} {I Don't Know}" followed by a request for location information such as the ZIP code and the street address of the business. It is to be appreciated that the above questions and selective answers are presented by way of example only, and not by way of limitation, and that many other questions and selective answers can be provided in addition to, or as an alternative to, these examples without departing from the scope of the present teachings.

According to some embodiments, the ZIP code of the household or business is asked at a point near the beginning of the setup interview, and then different setup interview questions can be asked that are pre-customized for different geographical regions based on the ZIP code. This is useful because the best set of interview questions for Alaskan homes or businesses, for example, will likely be different than the best set of interview questions for Floridian homes, for example.

According to some embodiments, the user's responses to the questions at the initial setup interview are used to automatically "snap" that household onto one of a plurality of pre-existing template schedules, i.e. a schedule of time intervals and set point temperatures for each time interval, stored in the VSCU unit and corresponding to some of the most common household or business paradigms. Examples of different household paradigms, each of which can have its own pre-existing template schedule, can include: working couple without kids; working couple with infants or young children; working family; working spouse with stay-at-home spouse; young people with active nightlife who work freelance from home; retired couple; and solo retiree. The template schedules to which the household is "snapped" at system initialization based on the setup interview (or at some other time upon user request) serve as convenient starting points for the operational control of the HVAC system for a large number of installations. The users can then modify their template schedules (e.g., using the user on the VSCU unit itself, the web interface, or smart phone interface, etc.) to suit their individual desires. The VSCU units may also modify these template schedules automatically based on learned occupancy patterns and manual user temperature control setting patterns. By way of nonlimiting example, a typical template schedule for a working family would be, for heating in wintertime "Mo Tu We Th Fr: [7:00 68] [9:00 62] [16:00 68] [22:00 62] Sa Su [7:00 68] [22:00 62]" (meaning that, for all five weekdays the set point temperatures will be 68 degrees from 7 AM-9 AM, then 62 degrees from 9 AM-4 PM, then 68 degrees from 4 PM-10 PM, then 62 degrees from 10 PM-7 AM, and that for both weekend days the set point temperatures will be 68 degrees from 7 AM-10 PM, then 62 degrees from 10 PM-7 AM), and for cooling in summertime, "Mo Tu We Th Fr: [7:00 75] [9:00 82] [16:00 78] [22:00 75] Sa Su [7:00 75] [9:00 78] [22:00 75]." In other embodiments, permissible swing temperature amounts, humidity ranges, and so forth can also be included in the template schedules.

For one embodiment, template schedules can be shared, similar to the way iTunes music playlists can be shared, optionally in a social networking context. For example, a user can post their template schedule on their Facebook or MySpace page for other people to download. Custom or standardized template schedules can be provided based on house size or ZIP code. Templates schedules will preferably be calendar-based (e.g., scheduled differently for Christmastime when more people are home). This is superior to prior art scheduling in which all customers everywhere are given the same schedule or the same set of strictures within which to program their schedule.

For one embodiment, customized installation instructions can be provided to the user based on their previously installed thermostat model. The user can go to the VSCU manufacturer's web site and enter their current thermostat make and model, and then a custom set of instructions based on the known wiring pattern of that model are provided for viewing, download, and printing. Optionally, customized videos on the user's computer or smart phone are provided. For one more advanced preferred embodiment, the user can take a photo of their current thermostat and submit it to the VSCU manufacturer's web site where its make and model will be automatically determined using machine vision techniques, so that the user does not need to figure out their current make and model.

For one embodiment, the VSCU units are configured and programmed to automatically detect and correct for exposure of one or more VSCU units to direct sunlight. Although users are advised, as with any thermostat, to avoid placing the VSCU units in areas of direct sunlight, it has been empirically found that many will place a VSCU unit where it will get direct sunlight for at least part of the day during at least a part of the year. Direct sunlight exposure can substantially confound HVAC system effectiveness because the temperature will be sensed as being incorrectly high, for example, the VSCU unit will measure 80 degrees when it is really only 68 degrees in the room. According to an embodiment, the one or more VSCU units are programmed to detect a direct sunlight exposure situation, such as by temperature tracking over periods of several days to several weeks and then filtering for periodic behaviors characteristic of direct sunlight exposure, and/or filtering for characteristic periodic discrepancies between multiple VSCU units. Correction is then implemented using one more correction methods.

By way of example and not by way of limitation, one simple method for correction for heating and cooling is to apply a direct numerical bias to the sunlight-bathed sensor reading during the direct sunlight interval based on knowledge from ambient light sensor reading, current time, current exact or approximate date, previous heat/cool cycle duration, temperature changes, and humidity changes. The VSCU unit learns from the first couple of occurrences the time and duration at which the sunlight falls on the device. For example, if the sunlight hit the sensor between 9:00-9:15 AM the day before in the spring, it will look for the sunlight occurrence around 8:58-9:13 AM the next day. If the heat/cool cycle is not needed during this time, one way to correct it would be to make an estimate of the temperature when the effect of the direct sunlight diminishes and make an interpolation between the current temperature and the predicted temperature between 8:58-9:13 AM. If the heat/cool cycle needs to be on, it learns from the previous cycles and make an estimate of cycle duration and temperature changes. It may use humidity and other sensors (in the device itself or in another device nearby) to verify the heat/cool cycle is on and remains on for an appropriate amount of time.

For some embodiments, the VSCU units provide optimal yet energy saving control based on human comfort modeling. In one example, if the user keeps turning up the thermostat above the set points provided in the template schedule, then VSCU units learn that and increase the set points in their template schedule. By way of further example, if the outside temperature has been 80 degrees for many days, and then for one day it is suddenly 60 degrees, the VSCU unit will keep the house at a warmer set point than if the outside temperature has been 60 degrees for many days. The reason is that humans are known to get accustomed to outside weather patterns that have been prevailing for a period of time, and so are more sensitive to sudden temperature changes than to longer term temperature changes. For example, if it has been 60 degrees for many days, the people will be more likely to dress warmer on an ongoing basis (put on sweatshirts and the like) and so the set point can be gradually lowered and/or the amount of swing can be gradually raised to save energy.

As another example of optimal yet energy saving control based on human comfort modeling, for one embodiment the VSCU is configured to perform in an advantageous way based on a predicted return time of the occupant. For this embodiment, the idea is to purposely pre-heat (or pre-cool in a counterpart example) the house, but only to a limited extent, perhaps only 60% of the difference between the "Away" and "Occupied" set points, until there is actually an occupancy detection event. For example, if the "Away" set point temperature is 64, and the "Occupied" set point temperature is 74, then the VSCU units start heating the house 20 minutes before the expected home arrival time, but only do so until the house heats up to 70 degrees. Then, when the occupant walks through the door, the remaining 4 degree heat-up is triggered by the VSCU units. In addition to saving energy, this can also be pleasing to the senses of the returning occupant, because the heat will be blowing, which gives a sense of hominess and of feeling welcome, a sense of "it is great to be home, it is so nice." Moreover, it has been found that people are a lot more tolerant to the lower temperature immediately after they have walked through door than if they have been home for a while.

As another example of optimal yet energy saving control provided by the VSCU units, there is a control algorithm found to provide good results for situations of extended but finite opening of an external door, such as cases in which an occupant is bringing in the Christmas Tree or the groceries. In particular, if it usually takes 5 minutes to heat from 68 to 72, and it suddenly has taken 5 minutes just to heat from 68 to 69 or there has been no change at all from 68 in 5 minutes of heating, the VSCU unit will immediately turn off the heat for 10-15 minutes, and then try again to raise the temperature back to 72, under the possibility that the anomaly was temporary. And if it was indeed temporary, then the situation has resolved itself. But if the failure to heat up happens again, then there can be an alarm (or text message) that requests the user's attention, and if there is no response from the user the system is shut down because there is obviously something wrong. An e-mail message can be sent to the user such as "We have ruled out these things x-y-z from our sensor logs, maybe there is an outside door open or a-b-c is wrong."

For another embodiment, there is provided a combined business and technical method relating to the "learning" process of the VSCU unit 100. The VSCU units are programmed to provide substantial "learning" about user occupancy and temperature control patters. The user will be advised at various times, such as by remote access, e-mail, SMS, VSCU unit display, etc., regarding the progress of the learning (e.g., "your occupancy information is 60 percent learned"). However, there will also be an ability for the users to turn off the learning function because they might not be comfortable with in. In one embodiment, the VSCU system will "act" like it is not learning (such as by stopping the progress messages), but will actually still be learning in the background, running in a simulation mode and continue to compile the learning data. Then, after some period has passed, the VSCU unit can compute the energy cost difference between the actual model it was running, versus the simulation model it was running in the background. If there is a substantial difference of "X" dollars, the user can be shown or sent a message such as, "You could have saved $44 if you had enabled learning-driven control, are you sure that you do not want to turn it on now?"

For another embodiment, there is provided a combined business and technical method in which users are offered a subscription service by a VSCU data service provider. As the VSCU data service provider comes up with new types of algorithms, they can offer VSCU unit customers a subscription to an external control/optimization service. As part of the offering process, the VSCU data service provider can run the new algorithms on the historical internal and external temperature data for that customer, and then say to them (by VSCU unit display or remote access display, for example), "If you had subscribed to this optimization service, you would have saved $88 last year". Similar offerings can be made for discrete firmware version upgrades, e.g., "If you had purchased VSCU unit software version 2.0 instead of staying with version 1.0, you would have saved $90. Would you like to buy version 2.0 now for $20?"

For another embodiment, there is provided a combined business and technical method in which users are given advisory messages (by VSCU unit display or remote access display, for example) such as follows: "A VSCU-capable house in your ZIP code having the same size as your house spent $1000 for heating and cooling, whereas you spent $2000. You may have a leak or weather-stripping problem. You may wish to call ABC HVAC Service Company at 650-555-1212 who can do an energy audit to help you figure out what is wrong."

For another embodiment, the VSCU units are programmed and configured to provide the user with the ability to control their HVAC system exclusively on the basis of an HVAC budget rather than on target temperature settings. The user simply enters a dollar amount per month that they want to spend on HVAC, and the VSCU automatically adjusts the settings such that the selected amount will be spent, in the most comfortable (or least uncomfortable) manner possible according to the user's known occupancy patterns and preferences. Optionally, the user can manually turn the set temperature up or down from the VSCU-established schedule, but if they do so, the VSCU unit will immediately display the difference in cost that will occur (For example, "Extra $5 per day: Continue? {Yes} {No}". The calculations can take into account seasonal weather patterns, what month it is now, weather forecasts, and so forth. For another embodiment, the VSCU unit can ask the user, on its own initiative, "Do you want to save $100 this month by having VSCU manage your settings? {Yes} {No}" (as opposed to just asking "how about reducing temperature one degree").

For another embodiment, the VSCU units are programmed and configured to provide the user with "pre-paid HVAC" and/or "pay as you go HVAC". Based on a pre-paid amount or a pre-budgeted amount, the VSCU display will show the dollar amount that is remaining from that pre-paid or budgeted amount. This can be particularly useful in landlord-tenant environments or property management environments, wherein the landlord can program in the amount, and the tenant can see how much is left at any particular point in time. This can also be useful for vacation homes, allowing property managers to remotely manage power usage and settings. As part of this, the software locking mechanism described previously can determine who is using the thermostat based on personal codes, so the VSCU will know the identity of the user. This can still be useful in a single-family home setting, where certain targets can be set and the family can dynamically see a running tally as to how well they are performing relative to that target. The money amounts can be a set of default estimates, or can be based on actual usage as accessed from a utility company database using, for example, smart-meter readings.

For another embodiment, the VSCU units are programmed and configured to provide temperature setting governance based on user identity. The software locking functionality is used to ensure that only people with passcodes can change the VSCU temperature settings, and the VSCU unit furthermore recognizes a separate landlord (or other "governor") password and one or more separate tenant (or other "governee") passwords. The landlord can then login and set a maximum set temperature, such as 75. Thereafter, although the tenant can make temperature changes, the VSCU unit will not allow the tenant to set the temperature above 75 degrees. Various tamper-proofing mechanisms can be provided. As a default tamper-proofing mechanism, the landlord would be able to access the VSCU data service provider web site to ensure that the VSCU unit is reporting in at regular intervals with its usage data, to request weather data, and so forth.

For another embodiment, with reference to the hotel 1202 of FIG. 12, the VSCU data service provider 1208 can provide the hotel front desk with a web-based, cloud-based, or custom software package that provides automated, comprehensive, dynamic control of the VSCU unit temperature settings in each guest room. For example, the room VSCU temperature set point can be adjusted to comfortable levels when the guest first checks in, and then returned to energy-saving levels when the guest has checked out. Also, during the guest's stay, intrinsic occupancy detection (using the unit's own sensors) and/or extrinsic occupancy detection (automated sensing the door being locked from the inside by a hotel computer connected to the VSCU hotel management system) can be used to activate comfort levels versus power-saving levels. This can be similarly useful for vacation homes as remotely managed by property management companies.

Further provided by the VSCU units is an automated override or overwriting of template schedule set point levels or time interval definitions that the user may have manually specified to the VSCU unit, either by remote control or direct entry into the VSCU unit (such as during the setup interview), based on their actual control behaviors after those inputs were made. For example, if the user specified in the setup interview that they come home at 5 PM every day, but then there are multiple days in a row (for example, 2 days or 3 days in a row) that the temperature was turned up from 62 to 65 at 4:30 PM, this is used to weight the schedule and turn the set point up to 65 at 4:20 PM thereafter, such that the temperature will be preheated to 65 by 4:30 PM when the user is expected to walk through the door. The automatic changes made by the VSCU units to the template schedule to conform around the actual occupancy behavior of the user, rather than the user's own estimates of their occupancy behavior, can take place gradual over a period of many days, or can be immediately effective on a single day, without departing from the scope of the present teachings.

For another embodiment, the VSCU units are programmed and configured to automatically switch over from heating to cooling functionality by resolving any ambiguity in user intent based on sensed information. Part of the elegance of the VSCU unit 100 of FIGS. 1A-1C is the absence of a HEAT-OFF-AC switch. One issue raised by this is potential ambiguity regarding user intent in the event of certain user control inputs. For example, if the user changes the set point from 78 to 65, there may be an ambiguity whether they simply wanted to turn off the heat or whether they want to turn on the air conditioning. According to an embodiment, the VSCU units resolve an ambiguity whether to switch over depending on the context of the set point change and the values of the old and new set point. In one embodiment, the method comprises the steps of: (a) maintaining an updated value for a drift temperature, defined as an estimated temperature to which the controlled space would drift if no HVAC heating or cooling were applied to the controlled space; (b) receiving the user set point change from an old set point to a new set point, (c) evaluating the values of the old set point and new set point in view of the current temperature and the drift temperature (for example, place them on a state diagram having three regions segregated by the current and drift temperatures) to classify the set point change in terms of whether a mode switchover (i.e., a switchover from heating to cooling or cooling to heating) was (i) clearly not intended, (ii) clearly intended, or (iii) possibly intended by the user in making the set point change; and (d) if classified in step (c) as "possibly intended", and if the new set point lies between the current temperature and the drift temperature, request the user to choose between (i) an active switchover to achieve the new set point, and (ii) natural drifting to the new set point, along with a graphical illustration that the natural drifting option represents a more energy-saving option. Another related functionality is that whatever the user chooses in step (d), use this as a learning point and then the next time this happens, you can automatically make the determination based on what you learned from the user's choice. For this method, there can alternatively be a different parameter used instead of the drift temperature for the state diagram, for example, the outside temperature, the outside temperature plus 10 degrees, a "minimum comfort temperature", or the like. It may be that in California the best number to use is the drift temperature, whereas in Minnesota it may be the minimum comfort temperature.

For some embodiments, which are particularly applicable in view of ongoing improvements in automated sensing, a personalized control paradigm is promoted by the VSCU units, that is, the VSCU units function to automatically detect and identify individual users in the home and attempt to identify their current and upcoming individual needs and desires with respect to VSCU-related functionality. For one example, the VSCU units are programmed with a "finger-printing" functionality to recognize a particular user who is making a current control adjustment at the face of the unit, and then adjusting its response if appropriate for that user. For example, the particular way the user has turned the VSCU unit outer ring, or where they put their fingers on the VSCU unit dial or body (using touch sensors), how much pressure they exert for an inward click, and how close their body is to the VSCU unit dial (using a proximity sensor) can be used as their "fingerprint". In one example, each user can be identified and initially "fingerprinted" in a separate question-and-answer session, and their personal preferences can thereafter be learned by virtue of their control inputs to the VSCU units from both remote locations and on the dial. At first, most of the fingerprinting can be done via user's commands from their mobile phone as well as the web. People will be controlling the thermostat a lot from their phone before getting home, or after they have left. Also, if they are somewhere else with an easier access to a computer (or even at home computer), they will use the web. Personalized control from VSCU units can be based on multiple maps of a "user comfort model" for the identified person. A model is built on what their preference/physical comfort zone is like. But if there are multiple users who have very different preferences, there may be a benefit in building two (or more) different models than to completely average them. The VSCU can learn to implement a comfortable temperature based on one model or the other based on who is at home, for example, based on which mobile device is at home (or other signatures) or which user is away by virtue of having accessed the system from a remote IP address. A web service can be used to inform these differences, which is informative to the user (and may result in the user telling their spouse to put on a sweater). For one concrete example of individualized occupancy detection and set point adjustment according to an embodiment, the VSCU units can make a conclusion that a first occupant "M" likes it cooler, while a second occupant "W" likes it warmer based on their settings and their remote and direct controls to the VSCU units. When the system determines that "W" is home and "M" is not at home, then the temperature is set higher, or otherwise follows a separate template schedule customized for "W". The presence of "W" and the absence of "M" can be detected, for example, using IP traffic analysis methods to determine that "M" is still at work while the home is sensed to have an occupant, which must be "W".

Provided according to some embodiments is a gesture-based user interface for the VSCU units. For one embodiment, a touch-sensitive display is provided in which sliding touch controls are enabled, similar to swipe controls and other gestures used by the iPad and iPhone. Alternatively, a small camera can be placed on the VSCU unit, which is programmed with the ability to process the optical input information such that it can recognize hand gestures (clockwise hand rotation to turn up the temperature, counterclockwise to turn down the temperature), similar to the way that the Microsoft Kinect™ sensor works in conjunction with the Xbox 360® video gaming console to provide controller-free, gesture-based user inputs (i.e., inputs based on hand, foot, or body motion without requiring the user to hold a controller device or to otherwise have a hardware input device on their person).

Provided according to some embodiments is an VSCU unit, which can function as either an auxiliary VSCU unit or primary VSCU unit, having a network-only user interface such that the physical unit itself has no controls whatsoever. The user must have a data appliance to access it and control it. The network-only VSCU unit may be useful for many situations such as college dormitories, or can be a very low-cost starter VSCU unit for a young but technically savvy apartment dweller.

Provided according to some embodiments is the use and functionality of installed VSCU units to serve as an HVAC-centric home energy hub based on the VSCU Energy Efficiency Platform with which many common home appliances will be compatible under license or other business arrangement with the VSCU unit manufacturer and/or VSCU data service provider. The VSCU units are functional as central "energy hub" for the whole house. The VSCU unit is a good way to instantiate such a "home energy network" because people need a thermostat anyway, and once it is installed it can be the core for such a network. For example, using wireless communications the VSCU unit can communicate with the dishwasher, or the refrigerator. If the user walks up to the dishwasher and attempts to start it, there can be a display on the dishwasher that says "Would you like to start the load now for $1, or wait until 2 AM and do the load for 20 cents?" The VSCU units serve and the conduit and core for such a platform. In one example of many advantages, with occupancy sensing the VSCU unit can sense when the occupants are not home, and automatically command the refrigerator to turn up its set point by 2 degrees, and then command it to return to normal after the VSCU has sensed that the occupants have returned. Similar functionalities can be provided in conjunction with any hot water heaters, hot tubs, pool heaters, and so forth that are equipped and licensed to be compatible with the VSCU Energy Efficiency Platform.

For some embodiments, business methods are provided for effective commercial introduction and rollout of the VSCU units and the evolution of the VSCU Efficiency Platform. At a start date of first product introduction, the simpler DIY packages of VSCU units are made available at a retail level including both online stores and brick-and-mortar stores. For buying a first primary VSCU unit, the customer gets free web access to the online tools of the VSCU data service provider (who can be the same entity as, or a partner entity to, the manufacturer of the VSCU unit), including for example the web-based remote control functionality as shown in FIGS. 13A-13B. A number of months into their usage, the web site shows the customer their energy usage and control history under the VSCU scheme, including how much money they have already saved because of their conversion. A number of months from the start date, the "professional" package VSCU units are released and professional installation made available, the first auxiliary units are made available, and fee-based subscriptions are made available to all users to a web-based service that provides them with opportunities for additional savings, such as to give them access to use special energy-saving schedule templates that have been developed based on more accurate building information, patterns detected in their particular occupancy history, or the particular weather history/forecasts around that home. Also a number of months from the start date, each user is provided with a reminder that they can save even more money by buying an auxiliary VSCU unit, and the above-described filter replacement program is also rolled out. Also a number of months from the start date, the users can get game-style rankings, including leaf icon rewards, of how they are doing in their neighborhood, or against some other population, with respect to energy efficiency. For example, the user can be presented with their percentile ranking against that population. They can try to be the number one with the most green leafs in that population. Web-based or cloud-based software that facilitates multi-tenant building control and hotel control can subsequently be rolled out. At a later point when there is enough user mass, the VSCU data service provider can provide web-based or cloud-based software to become a VSCU Efficiency Platform facilitator for utility companies, i.e., the utility companies will be clients of the VSCU data service provider, who will help them who can offer programs or services based on the VSCU Efficiency Platform. For one embodiment, the utility company will encourage its customers to switch over to VSCU unit-based control, for example by heavily subsidizing purchase of the VSCU units. Optionally, the utility company can offer energy discounts or other financial incentives for VSCU unit-based customers to "opt in" to a program that gives the utility company at least some degree of remote control over their VSCU units during times of peak loads or energy emergencies.

Provided in one embodiment is a filterless HVAC system. Instead of using a disposable filter, which can reduce HVAC efficiency when it starts to get clogged, the HVAC system is equipped with a filtering system similar to those used in one or more bagless vacuum cleaners and identified by various trade names such as "cyclonic" or "tornado" or "wind tunnel", for example the Dyson DC25 Upright Vacuum cleaner, the Hoover Windtunnel II Bagless Upright Vacuum Cleaner, the Bissell 5770 Healthy Home Bagless Upright Vacuum, the Electrolux EL 7055A Twin Clean Bagless Canister Vacuum, and/or the Hoover UH70010 Platinum Collection Cyclonic Bagless Upright Vacuum Cleaner. By designing the filter out of the HVAC system altogether, the homeowner simply needs to change a canister once in a while, and the HVAC system does not lose efficiency over time like a regular filter does.

Provided in some embodiments are VSCU units into which are integrally provided other essential home monitoring device functionalities combined smoke detection, heat detection, motion detection, and CO2 detection. As an optional business method, such VSCU units can be sold at a deep discount or given away for free, with revenue being generated instead by subscriptions to the data services of the VSCU data service provider. Alternatively, they can be given away for free or heavily subsidized by a utility company that is partnered with the VSCU data service provider in exchange for customer "opt in" to voluntary data collection and/or remote VSCU setting programs applicable during periods of energy shortage or other energy emergency.

Provided according to some embodiments are algorithms for automated setpoint determination based on a setpoint temperature schedule and manual user setpoint modifications. As an ongoing rule for any manual user setpoint change, any setpoint entered by the user at a primary or auxiliary VSCU user interface will take effect for a maximum of four hours, at which point operation is then returned to the normal setpoint schedule. In the event that the normal setpoint schedule would call for a scheduled temperature change within that four hour interval (for example, a scheduled change to a sleeping temperature at 10:00 PM), then that scheduled temperature setpoint overrides the manual user setpoint input at that time.

Provided according to some embodiments are algorithms for setpoint schedule departure and/or setpoint schedule modification based on sensed enclosure occupancy and user setpoint modification behaviors. One example of such a setpoint schedule departure algorithm, termed herein an "auto away/auto arrival" algorithm, is described further hereinbelow.

FIGS. 15A-15D illustrate time plots of a normal setpoint temperature schedule versus an actual operating setpoint plot corresponding to an exemplary operation of an "auto away/auto arrival" algorithm according to a preferred embodiment. Shown in FIG. 15A, for purposes of clarity of disclosure, is a relatively simple exemplary thermostat schedule 1502 for a particular weekday, such as a Tuesday, for a user (perhaps a retiree, or a stay-at-home parent with young children). The schedule 1502 simply consists of an awake/at home interval between 7:00 AM and 9:00 PM for which the desired temperature is 76 degrees, and a sleeping interval between 9:00 PM and 7:00 AM for which the desired temperature is 66 degrees. For purposes of the instant description, the schedule 1502 can be termed the "normal" setpoint schedule. The normal setpoint schedule 1502 could have been established by any of a variety of methods described previously in the instant disclosure, described previously in one or more of the commonly assigned incorporated applications, or by some other method. For example, the normal setpoint schedule 1502 could have been established explicitly by direct user programming (e.g., using the Web interface), by setup interview in which the setpoint schedule is "snapped" into one of a plurality of predetermined schedules (e.g., retiree, working couple without kids, single city dweller, etc.), by automated learning based on user setpoint modifications from a "flat-line" starting schedule, or by any of a variety of other methods.

In accordance with a preferred "auto away" algorithm, an enclosure occupancy state is continuously and automatically sensed using the VSCU multi-sensing technology, the currently sensed state being classified as occupied (or "home" or "activity sensed") or unoccupied (or "away" or "inactive"). If the currently sensed occupancy state has been "inactive" for a predetermined minimum interval, termed herein an away-state confidence window (ASCW), then an "auto-away" mode of operation is triggered in which an actual operating setpoint 1504 is changed to a predetermined energy-saving away-state temperature (AST), regardless of the setpoint temperature indicated by the normal thermostat schedule 1502. The purpose of the "auto away" mode of operation is to avoid unnecessary heating or cooling when there are no occupants present to actually experience or enjoy the comfort settings of the schedule 1502, thereby saving energy. The AST may be set, by way of example, to a default predetermined value of 62 degrees for winter periods (or outside temperatures that would call for heating) and 84 degrees for summer periods (or outside temperatures that would call for cooling). Optionally, the AST temperatures for heating and cooling can be user-settable.

The away-state confidence window (ASCW) corresponds to a time interval of sensed non-occupancy after which a reasonably reliable operating assumption can be made, with a reasonable degree of statistical accuracy, that that there are indeed no occupants in the enclosure. For most typical enclosures, it has been found that a predetermined period in the range of 90-180 minutes is a suitable period for the ASCW, to accommodate for common situations such as quiet book reading, stepping out to the corner mailbox, short naps, etc. in which there is no sensed movement or related indication for the occupancy sensors to sense.

Figure 15A:
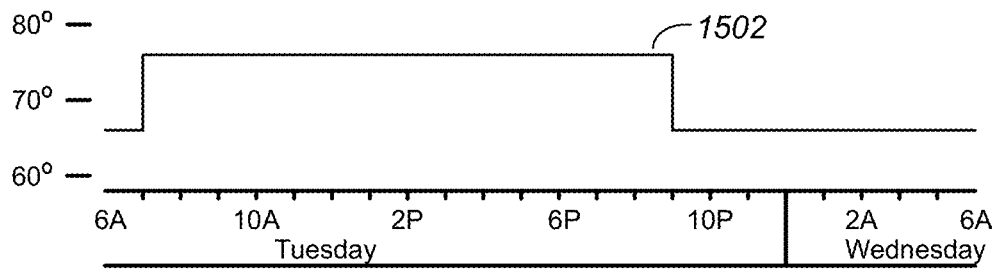
FIGS. 15A-15D illustrate time plots of a normal setpoint temperature schedule versus an actual operating setpoint plot corresponding to an exemplary operation of an "auto away/auto arrival" algorithm according to a preferred embodiment.
Figure 15B:
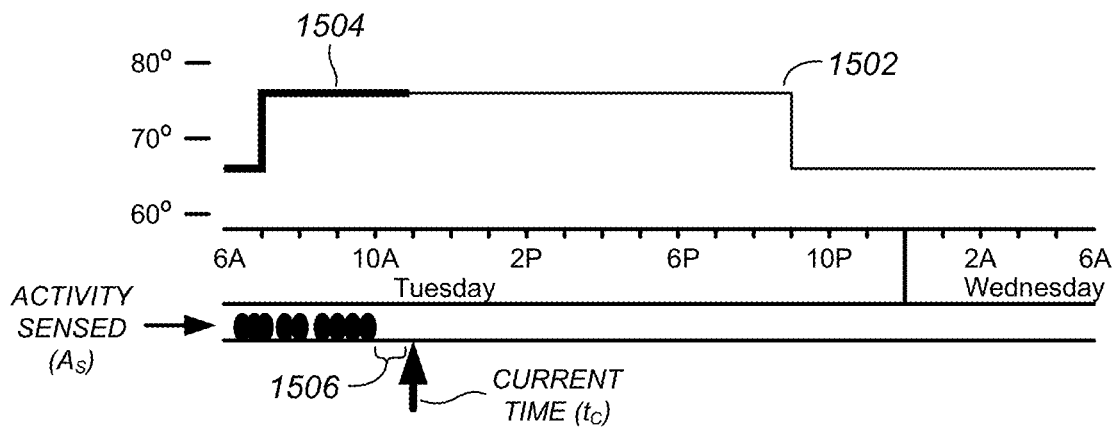
Figure 15C:
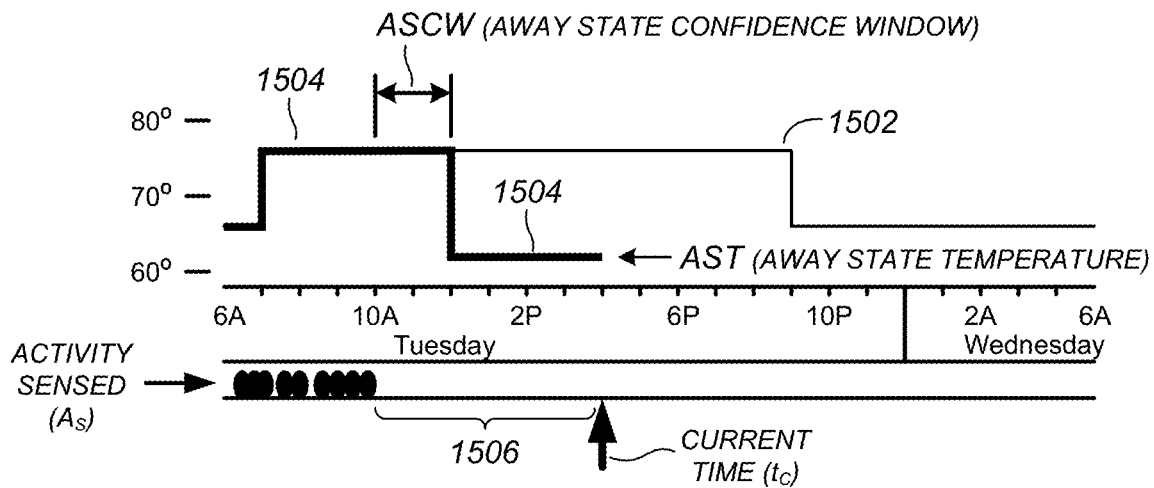

In the example of FIG. 15A-15D, exemplary description is provided in the context of a heating scenario with an ASCW of 120 minutes, and an AST of 62 degrees, with it to be understood that counterpart examples for cooling and for other ASCW/AST value selection would be apparent to a person skilled in the art in view of the present description and are within the scope of the embodiments. Shown for purposes of illustration in FIG. 15B is the scheduled setpoint plot 1502 and actual operating setpoint plot 1504, along with a sensed activity timeline (AS) showing small black oval markers corresponding to sensed activity, that is current as of 11:00 AM. Notably, as of 11:00 AM, there was significant user activity sensed up until 10:00 AM, followed by a one-hour interval 1506 of inactivity. Shown in FIG. 15C are the scheduled and actual setpoint plots as of 4:00 PM. As illustrated in FIG. 15C, an "auto-away" mode was triggered at 12:00 PM after 120 minutes of inactivity, the actual operating setpoint 1504 departing from the normal scheduled setpoint 1502 to the AST temperature of 62 degrees. As of 4:00 PM, no activity has yet been sensed subsequent to the triggering of the "auto-away" mode, and therefore the "auto-away" mode remains in effect.

The "auto-away" mode can be terminated based on sensed events, the passage of time, and/or other triggers that are consistent with its essential purpose, the essential purpose being to save energy when no occupant, to a reasonably high statistical degree of probability, are present in the enclosure. For one embodiment, the "auto-away" mode of operation maintains the setpoint temperature at the energy-saving AST temperature until one of the following occurs: (i) a manual corrective input is received from the user; (ii) an "auto-return" mode of operation is triggered based on sensed occupancy activity; (iii) normal occupant sleeping hours have arrived and a determination for a "vacation" mode has not yet been reached; or (iv) the subsequent day's "wake" or "at home" interval has arrived and a determination for a "vacation" mode has not yet been reached.

Figure 15D:
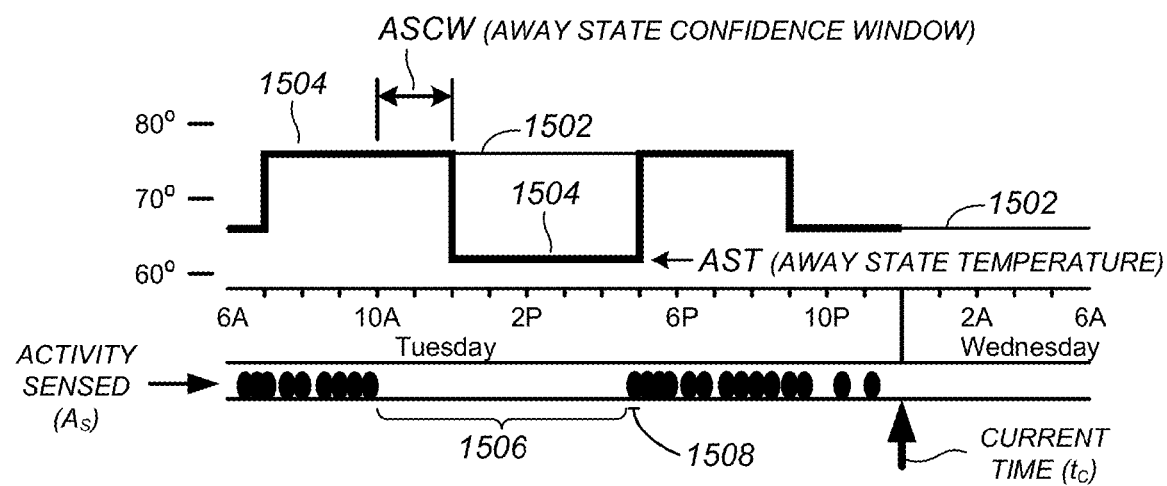

Thus, shown in FIG. 15D is are the scheduled and actual setpoint plots as of 12:00 AM. As illustrated in FIG. 15D, occupancy activity started to be sensed for a brief time interval 1508 at about 5 PM, which triggered the "auto-return" mode, at which point the actual operating setpoint 1504 was returned to the normal setpoint schedule 1502.

Preferably, the user is provided with an ability (e.g., during initial setup interview, by the Web interface, etc.) to vary the ASCW according to a desired energy saving aggressiveness. For example, a user who selects a "highly aggressive" energy saving option can be provided with an ASCW of 45 minutes, with the result being that the system's "auto-away" determination will be made after only 45 minutes of inactivity (or "away" or "unoccupied" sensing state).

Various methods for sub-windowing of the ASCW time period and filtering of sensed activity can be used to improve the reliability of the triggering of the "auto-away" mode. Various learning methods for "understanding" whether sensed activity is associated with human presence versus other causes (pets, for example) can also be used to improve the reliability of the triggering of the "auto-away" mode. For one embodiment, a "background" level of sensed activity (i.e., activity that can be attributed to sensed events that are not the result of human occupancy) can be interactively learned and/or confirmed based on the absence of corrective manual setpoint inputs during an "auto-away" mode period. For example, if there are no corrective manual setpoint changes for a period of time following after the "auto-away" mode is triggered, and such absence of corrective input repeats itself on several different occasions, then it can be concluded that the type and/or degree of sensed activity associated with those intervals can be confirmed as being "background" levels not associated with human presence, the reasoning being that if a human were indeed present, there would have been some type of corrective activity on one or more of such occasions.

In a manner similar to the "auto-away" occupancy evaluation, the triggering of an "auto-return" mode of operation is likewise preferably based on sub-windowed time windows and/or filtering of the sensed activity, such that spurious events or other events not associated with actual human presence do not unnecessarily trigger the "auto-return" mode. For one example, the sensing process involves separately evaluating 5-minute subwindows (or subwindows of other suitable duration) of time in terms of the presence or absence of sensed activity during those subwindows. If it is found that a threshold amount of activity is sensed in two adjacent ones of those time subwindows, then the "auto-return" mode is triggered (see, for example, the time interval 1508 of FIG. 15D). Upon triggering, the "auto-return" mode operates by returning the setpoint to the normal setpoint schedule 1502.

Provided according to one embodiment is an algorithm for setpoint schedule modification based on occupancy patterns and/or corrective manual input patterns associated with repeated instances of "auto-away" mode and/or "auto-arrival" mode operation. Occupancy and/or corrective manual input behaviors associated with "auto-away/auto-arrival" mode are continuously monitored and filtered at multiple degrees of time periodicity in order to detect patterns in user occupancy that can, in turn, be leveraged to "trim" or otherwise "tune" the setpoint temperature schedule to better match actual occupancy patterns. By filtering at multiple levels of time periodicity, it is meant that associated patterns are simultaneously sought (i) on a contiguous calendar day basis, (ii) on a weekday by weekday basis, (iii) on a weekend-day by weekend-day basis, (iv) on a day-of-month by day-of-month basis, and/or on the basis of any other grouping of days that can be logically linked in terms of user behavior. Thus, for example, if a particular occupancy and/or corrective manual input behavior associated with "auto-away/auto-arrival" is observed for a series of successive Fridays, then the setpoint temperature schedule for Fridays is adjusted to better match the indicated occupancy pattern. If a particular occupancy and/or corrective manual input behavior associated with "auto-away/auto-arrival" is observed for both a Saturday and Sunday, and then for the next Saturday and Sunday, and then still for the following Saturday and Sunday, then the setpoint temperature schedule for Saturdays and Sundays is adjusted to better match the indicated occupancy pattern detected. As yet another example, if a particular occupancy and/or corrective manual input behavior associated with "auto-away/auto-arrival" is observed for the 2nd through 7th day of the month for several months in a row, then then the setpoint temperature schedule for the 2nd through 7th day of the month is adjusted, and so on.

Figure 16A:
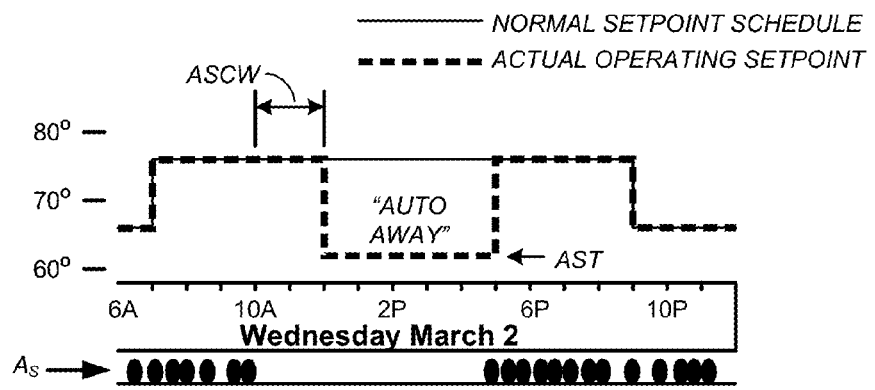
FIGS. 16A-16D illustrate one example of setpoint schedule modification based on occupancy patterns and/or corrective manual input patterns associated with repeated instances of "auto-away" mode and/or "auto-arrival" mode operation according to an embodiment.
Figure 16B:
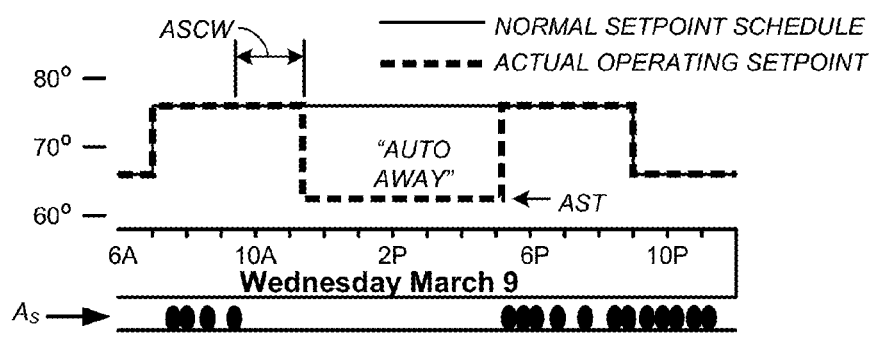
Figure 16C:
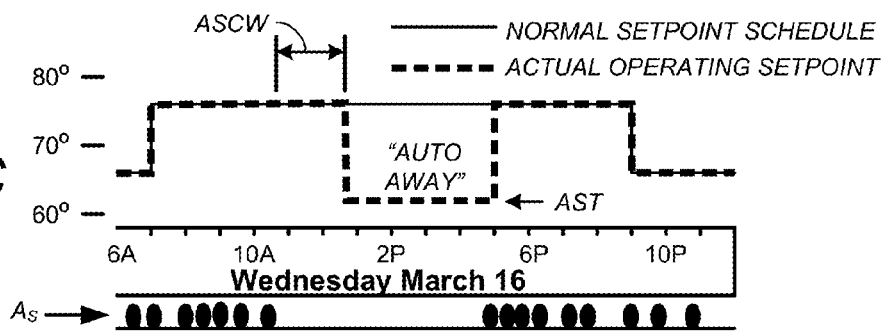
Figure 16D:
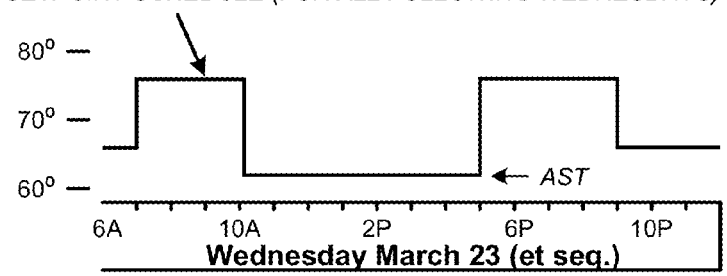

FIGS. 16A-16D illustrate one example of setpoint schedule modification based on occupancy patterns and/or corrective manual input patterns associated with repeated instances of "auto-away" mode and/or "auto-arrival" mode operation according to an embodiment. For this example, it is observed over time that, for a user whose normal setpoint temperature indicates they are home all day on weekdays, the "auto-away" mode is triggered near noon on Wednesday for multiple weeks (FIGS. 16A-16C) without any corrective manual user inputs, and then the "auto-arrival" mode is triggered near 5:00 PM for those days. This may correspond, for example, to a retiree who has decided to volunteer at the local library on Wednesdays. Once this pattern has been reliably established (for example, after having occurred three Wednesdays in a row), then as illustrated in FIG. 16D, the normal setpoint temperature schedule is automatically "tuned" or "trimmed" such that, for the following Wednesday and all Wednesdays thereafter, there is an "away" period scheduled for the interval between 10:00 AM and 5:00 PM, because it is now expected that the user will indeed be away for this time interval.

Importantly, if there had occurred a corrective user input (which can be called a "punishing" user input) on one of the days illustrated in FIGS. 16A-16C, then the setpoint schedule is not automatically "tuned" to that shown in FIG. 16D. Such corrective or "punishing" input could occur for circumstances in which (i) the auto-away mode has been triggered, (ii) there is not enough sensed occupancy activity (after filtering for "background" events) to trigger the "auto-return" mode, and (iii) the user is becoming uncomfortable and has walked up to the thermostat to turn up the temperature. By way of example, it may be the case that instead of going to the library on Wednesday at 10:00 AM, the user went upstairs to read a book, with a sole first-floor VSCU unit not sensing their presence and triggering auto-away at 12:00 PM, the user then becoming uncomfortable at about 12:45 PM and then coming downstairs to manually turn up the temperature. Because the user's "punishing" input has made it clear that the algorithm is "barking up the wrong tree" for this potential pattern, the setpoint schedule is not automatically "tuned" to that shown in FIG. 16D, and, in one embodiment, this potential pattern is at least partially weighted in the negative direction such that an even higher degree of correlation will be needed in order to establish such pattern in the future. Advantageously, for the more general case, the user's "punishing" inputs may also be used to adjust the type and/or degree of filtering that is applied to the occupancy sensing algorithms, because there has clearly been an incorrect conclusion of "inactivity" sensed for time interval leading up to the "punishing" corrective input.

Whereas the "auto away/auto arrival" algorithm of the above-described embodiments is triggered by currently sensed occupancy information, in another embodiment there is provided automated self-triggering of "auto away/auto arrival" algorithm based on an empirical occupancy probability time profile that has been built up by the VSCU unit(s) over an extended period of time. For one embodiment, the empirical occupancy probability time profile can be expressed as a time plot of a scalar value (an empirical occupancy probability or EOP) representative of the probability that one or more humans is occupying the enclosure at each particular point in time. Any of a variety of other expressions (e.g., probability distribution functions) or random variable representations that reflect occupancy statistics and/or probabilities can alternatively be used rather than using a single scalar metric for the EOP.

For one embodiment, the VSCU unit is configured to self-trigger into an "auto-away" mode at one or times during the day that meet the following criteria: (i) the normal setpoint schedule is indicative of a scheduled "at home" time interval, (ii) the empirical occupancy probability (EOP) is below a predetermined threshold value (e.g., less than 20%), (iii) the occupancy sensors do not sense a large amount of activity that would unambiguously indicate that human occupants are indeed present in the enclosure, and (iv) the occupancy sensors have not yet sensed a low enough level of activity for a sufficiently long interval (i.e., the away-state confidence window or ASCW) to enter into the "auto away" mode in the "conventional" manner previously described. Once these conditions are met and the "auto-away" mode has been self-triggered, reversion out of the "auto away" mode can proceed in the same manner (e.g., by "auto-arrival" triggering, manual corrective user input, etc.) as for the "conventional" auto-away mode. Automated tuning of the setpoint temperature schedule based on the "lessons learned" (i.e., based on occupancy patterns and/or corrective manual input patterns associated with repeated instances of "auto-away" mode) can be based on the combined observations from the "conventionally" triggered auto-away mode and the self-triggered auto-away mode algorithms.

The above-described self-triggering of the "auto-away" mode, which is based at least in part on empirical occupancy probability (EOP), has been found to provide for more complete and more statistically precise "tuning" of the setpoint temperature schedule when capered to tuning that is based only on the "conventional" auto-away triggering method in which only current, instantaneous occupancy information is considered. One reason relates to the large number of activity-sensing data samples used in generating the EOP metric, making it a relevant and useful basis upon which to perform the occupancy "test" afforded by the "auto-away" process. From one perspective, the "auto-away" process can be thought of as a way to automatically "poke" or "prod" at the user's ecosystem to learn more detail about their occupancy patterns, without needing to ask them detailed questions, without needing to rely on the correctness of their responses, and furthermore without needing to rely exclusively on the instantaneous accuracy of the occupancy sensing hardware.

Figure 17A:
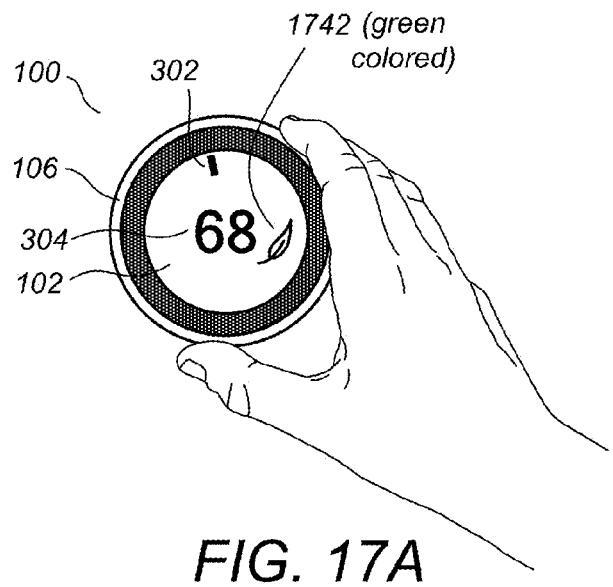
FIGS. 17A-D illustrates a dynamic user interface for encouraging reduced energy use according to a preferred embodiment.
Figure 17B:
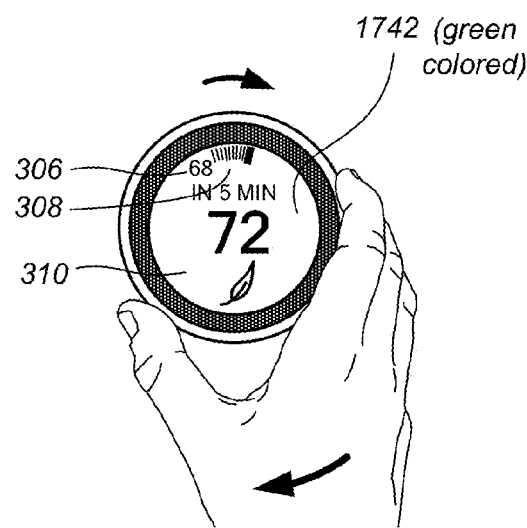
Figure 17C:
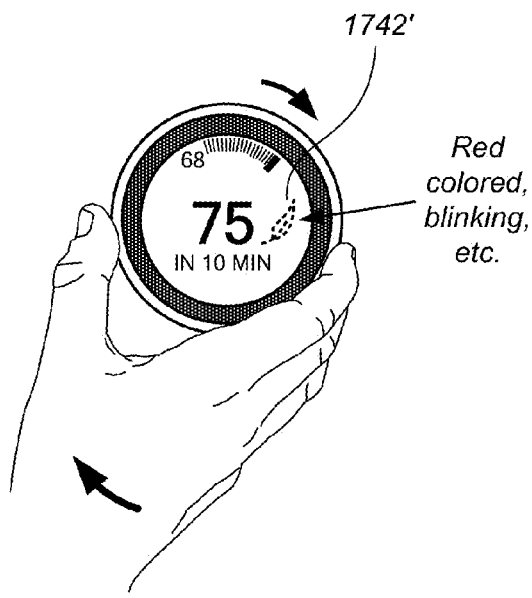
Figure 17D:
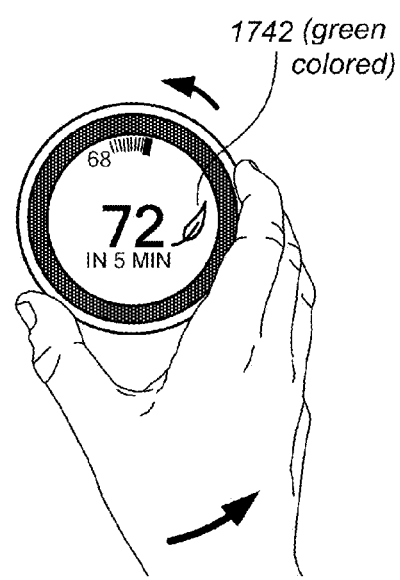

FIGS. 17A-D illustrates a dynamic user interface for encouraging reduced energy use according to a preferred embodiment. The method of FIGS. 17A-D are preferably incorporated into the time-to-temperature user interface method of FIGS. 3A-3K, supra, although the scope of the present teachings is not so limited. As would be readily appreciated by a person skilled in the art, although disclosed in FIGS. 17A-17D in the heating context, application to the counterpart cooling context would be apparent to one skilled in the art in view of the present disclosure and is within the scope of the present teachings. Where, as in FIG. 17A, the heating setpoint is currently set to a value known to be within a first range known to be good or appropriate for energy conservation, a pleasing positive-reinforcement icon such as the green leaf 1742 is displayed. As the user turns up the heat (see FIG. 17B) the green leaf continues to be displayed as long as the setpoint remains in that first range. However, as the user continues to turn up the setpoint to a value greater than the first range (see FIG. 17C), there is displayed a negatively reinforcing icon indicative of alarm, consternation, concern, or other somewhat negative emotion, such icon being, for example, a flashing red version 1742' of the leaf, or a picture of a smokestack, or the like. It is believed that the many users will respond to the negatively reinforcing icon 1742' by turning the set point back down, and as illustrated in FIG. 17D, if the user returns the setpoint to a value lying in the first range, they are "rewarded" by the return of the green leaf 1742. Many other types of positive-emotion icons or displays can be used in place of the green leaf 1742, and likewise many different negatively reinforcing icons or displays can be used in place of the flashing red leaf 1742', while remaining within the scope of the present teachings.

Figure 18A:
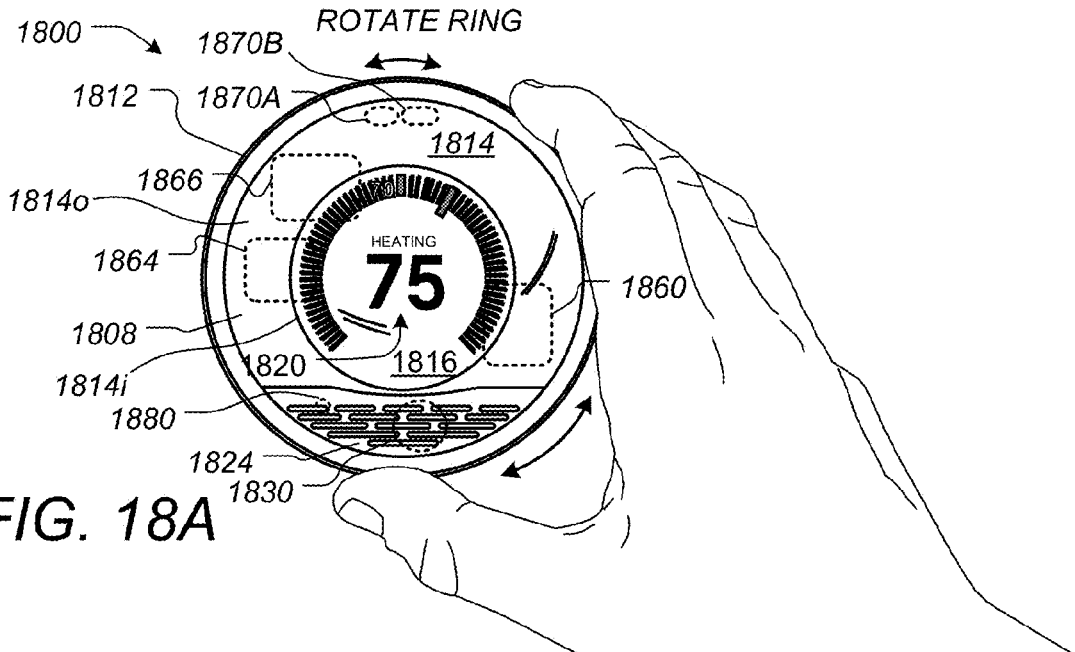
FIGS. 18A-B illustrate a thermostat having a user-friendly interface, according to some embodiments.
Figure 18B:
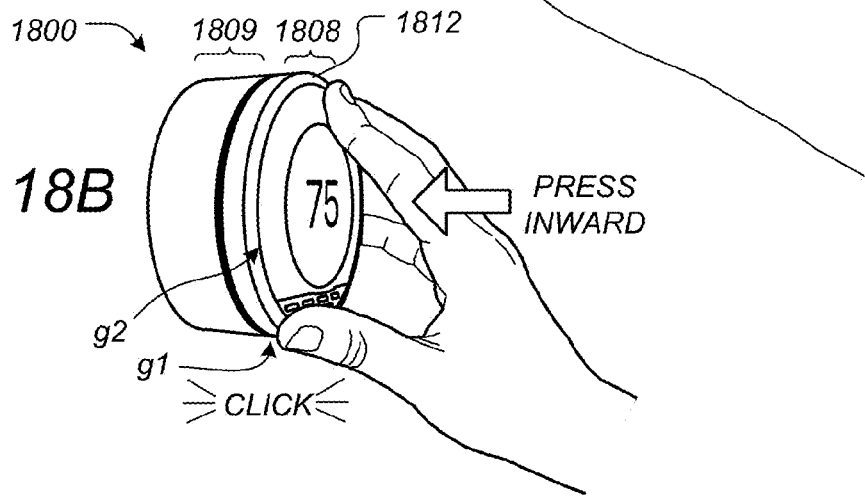

FIGS. 18A-B illustrate a thermostat 1800 having a user-friendly interface, according to some embodiments. The term "thermostat" is used hereinbelow to represent a particular type of VSCU unit (Versatile Sensing and Control) that is particularly applicable for HVAC control in an enclosure. Although "thermostat" and "VSCU unit" may be seen as generally interchangeable for the contexts of HVAC control of an enclosure, it is within the scope of the present teachings for each of the embodiments hereinabove and hereinbelow to be applied to VSCU units having control functionality over measurable characteristics other than temperature (e.g., pressure, flow rate, height, position, velocity, acceleration, capacity, power, loudness, brightness) for any of a variety of different control systems involving the governance of one or more measurable characteristics of one or more physical systems, and/or the governance of other energy or resource consuming systems such as water usage systems, air usage systems, systems involving the usage of other natural resources, and systems involving the usage of various other forms of energy. Unlike many prior art thermostats, thermostat 1800 preferably has a sleek, simple, uncluttered and elegant design that does not detract from home decoration, and indeed can serve as a visually pleasing centerpiece for the immediate location in which it is installed. Moreover, user interaction with thermostat 1800 is facilitated and greatly enhanced over known conventional thermostats by the design of thermostat 1800. The thermostat 1800 includes control circuitry and is electrically connected to an HVAC system, such as is shown with thermostat 110 in FIGS. 1 and 2. Thermostat 1800 is wall mounted, is circular in shape, and has an outer rotatable ring 1812 for receiving user input. Thermostat 1800 is circular in shape in that it appears as a generally disk-like circular object when mounted on the wall. Thermostat 1800 has a large front face lying inside the outer ring 1812. According to some embodiments, thermostat 1800 is approximately 80 mm in diameter. The outer rotatable ring 1812 allows the user to make adjustments, such as selecting a new target temperature. For example, by rotating the outer ring 1812 clockwise, the target temperature can be increased, and by rotating the outer ring 1812 counter-clockwise, the target temperature can be decreased. The front face of the thermostat 1800 comprises a clear cover 1814 that according to some embodiments is polycarbonate, and a metallic portion 1824 preferably having a number of slots formed therein as shown. According to some embodiments, the surface of cover 1814 and metallic portion 1824 form a common outward arc or spherical shape gently arcing outward, and this gentle arcing shape is continued by the outer ring 1812.

Although being formed from a single lens-like piece of material such as polycarbonate, the cover 1814 has two different regions or portions including an outer portion 1814o and a central portion 1814i. According to some embodiments, the cover 1814 is painted or smoked around the outer portion 1814o, but leaves the central portion 1814i visibly clear so as to facilitate viewing of an electronic display 1816 disposed thereunderneath. According to some embodiments, the curved cover 1814 acts as a lens that tends to magnify the information being displayed in electronic display 1816 to users. According to some embodiments the central electronic display 1816 is a dot-matrix layout (individually addressable) such that arbitrary shapes can be generated, rather than being a segmented layout. According to some embodiments, a combination of dot-matrix layout and segmented layout is employed. According to some embodiments, central display 1816 is a backlit color liquid crystal display (LCD). An example of information displayed on the electronic display 1816 is illustrated in FIG. 18A, and includes central numerals 1820 that are representative of a current setpoint temperature. According to some embodiments, metallic portion 1824 has number of slot-like openings so as to facilitate the use of a passive infrared motion sensor 1830 mounted therebeneath. The metallic portion 1824 can alternatively be termed a metallic front grille portion. Further description of the metallic portion/front grille portion is provided in the commonly assigned U.S. Ser. No. 13/199,108, supra. The thermostat 1800 is preferably constructed such that the electronic display 1816 is at a fixed orientation and does not rotate with the outer ring 1812, so that the electronic display 1816 remains easily read by the user. For some embodiments, the cover 1814 and metallic portion 1824 also remain at a fixed orientation and do not rotate with the outer ring 1812. According to one embodiment in which the diameter of the thermostat 1800 is about 80 mm, the diameter of the electronic display 1816 is about 45 mm. According to some embodiments an LED indicator 1880 is positioned beneath portion 1824 to act as a low-power-consuming indicator of certain status conditions. For, example the LED indicator 1880 can be used to display blinking red when a rechargeable battery of the thermostat (see FIG. 4A, infra) is very low and is being recharged. More generally, the LED indicator 1880 can be used for communicating one or more status codes or error codes by virtue of red color, green color, various combinations of red and green, various different blinking rates, and so forth, which can be useful for troubleshooting purposes.

Motion sensing as well as other techniques can be use used in the detection and/or predict of occupancy, as is described further in the commonly assigned U.S. Ser. No. 12/881,430, supra. According to some embodiments, occupancy information is used in generating an effective and efficient scheduled program. Preferably, an active proximity sensor 1870A is provided to detect an approaching user by infrared light reflection, and an ambient light sensor 1870B is provided to sense visible light. The proximity sensor 1870A can be used to detect proximity in the range of about one meter so that the thermostat 1800 can initiate "waking up" when the user is approaching the thermostat and prior to the user touching the thermostat. Such use of proximity sensing is useful for enhancing the user experience by being "ready" for interaction as soon as, or very soon after the user is ready to interact with the thermostat. Further, the wake-up-on-proximity functionality also allows for energy savings within the thermostat by "sleeping" when no user interaction is taking place our about to take place. The ambient light sensor 1870B can be used for a variety of intelligence-gathering purposes, such as for facilitating confirmation of occupancy when sharp rising or falling edges are detected (because it is likely that there are occupants who are turning the lights on and off), and such as for detecting long term (e.g., 24-hour) patterns of ambient light intensity for confirming and/or automatically establishing the time of day.

According to some embodiments, for the combined purposes of inspiring user confidence and further promoting visual and functional elegance, the thermostat 1800 is controlled by only two types of user input, the first being a rotation of the outer ring 1812 as shown in FIG. 18A (referenced hereafter as a "rotate ring" or "ring rotation" input), and the second being an inward push on an outer cap 1808 (see FIG. 18B) until an audible and/or tactile "click" occurs (referenced hereafter as an "inward click" or simply "click" input). For the embodiment of FIGS. 18A-18B, the outer cap 1808 is an assembly that includes all of the outer ring 1812, cover 1814, electronic display 1816, and metallic portion 1824. When pressed inwardly by the user, the outer cap 1808 travels inwardly by a small amount, such as 0.5 mm, against an interior metallic dome switch (not shown), and then springably travels back outwardly by that same amount when the inward pressure is released, providing a satisfying tactile "click" sensation to the user's hand, along with a corresponding gentle audible clicking sound. Thus, for the embodiment of FIGS. 18A-18B, an inward click can be achieved by direct pressing on the outer ring 1812 itself, or by indirect pressing of the outer ring by virtue of providing inward pressure on the cover 1814, metallic portion 1814, or by various combinations thereof. For other embodiments, the thermostat 1800 can be mechanically configured such that only the outer ring 1812 travels inwardly for the inward click input, while the cover 1814 and metallic portion 1824 remain motionless. It is to be appreciated that a variety of different selections and combinations of the particular mechanical elements that will travel inwardly to achieve the "inward click" input are within the scope of the present teachings, whether it be the outer ring 1812 itself, some part of the cover 1814, or some combination thereof. However, it has been found particularly advantageous to provide the user with an ability to quickly go back and forth between registering "ring rotations" and "inward clicks" with a single hand and with minimal amount of time and effort involved, and so the ability to provide an inward click directly by pressing the outer ring 1812 has been found particularly advantageous, since the user's fingers do not need to be lifted out of contact with the device, or slid along its surface, in order to go between ring rotations and inward clicks. Moreover, by virtue of the strategic placement of the electronic display 1816 centrally inside the rotatable ring 1812, a further advantage is provided in that the user can naturally focus their attention on the electronic display throughout the input process, right in the middle of where their hand is performing its functions. The combination of intuitive outer ring rotation, especially as applied to (but not limited to) the changing of a thermostat's setpoint temperature, conveniently folded together with the satisfying physical sensation of inward clicking, together with accommodating natural focus on the electronic display in the central midst of their fingers' activity, adds significantly to an intuitive, seamless, and downright fun user experience. Further descriptions of advantageous mechanical user-interfaces and related designs, which are employed according to some embodiments, can be found in U.S. Ser. No. 13/033,573, supra, U.S. Ser. No. 29/386,021, supra, and U.S. Ser. No. 13/199,108, supra.

Figure 18C:
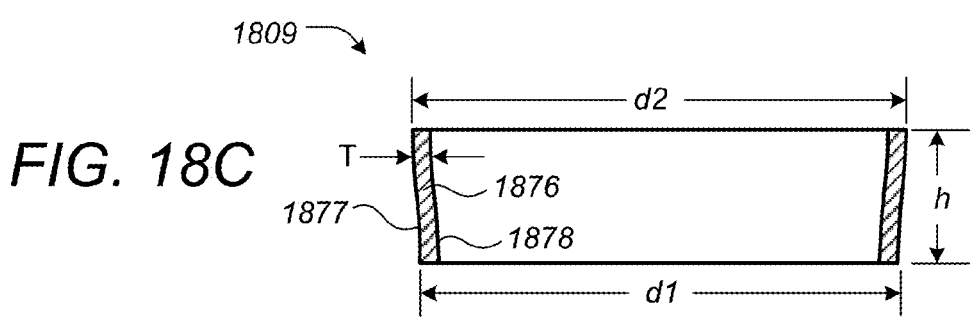
FIG. 18C illustrates a cross-sectional view of a shell portion of a frame of the thermostat of FIGS. 18A-B.

FIG. 18C illustrates a cross-sectional view of a shell portion 1809 of a frame of the thermostat of FIGS. 18A-B, which has been found to provide a particularly pleasing and adaptable visual appearance of the overall thermostat 1800 when viewed against a variety of different wall colors and wall textures in a variety of different home environments and home settings. While the thermostat itself will functionally adapt to the user's schedule as described herein and in one or more of the commonly assigned incorporated applications, supra, the outer shell portion 1809 is specially configured to convey a "chameleon" quality or characteristic such that the overall device appears to naturally blend in, in a visual and decorative sense, with many of the most common wall colors and wall textures found in home and business environments, at least in part because it will appear to assume the surrounding colors and even textures when viewed from many different angles. The shell portion 1809 has the shape of a frustum that is gently curved when viewed in cross-section, and comprises a sidewall 1876 that is made of a clear solid material, such as polycarbonate plastic. The sidewall 1876 is back-painted with a substantially flat silver- or nickel-colored paint, the paint being applied to an inside surface 1878 of the sidewall 1876 but not to an outside surface 1877 thereof. The outside surface 1877 is smooth and glossy but is not painted. The sidewall 1876 can have a thickness T of about 1.5 mm, a diameter d1 of about 78.8 mm at a first end that is nearer to the wall when mounted, and a diameter d2 of about 81.2 mm at a second end that is farther from the wall when mounted, the diameter change taking place across an outward width dimension "h" of about 22.5 mm, the diameter change taking place in either a linear fashion or, more preferably, a slightly non-linear fashion with increasing outward distance to form a slightly curved shape when viewed in profile, as shown in FIG. 18C. The outer ring 1812 of outer cap 1808 is preferably constructed to match the diameter d2 where disposed near the second end of the shell portion 1809 across a modestly sized gap g1 therefrom, and then to gently arc back inwardly to meet the cover 1814 across a small gap g2. It is to be appreciated, of course, that FIG. 18C only illustrates the outer shell portion 1809 of the thermostat 1800, and that there are many electronic components internal thereto that are omitted from FIG. 18C for clarity of presentation, such electronic components being described further hereinbelow and/or in other ones of the commonly assigned incorporated applications, such as U.S. Ser. No. 13/199,108, supra.

According to some embodiments, the thermostat 1800 includes a processing system 1860, display driver 1864 and a wireless communications system 1866. The processing system 1860 is adapted to cause the display driver 1864 and display area 1816 to display information to the user, and to receiver user input via the rotatable ring 1812. The processing system 1860, according to some embodiments, is capable of carrying out the governance of the operation of thermostat 1800 including the user interface features described herein. The processing system 1860 is further programmed and configured to carry out other operations as described further hereinbelow and/or in other ones of the commonly assigned incorporated applications. For example, processing system 1860 is further programmed and configured to maintain and update a thermodynamic model for the enclosure in which the HVAC system is installed, such as described in U.S. Ser. No. 12/881,463, supra. According to some embodiments, the wireless communications system 1866 is used to communicate with devices such as personal computers and/or other thermostats or HVAC system components, which can be peer-to-peer communications, communications through one or more servers located on a private network, or and/or communications through a cloud-based service.

Figure 19A:
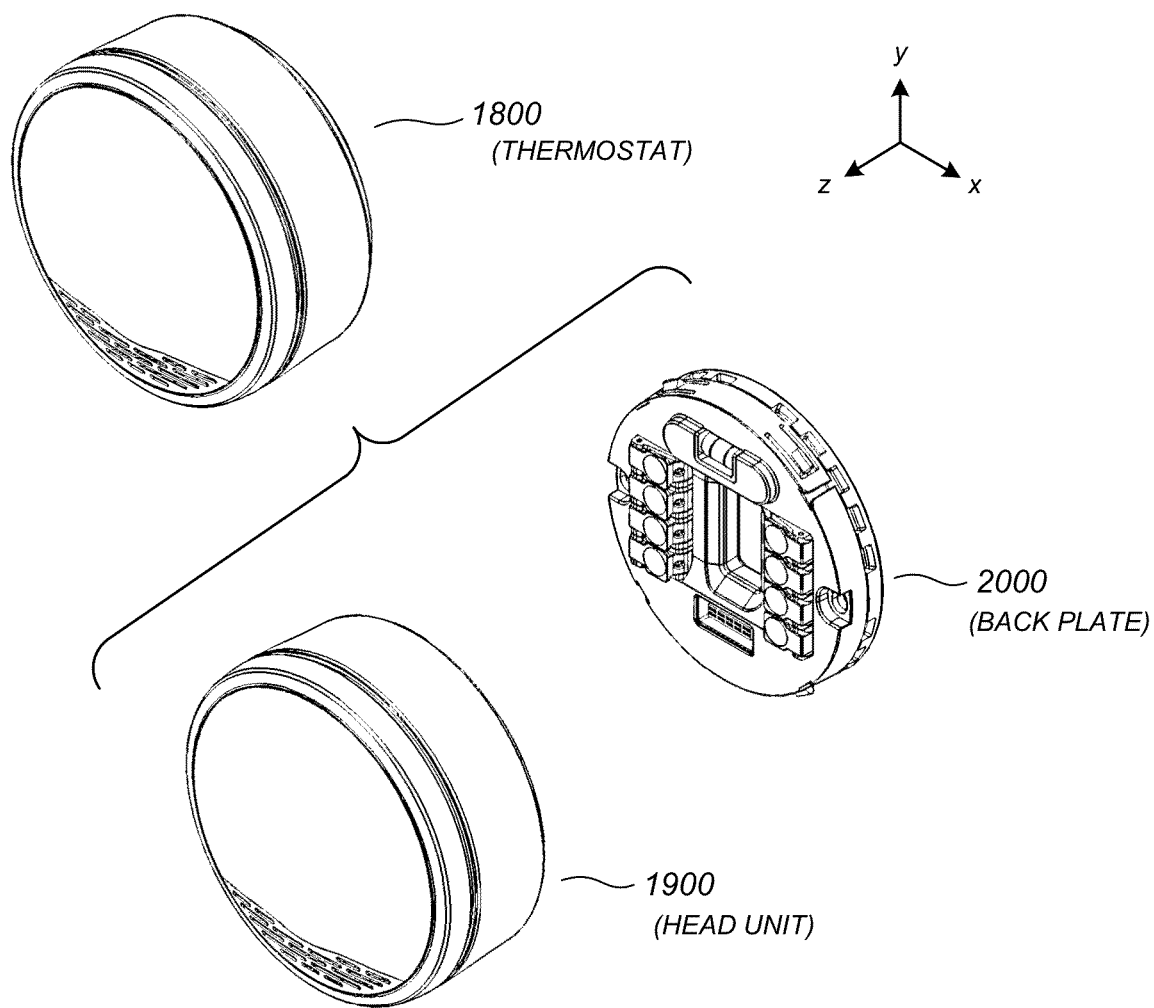
FIGS. 19A-19B illustrate exploded front and rear perspective views, respectively, of a thermostat with respect to its two main components, which are the head unit and the back plate.
Figure 19B:
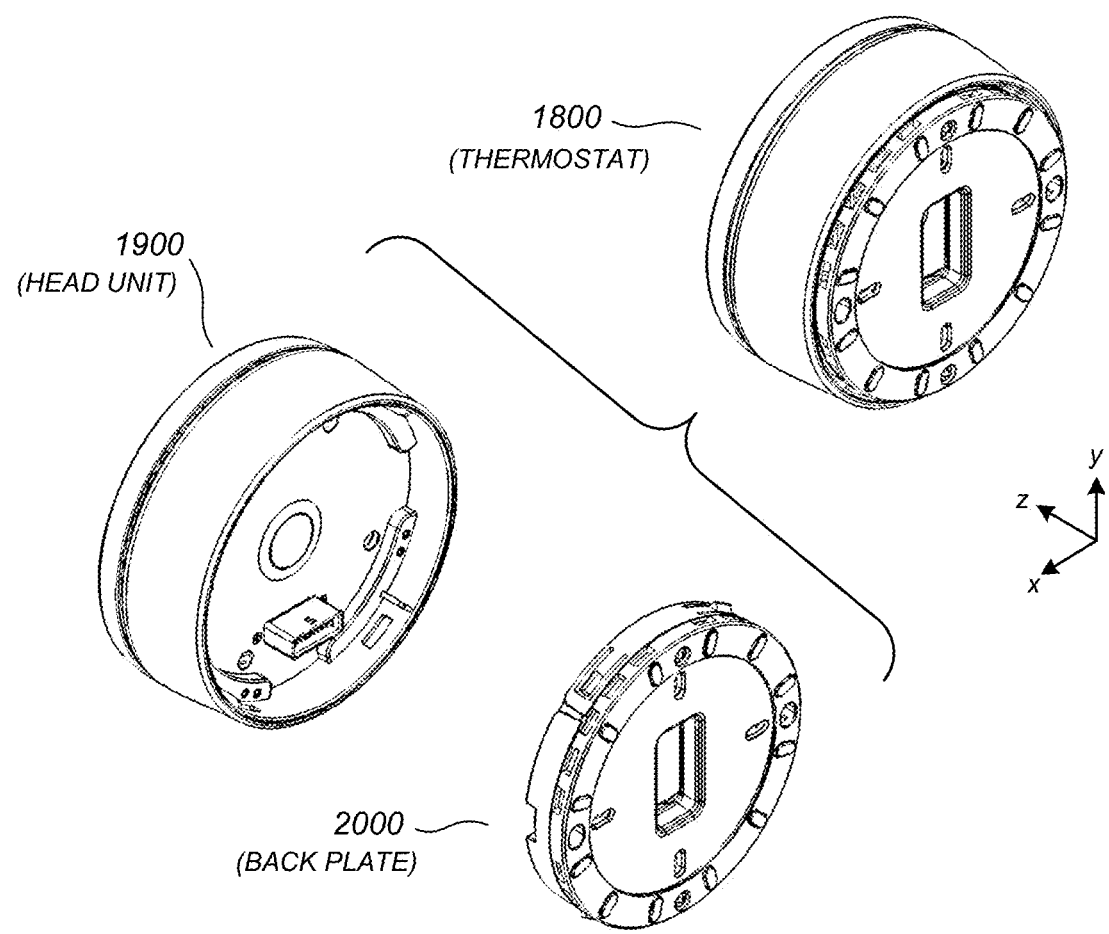

FIGS. 19A-19B illustrate exploded front and rear perspective views, respectively, of the thermostat 1800 with respect to its two main components, which are the head unit 1900 and the back plate 2000. Further technical and/or functional descriptions of various ones of the electrical and mechanical components illustrated hereinbelow can be found in one or more of the commonly assigned incorporated applications, such as U.S. Ser. No. 13/199,108, supra. In the drawings shown, the "z" direction is outward from the wall, the "y" direction is the head-to-toe direction relative to a walk-up user, and the "x" direction is the user's left-to-right direction.

Figure 20A:
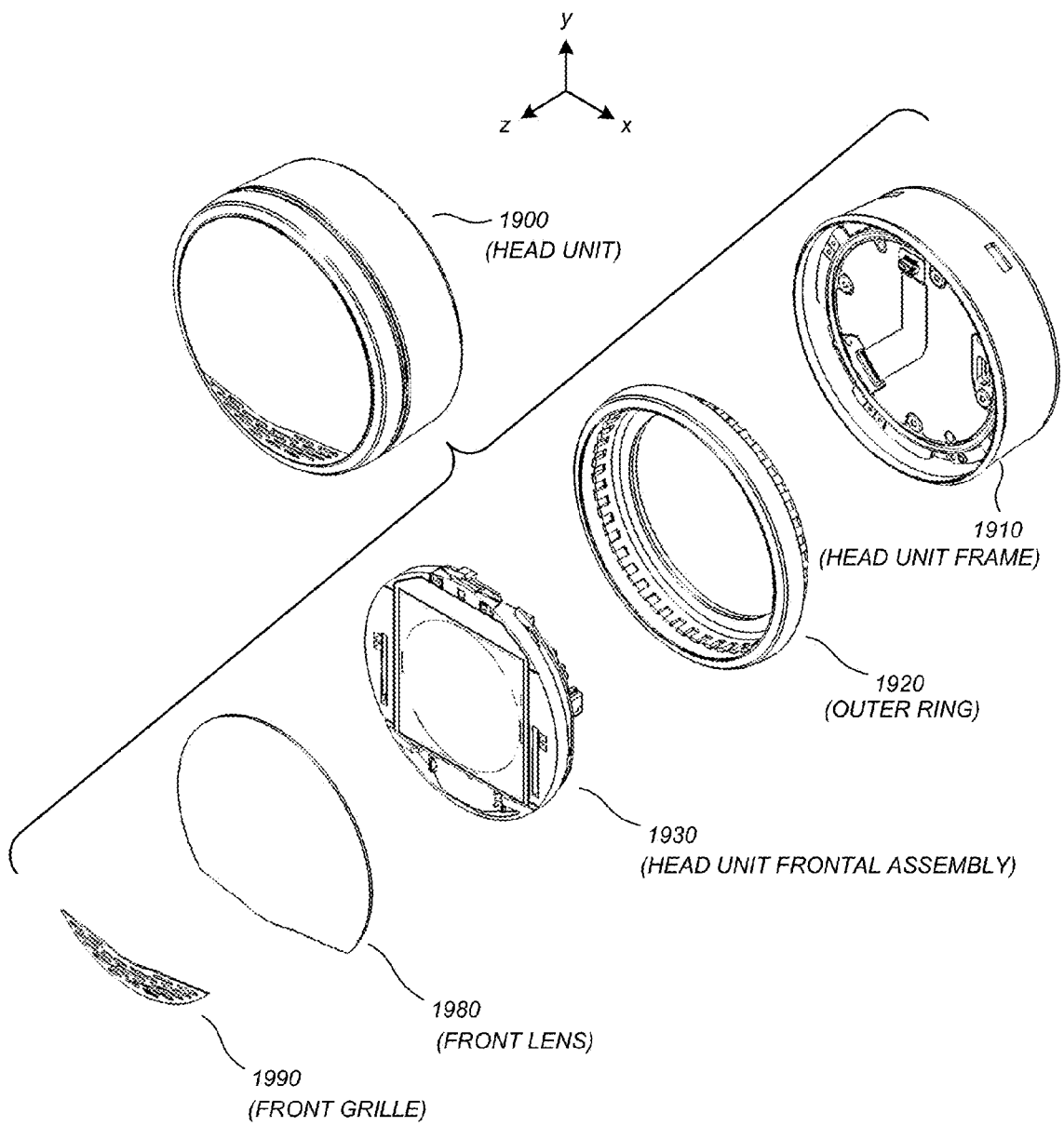
FIGS. 20A-20B illustrate exploded front and rear perspective views, respectively, of the head unit with respect to its primary components.
Figure 20B:
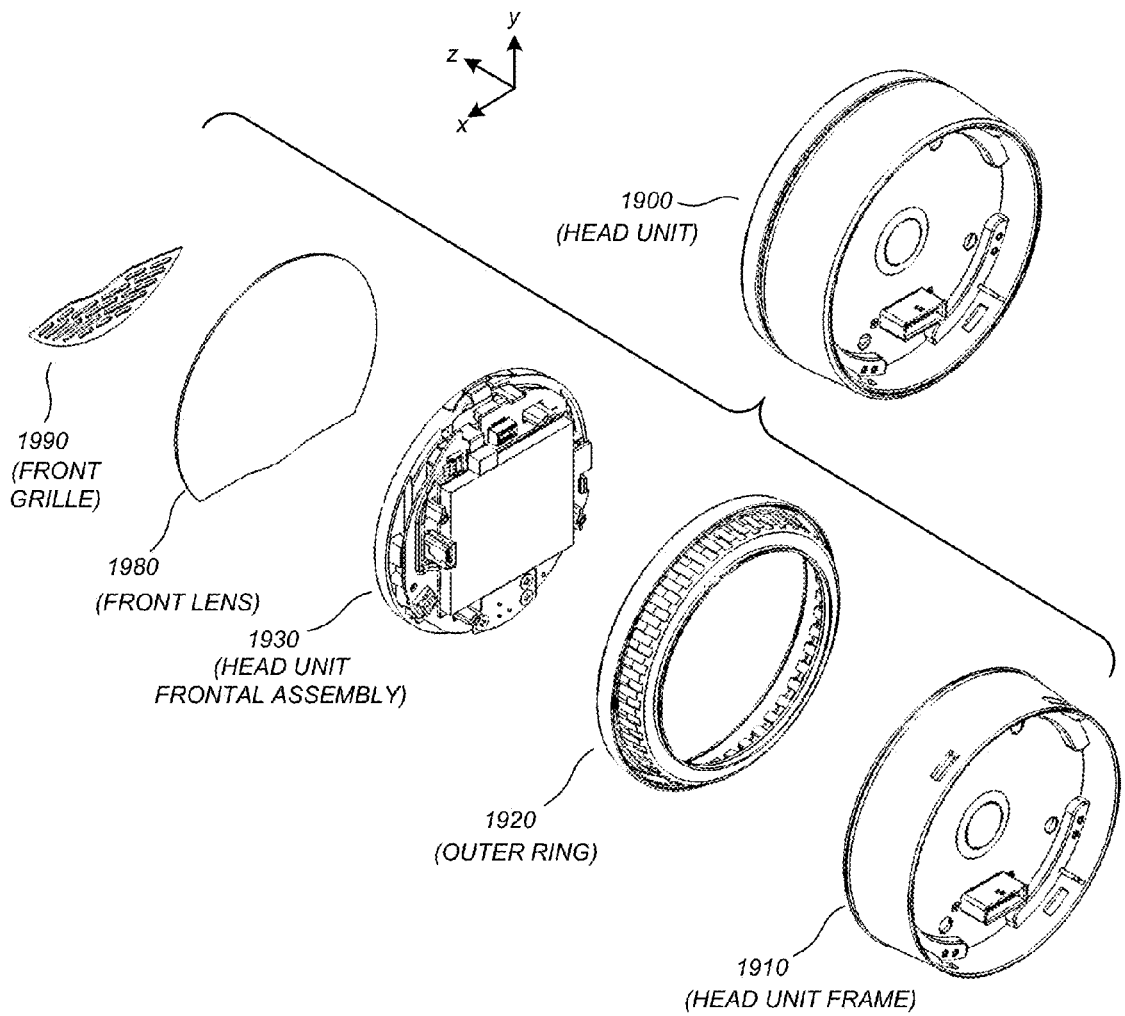

FIGS. 20A-20B illustrate exploded front and rear perspective views, respectively, of the head unit 1900 with respect to its primary components. Head unit 1900 includes a head unit frame 1910, the outer ring 1920 (which is manipulated for ring rotations), a head unit frontal assembly 1930, a front lens 1980, and a front grille 1990. Electrical components on the head unit frontal assembly 1930 can connect to electrical components on the backplate 2000 by virtue of ribbon cables and/or other plug type electrical connectors.

Figure 21A:
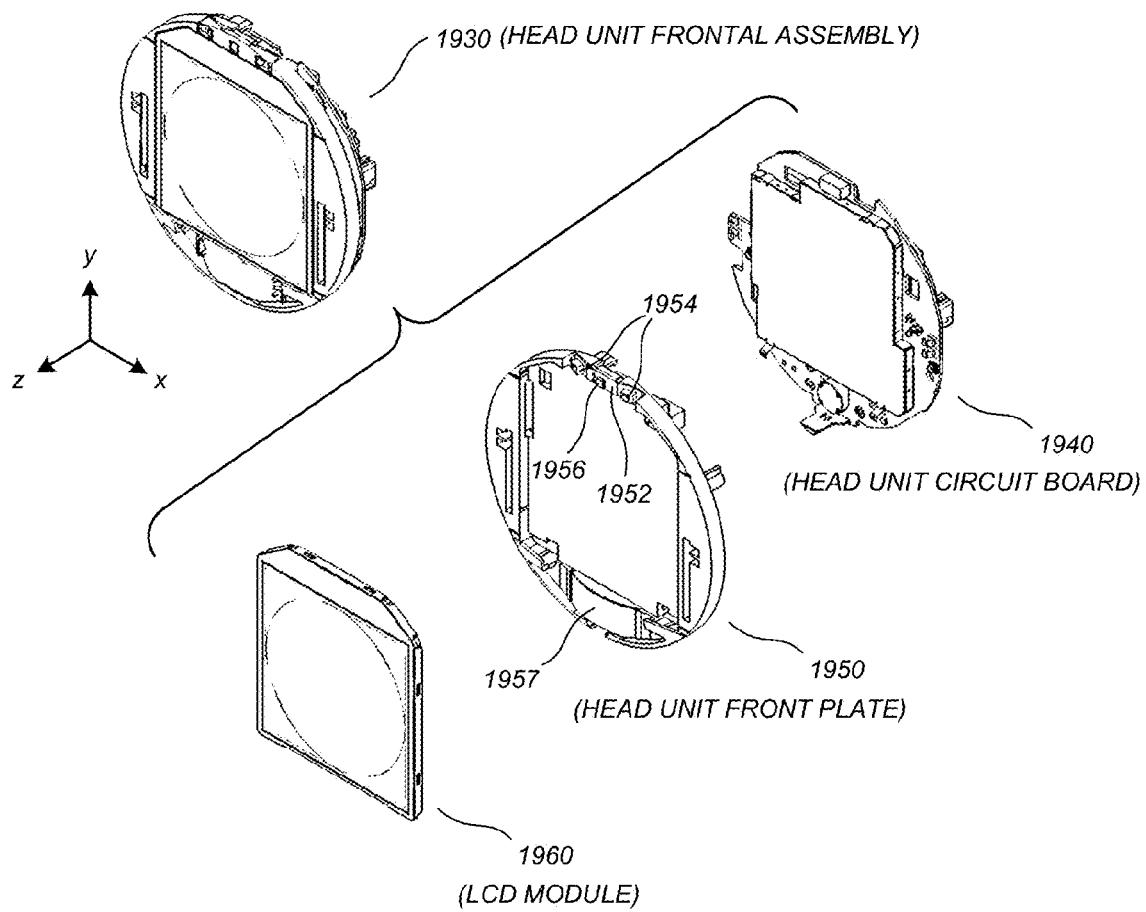
FIGS. 21A-21B illustrate exploded front and rear perspective views, respectively, of the head unit frontal assembly with respect to its primary components.
Figure 21B:
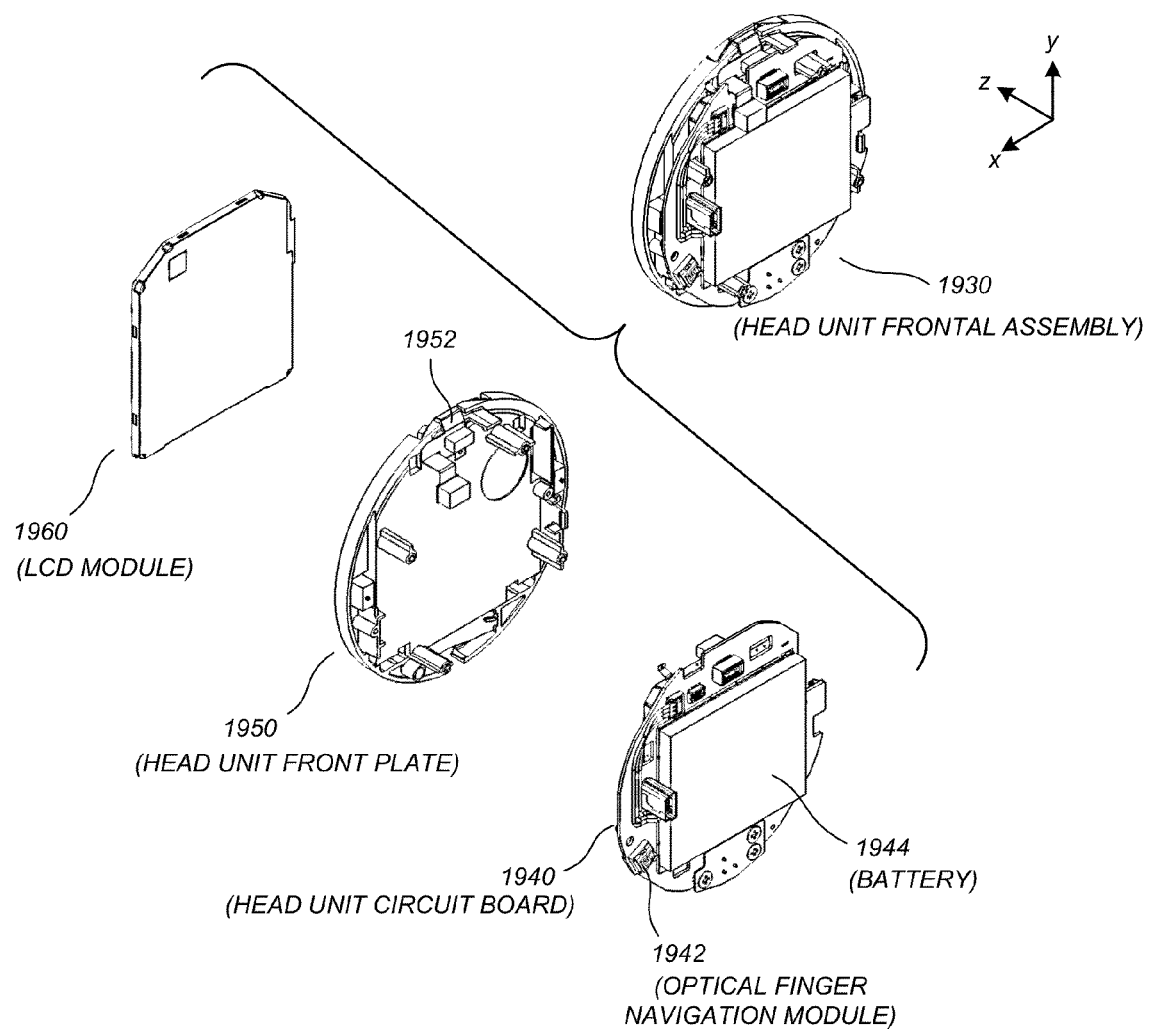

FIGS. 21A-21B illustrate exploded front and rear perspective views, respectively, of the head unit frontal assembly 1930 with respect to its primary components. Head unit frontal assembly 1930 comprises a head unit circuit board 1940, a head unit front plate 1950, and an LCD module 1960. The components of the front side of head unit circuit board 1940 are hidden behind an RF shield in FIG. 21A but are discussed in more detail below with respect to FIG. 24. On the back of the head unit circuit board 1940 is a rechargeable Lithium-Ion battery 1944, which for one preferred embodiment has a nominal voltage of 3.7 volts and a nominal capacity of 560 mAh. To extend battery life, however, the battery 1944 is normally not charged beyond 450 mAh by the thermostat battery charging circuitry. Moreover, although the battery 1944 is rated to be capable of being charged to 4.2 volts, the thermostat battery charging circuitry normally does not charge it beyond 3.95 volts. Also visible in FIG. 21B is an optical finger navigation module 1942 that is configured and positioned to sense rotation of the outer ring 1920. The module 1942 uses methods analogous to the operation of optical computer mice to sense the movement of a texturable surface on a facing periphery of the outer ring 1920. Notably, the module 1942 is one of the very few sensors that is controlled by the relatively power-intensive head unit microprocessor rather than the relatively low-power backplate microprocessor. This is achievable without excessive power drain implications because the head unit microprocessor will invariably be awake already when the user is manually turning the dial, so there is no excessive wake-up power drain anyway. Advantageously, very fast response can also be provided by the head unit microprocessor. Also visible in FIG. 21A is a Fresnel lens 1957 that operates in conjunction with a PIR motion sensor disposes thereunderneath.

Figure 22A:
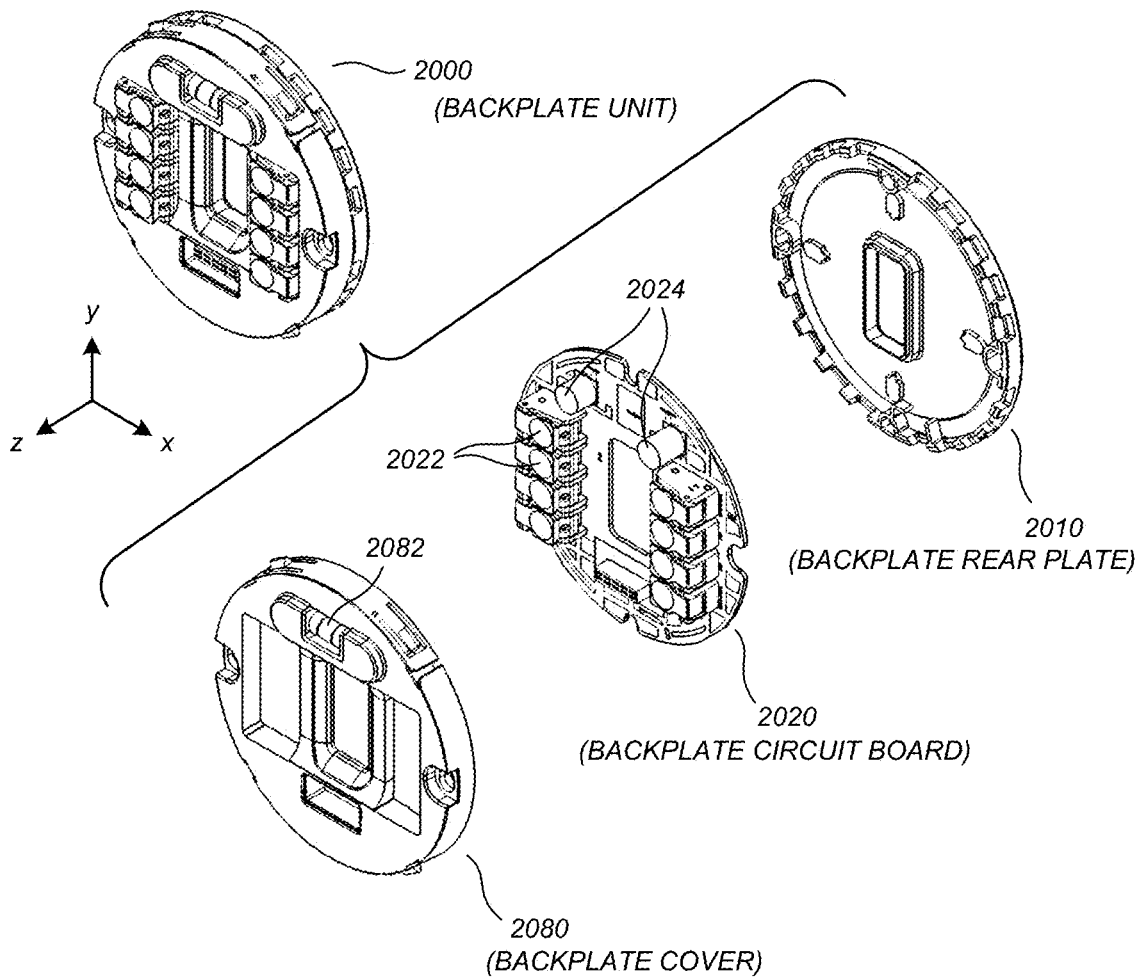
FIGS. 22A-22B illustrate exploded front and rear perspective views, respectively, of the backplate unit with respect to its primary components.
Figure 22B:
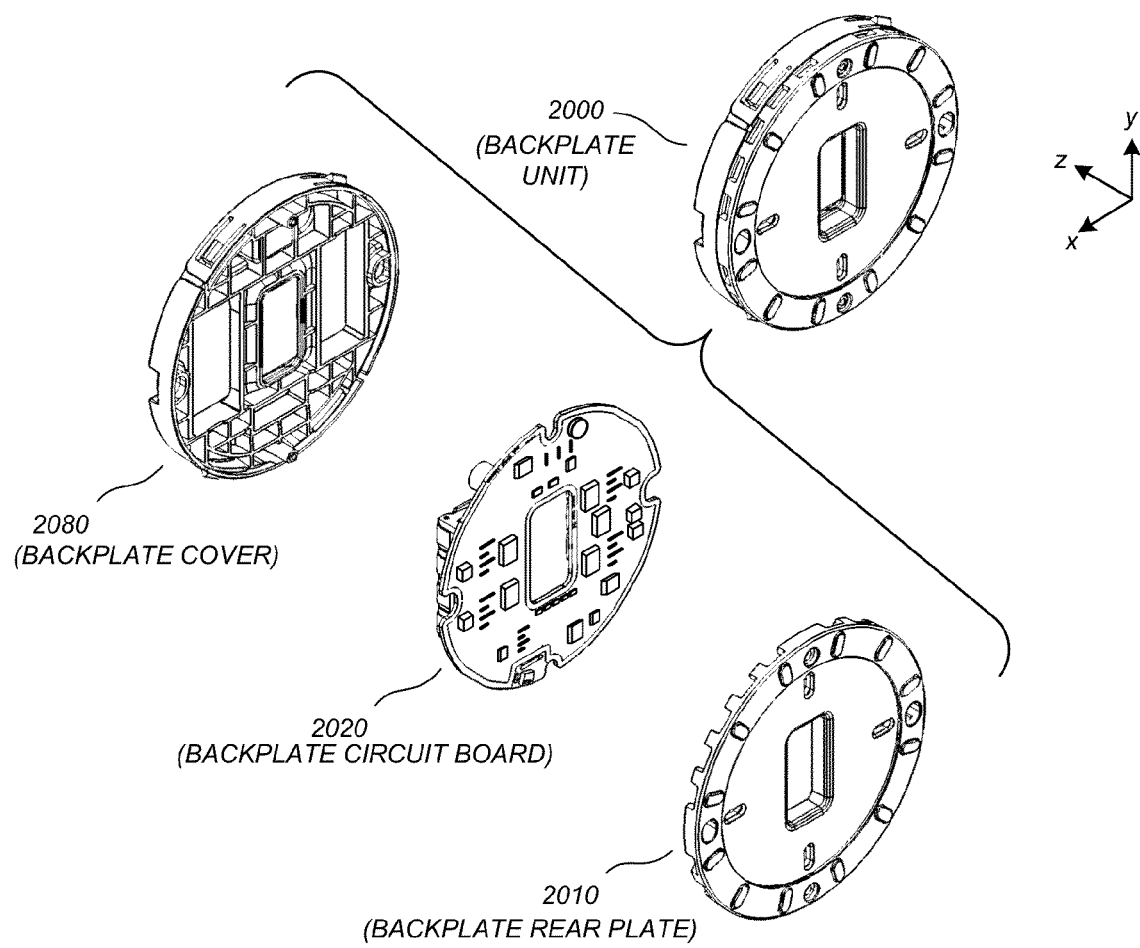

FIGS. 22A-22B illustrate exploded front and rear perspective views, respectively, of the backplate unit 2000 with respect to its primary components. Backplate unit 2000 comprises a backplate rear plate 2010, a backplate circuit board 2020, and a backplate cover 2080. Visible in FIG. 22A are the HVAC wire connectors 2022 that include integrated wire insertion sensing circuitry, and two relatively large capacitors 2024 that are used by part of the power stealing circuitry that is mounted on the back side of the backplate circuit board 2020 and discussed further below with respect to FIG. 25.

Figure 23:
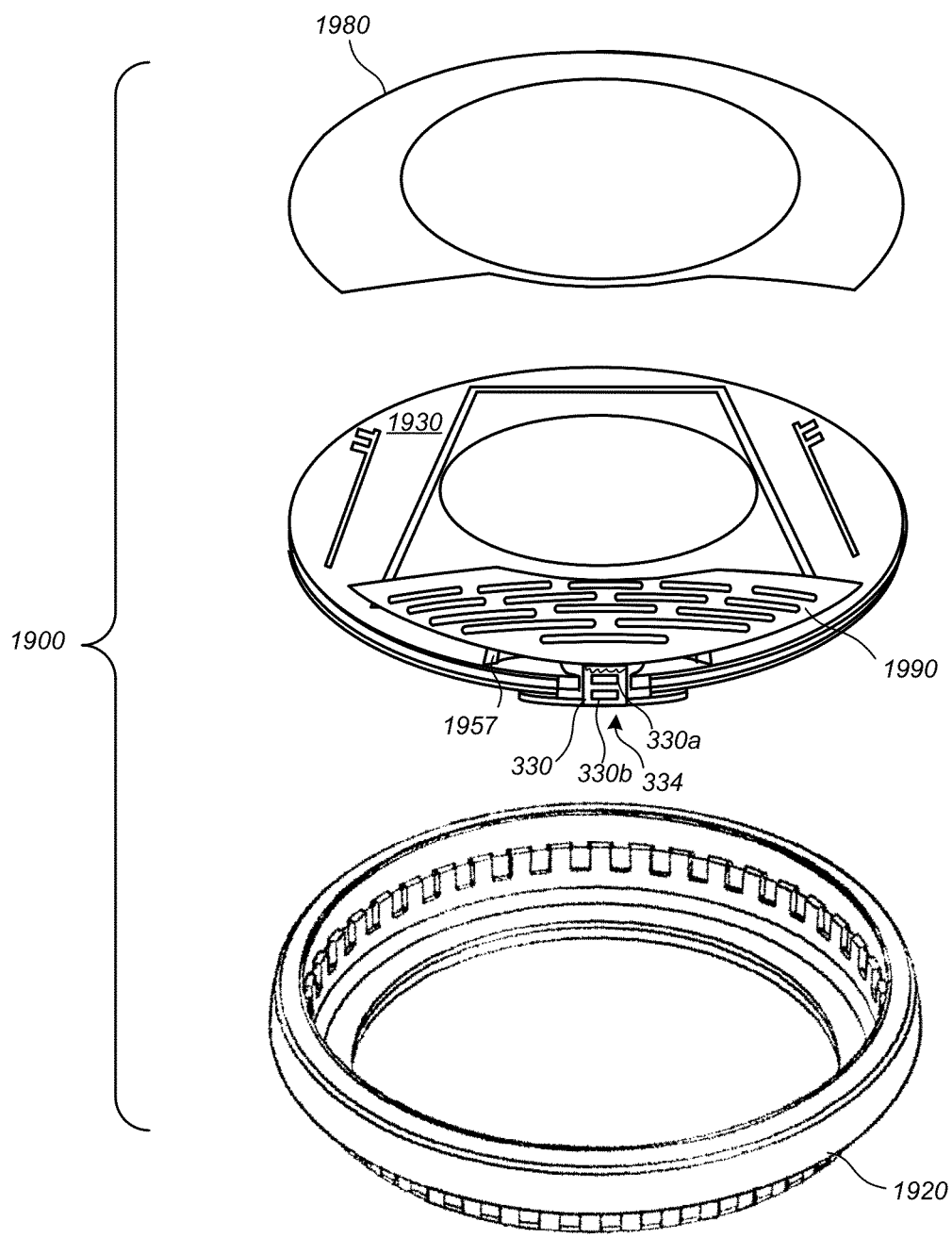
FIG. 23 illustrates a perspective view of a partially assembled head unit front, according to some embodiments.

FIG. 23 illustrates a perspective view of a partially assembled head unit front 1900 showing the positioning of grille member 1990 designed in accordance with aspects of the present invention with respect to several sensors used by the thermostat. In some implementations, as described further in U.S. Ser. No. 13/199,108, supra, placement of grille member 1990 over the Fresnel lens 1957 and an associated PIR motion sensor 334 conceals and protects these PIR sensing elements, while horizontal slots in the grille member 1990 allow the PIR motion sensing hardware, despite being concealed, to detect the lateral motion of occupants in a room or area. A temperature sensor 330 uses a pair of thermal sensors to more accurately measure ambient temperature. A first or upper thermal sensor 330a associated with temperature sensor 330 tends to gather temperature data closer to the area outside or on the exterior of the thermostat while a second or lower thermal sensor 330b tends to collect temperature data more closely associated with the interior of the housing. In one implementation, each of the temperature sensors 330a and 330b comprises a Texas Instruments TMP112 digital temperature sensor chip, while the PIR motion sensor 334 comprises PerkinElmer DigiPyro PYD 1998 dual element pyrodetector.

To more accurately determine the ambient temperature, the temperature taken from the lower thermal sensor 330b is taken into consideration in view of the temperatures measured by the upper thermal sensor 330a and when determining the effective ambient temperature. This configuration can advantageously be used to compensate for the effects of internal heat produced in the thermostat by the microprocessor(s) and/or other electronic components therein, thereby obviating or minimizing temperature measurement errors that might otherwise be suffered. In some implementations, the accuracy of the ambient temperature measurement may be further enhanced by thermally coupling upper thermal sensor 330a of temperature sensor 330 to grille member 1990 as the upper thermal sensor 330a better reflects the ambient temperature than lower thermal sensor 334b. Details on using a pair of thermal sensors to determine an effective ambient temperature is disclosed in U.S. Pat. No. 4,741,476, which is incorporated by reference herein.

Figure 24:
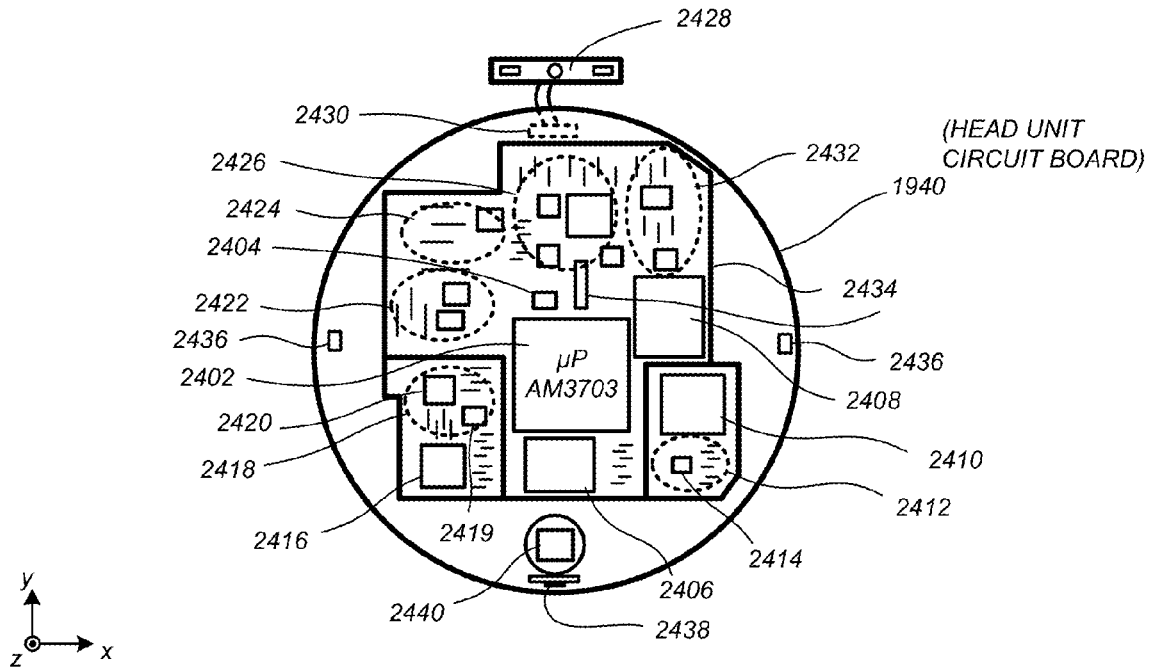
FIG. 24 illustrates a head-on view of the head unit circuit board, according to one embodiment.

FIG. 24 illustrates a head-on view of the head unit circuit board 1940, which comprises a head unit microprocessor 2402 (such as a Texas Instruments AM3703 chip) and an associated oscillator 2404, along with DDR SDRAM memory 2406, and mass NAND storage 2408. For Wi-Fi capability, there is provided in a separate compartment of RF shielding 2434 a Wi-Fi module 2410, such as a Murata Wireless Solutions LBWA19XSLZ module, which is based on the Texas Instruments WL1270 chipset supporting the 802.11 b/g/n WLAN standard. For the Wi-Fi module 2410 is supporting circuitry 2412 including an oscillator 2414. For ZigBee capability, there is provided also in a separately shielded RF compartment a ZigBee module 2416, which can be, for example, a C2530F256 module from Texas Instruments. For the ZigBee module 2416 there is provided supporting circuitry 2418 including an oscillator 2419 and a low-noise amplifier 2420. Also provided is display backlight voltage conversion circuitry 2422, piezoelectric driving circuitry 2424, and power management circuitry 2426 (local power rails, etc.). Provided on a flex circuit 2428 that attaches to the back of the head unit circuit board by a flex circuit connector 2430 is a proximity and ambient light sensor (PROX/ALS), more particularly a Silicon Labs SI1142 Proximity/Ambient Light Sensor with an I2C Interface. Also provided is battery charging-supervision-disconnect circuitry 2432, and spring/RF antennas 2436. Also provided is a temperature sensor 2438 (rising perpendicular to the circuit board in the +z direction containing two separate temperature sensing elements at different distances from the circuit board), and a PIR motion sensor 2440. Notably, even though the PROX/ALS and temperature sensors 2438 and PIR motion sensor 2440 are physically located on the head unit circuit board 1940, all these sensors are polled and controlled by the low-power backplate microcontroller on the backplate circuit board, to which they are electrically connected.

Figure 25:
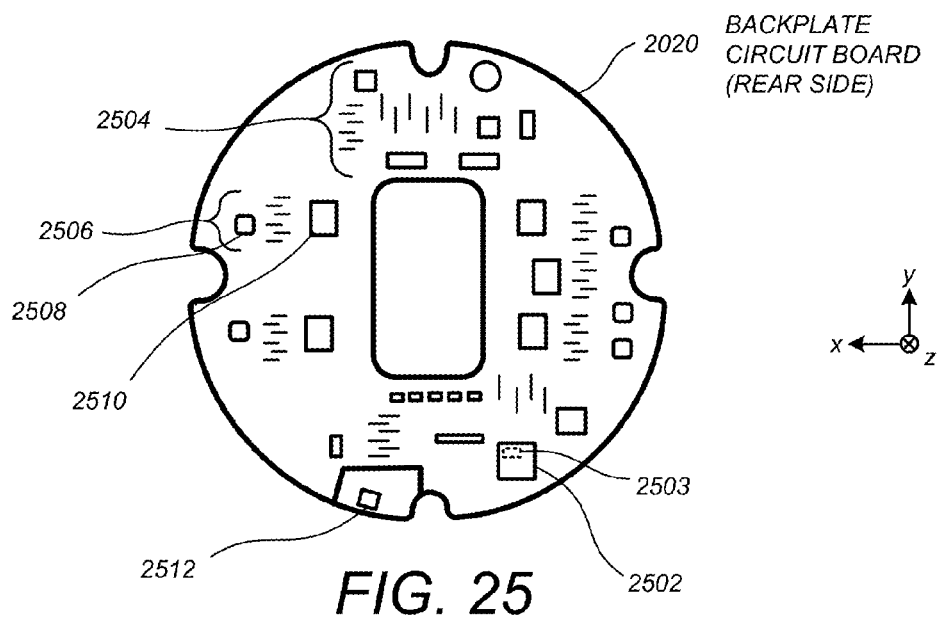
FIG. 25 illustrates a rear view of the backplate circuit board, according to one embodiment.

FIG. 25 illustrates a rear view of the backplate circuit board 2020, comprising a backplate processor/microcontroller 2502, such as a Texas Instruments MSP430F System-on-Chip Microcontroller that includes an on-board memory 2503. The backplate circuit board 2020 further comprises power supply circuitry 2504, which includes power-stealing circuitry, and switch circuitry 2506 for each HVAC respective HVAC function. For each such function the switch circuitry 2506 includes an isolation transformer 2508 and a back-to-back NFET package 2510. The use of FETs in the switching circuitry allows for "active power stealing", i.e., taking power during the HVAC "ON" cycle, by briefly diverting power from the HVAC relay circuit to the reservoir capacitors for a very small interval, such as 100 micro-seconds. This time is small enough not to trip the HVAC relay into the "off" state but is sufficient to charge up the reservoir capacitors. The use of FETs allows for this fast switching time (100 micro-seconds), which would be difficult to achieve using relays (which stay on for tens of milliseconds). Also, such relays would readily degrade doing this kind of fast switching, and they would also make audible noise too. In contrast, the FETS operate with essentially no audible noise. Also provided is a combined temperature/humidity sensor module 2512, such as a Sensirion SHT21 module. The backplate microcontroller 2502 performs polling of the various sensors, sensing for mechanical wire insertion at installation, alerting the head unit regarding current vs. setpoint temperature conditions and actuating the switches accordingly, and other functions such as looking for appropriate signal on the inserted wire at installation.

In accordance with the teachings of the commonly assigned U.S. Ser. No. 13/269,501, supra, the commonly assigned U.S. Ser. No. 13/275,307, supra, and others of the commonly assigned incorporated applications, the thermostat 1800 represents an advanced, multi-sensing, microprocessor-controlled intelligent or "learning" thermostat that provides a rich combination of processing capabilities, intuitive and visually pleasing user interfaces, network connectivity, and energy-saving capabilities (including the presently described auto-away/auto-arrival algorithms) while at the same time not requiring a so-called "C-wire" from the HVAC system or line power from a household wall plug, even though such advanced functionalities can require a greater instantaneous power draw than a "power-stealing" option (i.e., extracting smaller amounts of electrical power from one or more HVAC call relays) can safely provide. By way of example, the head unit microprocessor 2402 can draw on the order of 250 mW when awake and processing, the LCD module 1960 can draw on the order of 250 mW when active. Moreover, the Wi-Fi module 2410 can draw 250 mW when active, and needs to be active on a consistent basis such as at a consistent 2% duty cycle in common scenarios. However, in order to avoid falsely tripping the HVAC relays for a large number of commercially used HVAC systems, power-stealing circuitry is often limited to power providing capacities on the order of 100 mW-200 mW, which would not be enough to supply the needed power for many common scenarios.

The thermostat 1800 resolves such issues at least by virtue of the use of the rechargeable battery 1944 (or equivalently capable onboard power storage medium) that will recharge during time intervals in which the hardware power usage is less than what power stealing can safely provide, and that will discharge to provide the needed extra electrical power during time intervals in which the hardware power usage is greater than what power stealing can safely provide. In order to operate in a battery-conscious manner that promotes reduced power usage and extended service life of the rechargeable battery, the thermostat 1800 is provided with both (i) a relatively powerful and relatively power-intensive first processor (such as a Texas Instruments AM3703 microprocessor) that is capable of quickly performing more complex functions such as driving a visually pleasing user interface display and performing various mathematical learning computations, and (ii) a relatively less powerful and less power-intensive second processor (such as a Texas Instruments MSP430 microcontroller) for performing less intensive tasks, including driving and controlling the occupancy sensors. To conserve valuable power, the first processor is maintained in a "sleep" state for extended periods of time and is "woken up" only for occasions in which its capabilities are needed, whereas the second processor is kept on more or less continuously (although preferably slowing down or disabling certain internal clocks for brief periodic intervals to conserve power) to perform its relatively low-power tasks. The first and second processors are mutually configured such that the second processor can "wake" the first processor on the occurrence of certain events, which can be termed "wake-on" facilities. These wake-on facilities can be turned on and turned off as part of different functional and/or power-saving goals to be achieved. For example, a "wake-on-PROX" facility can be provided by which the second processor, when detecting a user's hand approaching the thermostat dial by virtue of an active proximity sensor (PROX, such as provided by a Silicon Labs SI1142 Proximity/Ambient Light Sensor with I2C Interface), will "wake up" the first processor so that it can provide a visual display to the approaching user and be ready to respond more rapidly when their hand touches the dial. As another example, a "wake-on-PIR" facility can be provided by which the second processor will wake up the first processor when detecting motion somewhere in the general vicinity of the thermostat by virtue of a passive infrared motion sensor (PIR, such as provided by a PerkinElmer DigiPyro PYD 1998 dual element pyrodetector). Notably, wake-on-PIR is not synonymous with auto-arrival, as there would need to be N consecutive buckets of sensed PIR activity to invoke auto-arrival, whereas only a single sufficient motion event can trigger a wake-on-PIR wake-up.

Figure 26:
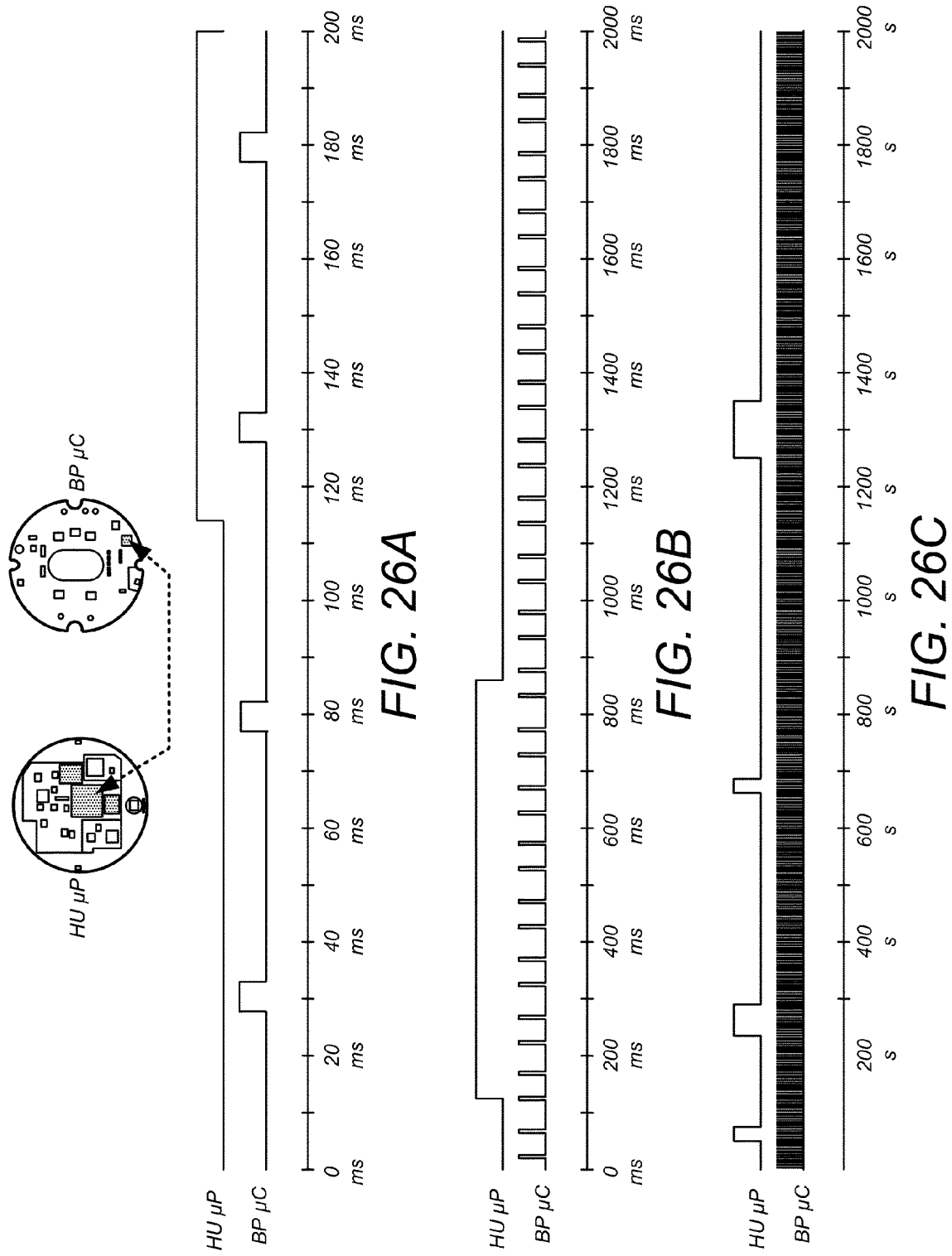
FIGS. 26A-26C illustrate conceptual examples of the sleep-wake timing dynamic, at progressively larger time scales; according to one embodiment.

FIGS. 26A-26C illustrate conceptual examples of the sleep-wake timing dynamic, at progressively larger time scales, that can be achieved between the head unit (HU) microprocessor and the backplate (BP) microcontroller that advantageously provides a good balance between performance, responsiveness, intelligence, and power usage. The higher plot value for each represents a "wake" state (or an equivalent higher power state) and the lower plot value for each represents a "sleep" state (or an equivalent lower power state). As illustrated, the backplate microcontroller is active much more often for polling the sensors and similar relatively low-power tasks, whereas the head unit microprocessor stays asleep much more often, being woken up for "important" occasions such as user interfacing, network communication, and learning algorithm computation, and so forth. A variety of different strategies for optimizing sleep versus wake scenarios can be achieved by the disclosed architecture and is within the scope of the present teachings. For example, the commonly assigned U.S. Ser. No. 13/275,307, supra, describes a strategy for conserving head unit microprocessor "wake" time while still maintaining effective and timely communications with a cloud-based thermostat management server via the thermostat's Wi-Fi facility.

Figure 27:
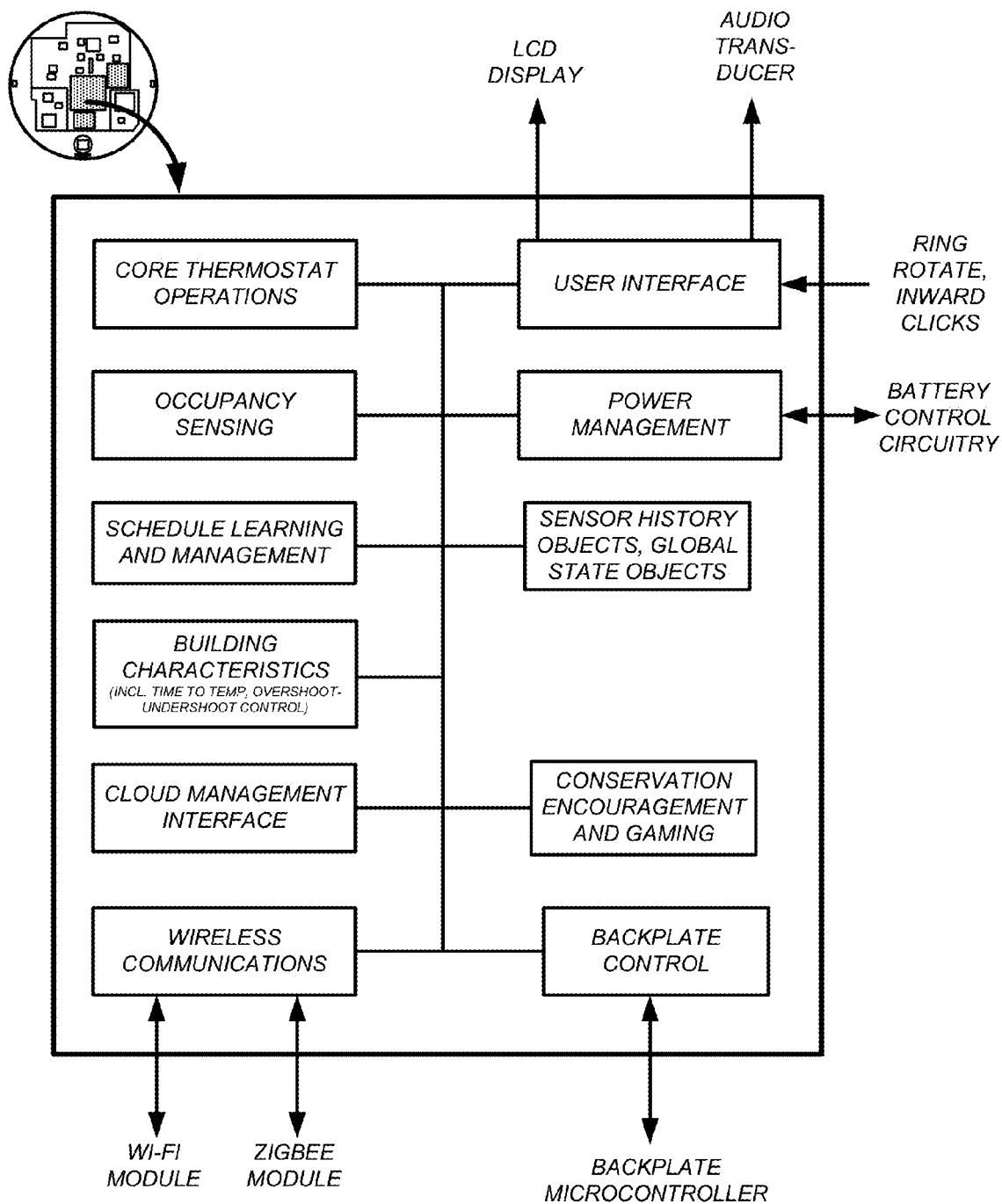
FIG. 27 illustrates a self-descriptive overview of the functional software, firmware, and/or programming architecture of the head unit microprocessor, according to one embodiment.
Figure 28:
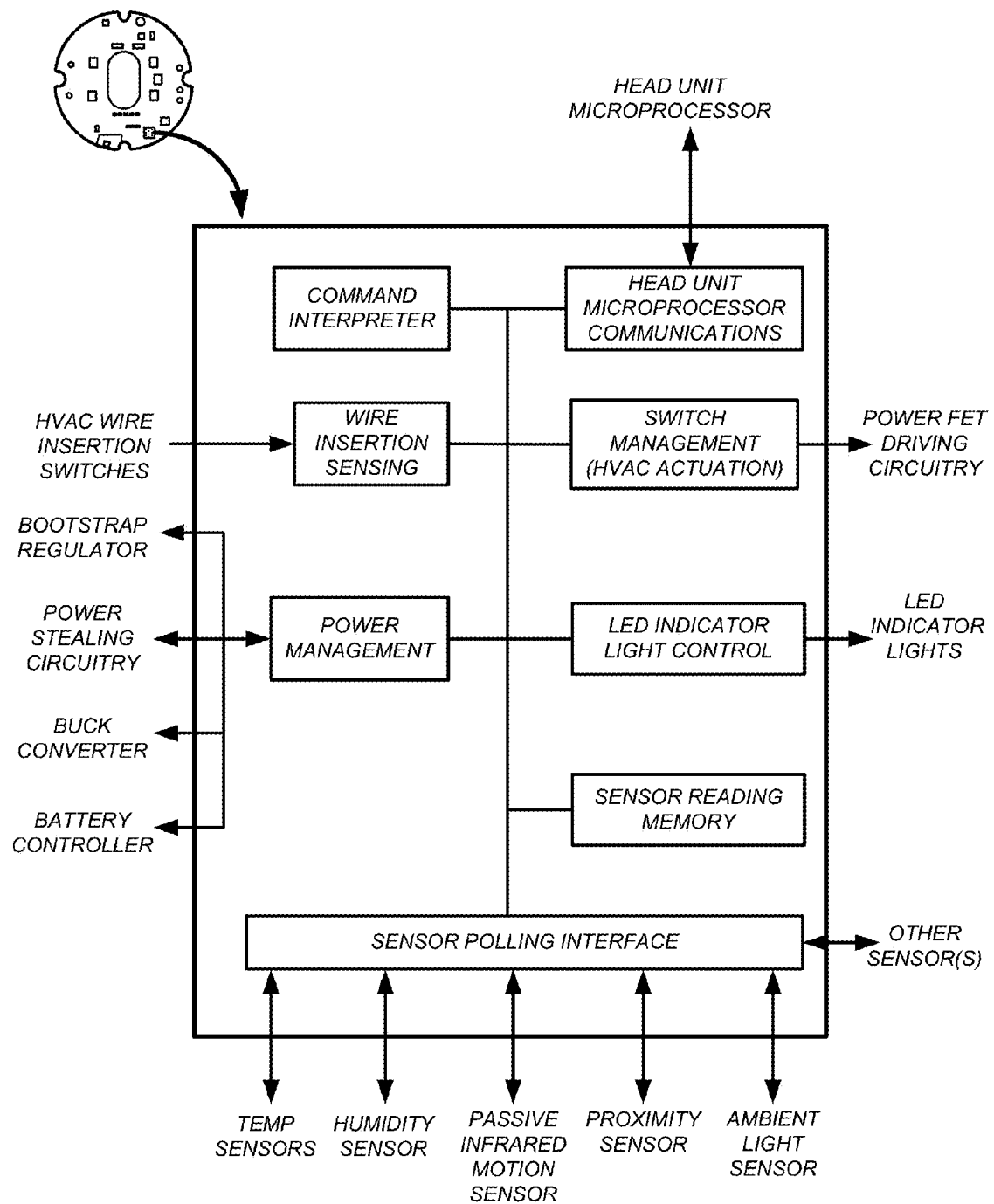
FIG. 28 illustrates a self-descriptive overview of the functional software, firmware, and/or programming architecture of the backplate microcontroller, according to one embodiment.

FIG. 27 illustrates a self-descriptive overview of the functional software, firmware, and/or programming architecture of the head unit microprocessor 2402 for achieving its described functionalities. FIG. 28 illustrates a self-descriptive overview of the functional software, firmware, and/or programming architecture of the backplate microcontroller 2502 for achieving its described functionalities.

Figure 29:
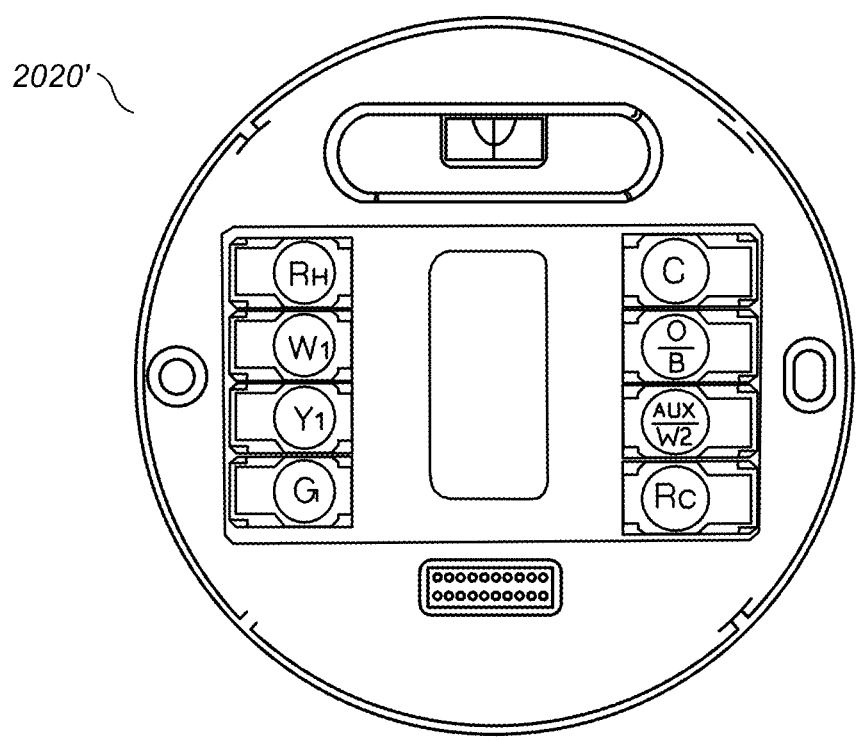
FIG. 29 illustrates a view of the wiring terminals as presented to the user when the backplate is exposed; according to one embodiment.

FIG. 29 illustrates a view of the wiring terminals as presented to the user when the backplate is exposed. As described in the commonly assigned U.S. Ser. No. 13/034,666, supra, each wiring terminal is configured such that the insertion of a wire thereinto is detected and made apparent to the backplate microcontroller and ultimately the head unit microprocessor. According to a preferred embodiment, if the insertion of a particular wire is detected, a further check is automatically carried out by the thermostat to ensure that signals appropriate to that particular wire are present. For one preferred embodiment, there is automatically measured a voltage waveform between that wiring node and a "local ground" of the thermostat. The measured waveform should have an RMS-type voltage metric that is above a predetermined threshold value, and if such predetermined value is not reached, then a wiring error condition is indicated to the user. The predetermined threshold value, which may vary from circuit design to circuit design depending on the particular selection of the local ground, can be empirically determined using data from a population of typical HVAC systems to statistically determine a suitable threshold value. For some embodiments, the "local ground" or "system ground" can be created from (i) the Rh line and/or Rc terminal, and (ii) whichever of the G, Y, or W terminals from which power stealing is being performed, these two lines going into a full-bridge rectifier (FWR) which has the local ground as one of its outputs.

Figure 30A:
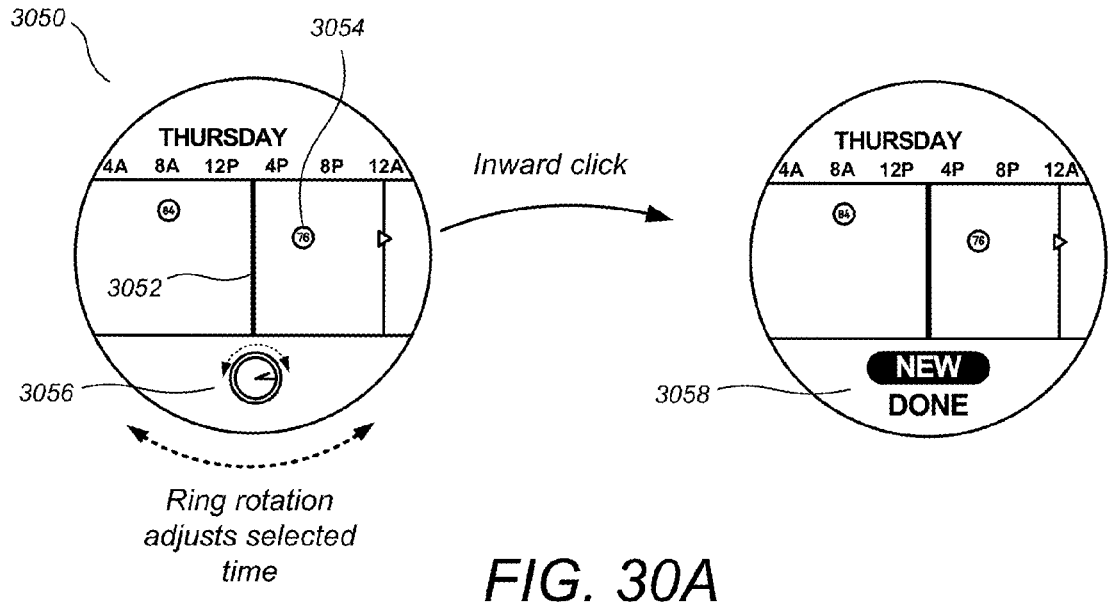
FIGS. 30A-30B illustrate restricting user establishment of a new scheduled setpoint that is within a predetermined time separation, according to one embodiment.
Figure 30B:
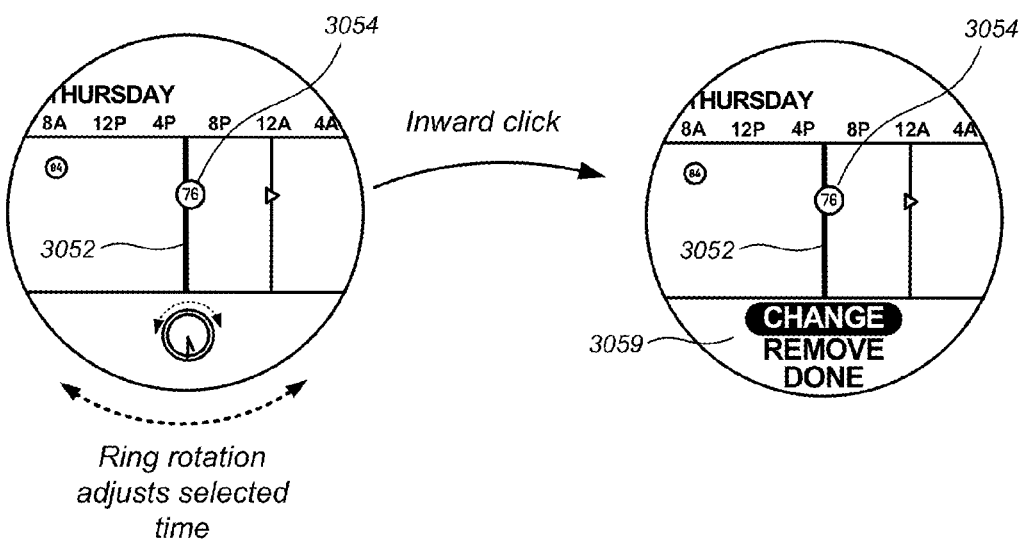

FIGS. 30A-30B illustrate restricting user establishment of a new scheduled setpoint that is within a predetermined time separation (such as one hour) from a pre-existing scheduled setpoint, in a subtle manner that does not detract from the friendliness of the user interface. The ability to prevent new user-entered scheduled setpoints that take effect within one hour of pre-existing setpoints can be advantageous in keeping the overall schedule relatively "clean" from an overpopulation of setpoints, which in turn can make the schedule more amenable to comfort-preserving yet energy-conserving automated learning algorithms. In particular, the scheduling user interface of thermostat 1800 operates to bar the user from entering a new scheduled setpoint within one hour of a pre-existing setpoint, but achieves this objective in a way such that the user does not feel like they are being explicitly "forced" to place setpoints where they do not want to place them, nor are they being explicitly "punished" for trying to place a setpoint where one is not allowed. Even though this feature may only be subtly apparent to the user, and even though it may take several second looks to perceive what the thermostat user interface is actually doing to achieve this subtle objective, this feature contributes to the feeling of friendliness, the feeling of being free from intimidation, on the part of the user and therefore increases the likelihood that the user will want to "engage" with the thermostat and to "be a part of" its energy saving ecosystem. In FIG. 30A, the user is engaging with a scheduling screen 3050 of the thermostat 1800 in a manner that is further described in U.S. Ser. No. 13/269,501, supra, performing ring rotations to move the displayed time interval backward and forward in time relative to a timepoint line 3052, which remains static in the middle of the screen. As illustrated, a clock icon 3056 reflects the particular point in time indicated at the timepoint line 3052. If the user provides an inward click input at FIG. 30A when the timepoint line 3052 is not within one hour of a pre-existing setpoint (icon 3054), a menu 3058 appears that presents the options "New" and "Done". The user will be allowed to enter a new setpoint for the particular point in time indicated by timepoint line 3052 by appropriate ring rotation and inward click to select "New." However, according to a preferred embodiment as shown in FIG. 30B, if the timepoint line 3052 is within one hour of the pre-existing setpoint 3054, then the icon 3054 grows in size according to an amount of overlap with the timepoint line 3052, going to a fully expanded size when the timepoint line 3052 is directly in the middle of icon 3054 (i.e., directly at the effective time of the pre-existing setpoint), and approaching a regular "background" size as the timepoint line 3052 moves one hour away from the time of that pre-existing setpoint. Importantly, if the user provides an inward click when the timepoint line 3052 is within one hour of the pre-existing setpoint, then the menu 3059 appears, which does not provide a "New" option but instead provides the options of "Change" (to change the effective time or temperature of the pre-existing setpoint), "Remove" (to remove the pre-existing setpoint), and "Done" (to do neither). Advantageously, the user's attention focuses on the expanding and contracting icon 3054, which in addition to being visually pleasing has a temperature value that is easier to read when it is enlarged, as the dial is rotated. When they provide the inward click, the user's attention is focused on the fact that they can change or remove the existing setpoint, rather than any sort of "punishment" for trying to establish a new scheduled setpoint, which they have just been subtly prohibited from doing. Finally, in the event that the user does elect to change the effective time of the pre-existing setpoint icon 3054 (using an intuitive "pick up and carry" method, see U.S. Ser. No. 13/269,501, supra), they are allowed to "carry" the pre-existing setpoint left or right to a new point in time, but as the "carried" icon approaches any other pre-existing setpoint, it will simply stop moving any closer once it is one hour away from that other pre-existing setpoint even if the user keeps rotating the dial. This provides a subtle, non-punishing and non-threatening cue to the user that they have reached the end of the permissible time shift of the "carried" pre-existing setpoint icon.

Figure 31A:
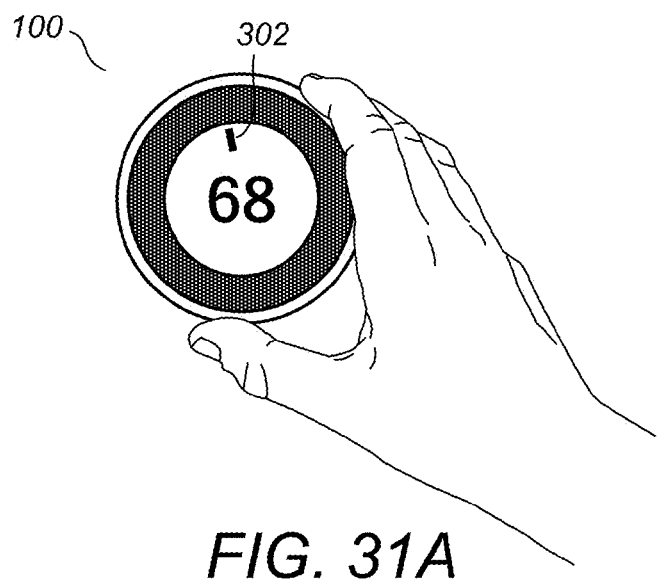
FIGS. 31A-31D illustrate time to temperature display to a user for one implementation.
Figure 31B:
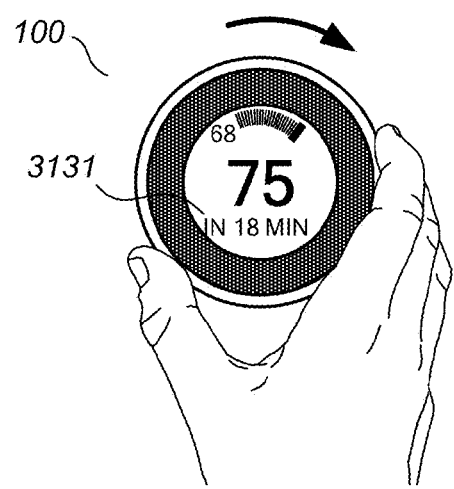
Figure 31C:
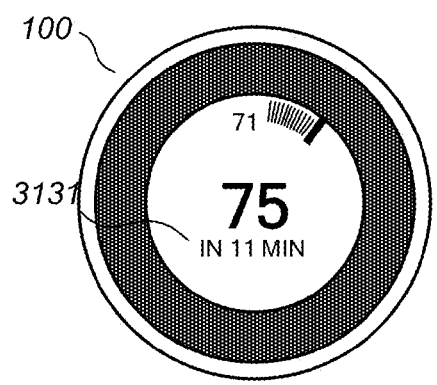
Figure 31D:
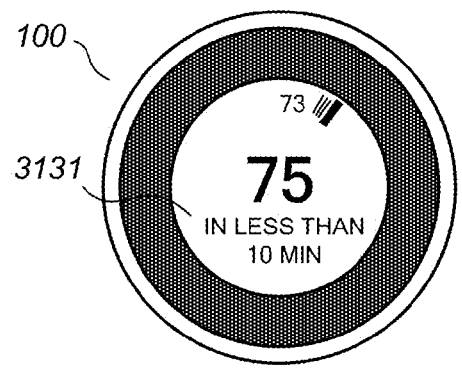

FIGS. 31A-31D illustrate time to temperature display to a user for one implementation. Other aspects of preferred time to temperature displays are described in the commonly assigned U.S. Ser. No. 12/984,602, supra. Preferably, as illustrated FIG. 31B, the time to temperature (hereinafter "T2T") display 3131 is provided immediately to the user based on a quick estimate derived from historical performance data for this particular HVAC system and this particular home as tracked by this particular thermostat. As illustrated in FIG. 31C, whenever the display is activated (such as when the user walks up to the thermostat to check on it and their close presence is detected by the thermostat's active short-range proximity sensor or "PROX"), the T2T display 3131 shows the estimated number of minutes remaining according to an updated estimate of the time remaining Notably, it has been found that due to an appreciable standard deviation of the T2T estimate in many cases, it is preferable to simply display "under 10 minutes" (or other suitable small threshold) if the T2T estimate is less than that amount, lest the user be disappointed or think there is a problem if there is a precise countdown provided that turns out not to be accurate.

Figure 32:
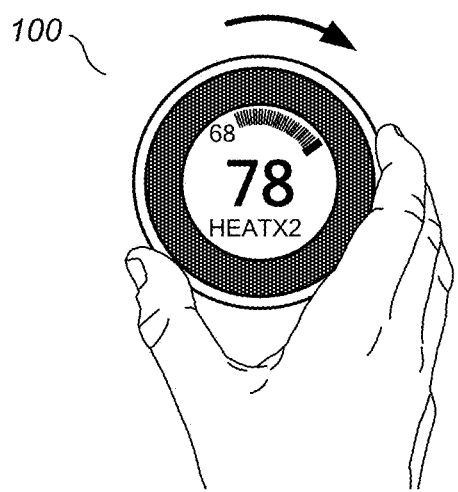
FIG. 32 illustrates an example of a preferred thermostat readout when a second stage heating facility is invoked, according to one embodiment.

FIG. 32 illustrates an example of a preferred thermostat readout when a second stage heating facility is invoked, such as AUX (auxiliary heat strip for heat pump systems) or W2 (conventional second stage heating). According to one preferred embodiment, if the initial time to temperature estimate ("T2T") is more than 20 minutes (or some other threshold indicative of an uncomfortably long time) when the temperature is first turned up (i.e., when the user has turned the dial up or used the remote access facility to turn up the operating setpoint temperature), then the second stage heating facility is automatically invoked by the thermostat. For one embodiment the T2T display can simply be changed to HEATX2 to indicate that the second stage heat facility is activated. Optionally, there can be provided a T2T estimate in addition to the HEATX2 display, where the T2T computation is specially calibrated to take into account the second stage heating facility. The second stage heating facility will usually remain activated for the entire heating cycle until the target temperature is reached, although the scope of the present teachings is not so limited.

Figure 33A:
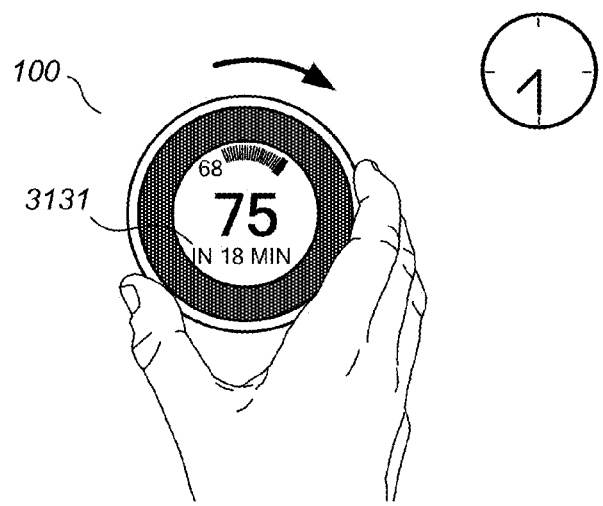
FIGS. 33A-33C illustrate actuating a second stage heat facility during a single stage heating cycle using time to temperature (T2T) information according to a preferred embodiment.
Figure 33B:
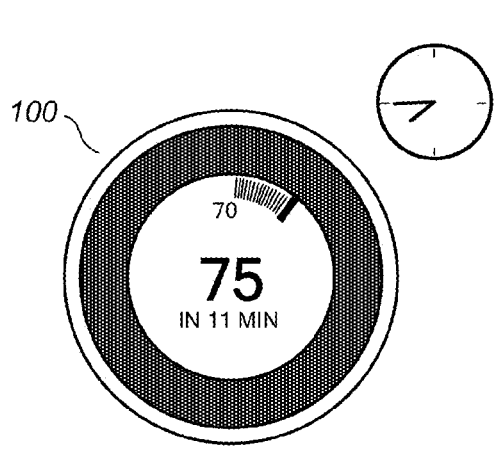
Figure 33C:
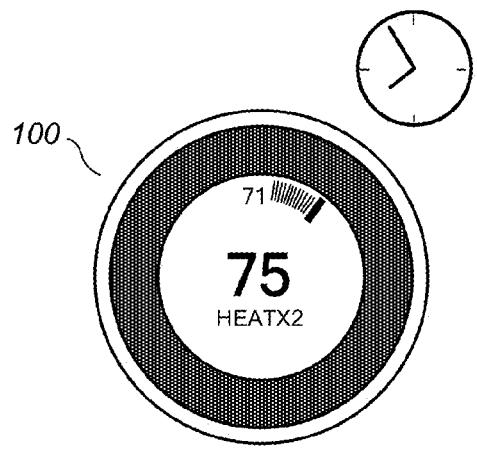

FIGS. 33A-33C illustrate actuating a second stage heat facility during a single stage heating cycle using time to temperature (T2T) information according to a preferred embodiment. For any of a variety of reasons ranging from an open window to a just-completed sunset, it may happen that the HVAC system is "falling behind" what was previously expected using the first heating stage. For one preferred embodiment, such a situation is automatically detected by the thermostat based on time to temperature (T2T) upon which the second stage heating facility is automatically invoked. For one preferred embodiment, if the thermostat determines that it is more than 10 minutes (or other suitable threshold) behind the initial T2T estimate (i.e., if the current T2T estimate reflects that the total time from the beginning of the cycle until the currently estimated end time of the cycle will be more than 10 minutes greater than the initial T2T estimate), then the second stage heating facility will be activated. Stated in terms of an equation, where "t" is the time since the start of the cycle and "T2T(t)" is the time to temperature estimate at the time "t", then the second stage heating facility becomes invoked if $\{[t+T2T(t)]-T2T(0)\}$ becomes greater than 10 minutes (or other suitable threshold). As with the embodiment of FIG. 32, the T2T display can then simply be changed to HEATX2, or optionally there can also be provided a T2T estimate where the T2T computation is specially calibrated to take into account the second stage heating facility. Preferably, if the cycle is almost complete (for example, T2T is only 5 minutes or less) at the point in time at which it is first determined that the system is more than 10 minutes behind the initial estimate, the second stage heating facility will not be invoked. For one preferred embodiment, since it is desirable to keep the head unit processor of thermostat 1800 asleep as often as possible, while at the same time it is desirable to be vigilant about whether the HVAC system is falling too far behind, there is an automated 15-minute wake-up timer that is set by the head unit processor before it goes to sleep whenever there is an active heating cycle in effect. In this way, in the event that the head unit processor is not woken up for some other purpose during the heating cycle, it will wake up every 15 minutes and perform the computations for determining whether the HVAC system is falling behind. The second stage heating facility will usually remain activated until the target temperature is reached, although the scope of the present teachings is not so limited.

Shown in FIGS. 33A-33C is a particular example in which the initial T2T estimate was 18 minutes (FIG. 33A), but the system starting lagging behind and by the time 15 minutes had elapsed (FIG. 33B), there was only modest progress toward the target temperature. As of FIG. 33B, the system is "behind" by 8 minutes since 15 minutes has elapsed and there are still 11 minutes left to go (that is, T2T(15)=11), so the total estimated cycle completion time (from start of cycle) is now 26 minutes, which is 8 minutes more than the initial 18 minute estimate. Finally, in FIG. 33C the system has fallen behind by more than 10 minutes, so the second stage heat facility is activated and the T2T estimate is replaced by HEATX2.

Figure 34:
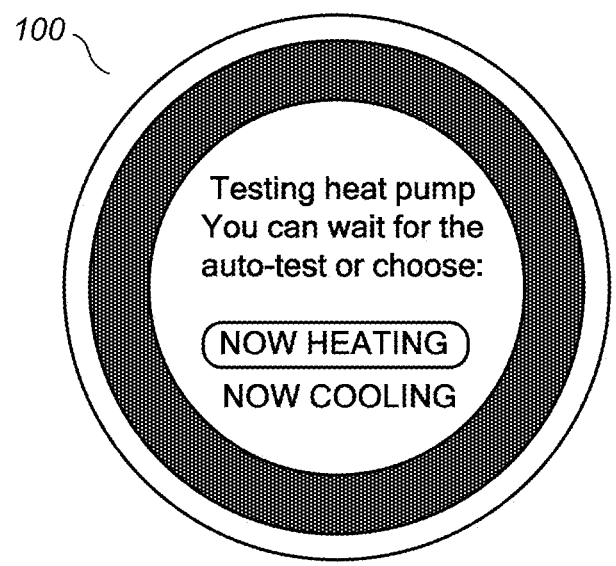
FIG. 34 illustrates a user interface screen presented to a user by a thermostat in relation to a "selectably automated" testing for heat pump polarity according to a preferred embodiment.

FIG. 34 illustrates a user interface screen presented to a user by the thermostat 100 (or 1800) in relation to a "selectably automated" testing for heat pump polarity according to a preferred embodiment. If the user has a heat pump system, as is automatically detected by virtue of the automated detection of a wire in the O/B port described elsewhere in this specification and/or the commonly assigned applications, the selectably automated test will usually occur at or near the end of a setup interview following initial installation for determining whether the heat pump operates according to the so-called "O" convention or the so-called "B" convention. For an "O" convention heat pump heating call, the cooling call (Y1) signal type is energized while the heat pump (O/B) signal type is not energized, while for an opposing "B" convention heat pump heating call the Y1 signal type is energized while the heat pump (O/B) signal type is also energized. As described in the commonly assigned U.S. Ser. No. 13/038,191, supra, the thermostat 100 is capable of performing a completely automated test, in which it first actuates heating (or cooling) according to the "O" convention (which is generally known to be more common for domestic HVAC systems), and then automatically senses by virtue of a rising temperature (or a falling temperature) whether the heat pump is operating according to that "O" convention. If not, then the less-common "B" convention is tried and similarly verified to see if the heat pump is operating according to that "B" convention.

According to some embodiments for further enhancing the user experience at initial setup, further automation and selectable automation is programmed into the thermostat 100 as follows. For one embodiment, the user is not bothered with being required to select between which particular mode (heating versus cooling) will be used for the O/B orientation test, but rather this decision is made automatically by the thermostat based on one or more extrinsic and/or sensed criteria. In one example, based on the ZIP code and current date which has been received and/or downloaded, the thermostat can make an educated guess as to whether to use heating or cooling as the first O/B orientation test. In another example, the current outside weather (as received from the cloud based on ZIP code, for example) is used in conjunction with the current room temperature to make the determination. In yet another example that has been found particularly useful, just the current room temperature is used to make the decision based on a predetermined threshold temperature such as 70 degrees F., wherein the heating mode is first used during the O/B orientation test if the current temperature is below 70 degrees F., and the cooling mode is first used during the O/B orientation test if the current temperature is above 70 degrees F.

Notably, the fully automated O/B orientation test can take some time to finish, since it can take some time to reliably determine the actual temperature trend in the room. According to one preferred embodiment, at the outset of the automated O/B orientation test, the user is presented with the screen of FIG. 34 in which they are told that an automated heat pump test is occurring, but are also given the option of manually intervening to speed up the test, where the manual intervention simply consists of telling the thermostat which function is being performed by the HVAC system, that is, whether the heat is on or whether the cooling is on. Advantageously, the user can choose to intervene by feeling the air flow and answering the question, or they can simply walk away and not intervene, in which case the automated sensing make the determination (albeit over a somewhat longer interval). This "selectably automated" O/B orientation test advantageously enhances the user experience at initial setup.

In one optional embodiment, since it has been found that most users will indeed intervene to provide the right answer and shorten the test anyway, and since a large majority of systems are indeed of the "O" convention, the thermostat 100 can be programmed to default to the "O" convention in the event there is an indeterminate outcome in the automated test (due to an open window, for example, or thermostat internal electronic heating) when the user has indeed chosen not to intervene. This is because the "O" answer will indeed be correct in most cases, and so the number of actual incorrect determinations will be very small, and even then, it is generally not a determination that will cause damage but rather will be readily perceived by the user in relatively short order, and this very small number of users can call customer support to resolve the issue upon discovery. In other embodiments, an indeterminate outcome can raise a warning flag or other alarm that instructs the user to either manually intervene in the test, or to call customer support. In still other alternative embodiments, the "O" configuration is simply assumed to be the case if the user has not responded to the query of FIG. 34 after 10 minutes, regardless of the sensed temperature trajectory, which embodiment can be appropriate if device electronic heating concerns at initial installation and startup are expected to lead to wrong conclusions a substantial percentage of the time, especially since estimates of the prevalence of the "O" configuration have in some cases exceeded 95%.

Provided according to one preferred embodiment is a method for selectively displaying the emotionally encouraging "leaf" described above in the instant application, to encourage the user when they are practicing good energy saving behavior. This algorithm has been found to provide good results in that it can be intuitive, rewarding, and encouraging for different kinds of users based on their individual temperature setting behaviors and schedules, and is not a straight, absolute, one-size-fits-all algorithm. These rules can be applied, without limitation, for walk-up manual dial setpoint changes, when the user is interacting over a remote network thermostat access facility, and when the user is adjusting setpoint entries using a scheduling facility (either walk-up or remote access). When an example is given for heating, it can be assumed that the same rule applies for cooling, except that the direction is opposite and the numerical threshold will be different. One useful set of rules is as follows. A set of judiciously selected predetermined constants for setting forth the rules is first described. Let a heat occupied default setting be H_od=68F (representing a generally good "occupied" heat setting to be at or below). Let a cool occupied default setting be C_od=76F (representing a generally good cool "occupied" setting to be at or above). Let a heat away default be H_ad=H_od−6F=62F (representing a generally good heat "away" setting to be at or below). Let a cool away default be C_ad=C_od+6F=82F (representing a generally good cool "away" setting to be at or above). Let a heat occupied wasting default be H_ow=H_od+6F=74F (representing a generally bad heat "occupied" setting to be above). Finally, let a cool occupied wasting be C_ow=C_od−6F=70F (representing a generally bad cool "occupied" setting to be below).

When the thermostat is new out of the box ("OOB") and has just been installed, there is a default single setpoint of H_od=68 F for heating and C_od=76 F for cooling. For the first 7 days of operation, or some other default initial "OOB" period, if the user keeps the setting at or below H_od (heat) or at or above C_od (cool), the leaf will be shown, in order to encourage initial familiarity with the concept and feelings conveyed. Thus, if the user keeps a heat setpoint at 68 F or below in the first 7 days, then the leaf will be displayed. Preferably, as the user changes the setpoint temperature gradually above 68F (for heating), the leaf will fade out gradually over the first degree F. such that it disappears as 69F is reached. Similar fadeout/fade-in behavior is preferably exhibited for all of the thresholds described herein.

Subsequent to the 7 day period, a set of steady state leaf display rules can apply. Any time the user changes the current setpoint to a temperature that is 2 degrees F. less "energetic" (i.e., 2 degrees F. cooler if heating or 2 degrees warmer if cooling) than the currently scheduled temperature setpoint, then the leaf will be displayed. Likewise, if the user creates a setpoint using the scheduling facility that is 2 degrees less energetic than the existing, previously effective setpoint in the schedule, the leaf will be displayed. Preferably, certain limits are overlaid onto these rules. First, any time the temperature setpoint is below H_ad=62 F for heat or above C_ad=82F for cooling, or moved to these ranges, the leaf will always be displayed. Second, any time the temperature the setpoint is above H_ow=74 F for heat or below C_ow=70 F for cooling, the leaf will never be displayed. The second "limit" rule can be omitted in some embodiments.

Provided according to one preferred embodiment is a self-qualification algorithm by which the thermostat 1800 determines whether it can, or cannot, reliably go into an auto-away state to save energy, i.e., whether it has "sensor confidence" for its PIR activity. For one preferred embodiment, the auto-away facility is disabled for a predetermined period such as 7 days after device startup (i.e., initial installation or factory reset). On days 5, 6, and 7 from startup (or other empirically predetermined suitable sample time period), the PIR activity is tracked by discrete sequential "time buckets" of activity, such as 5-minute buckets, where a bucket is either empty (if no occupancy event is sensed in that interval) or full (if one or more occupancy events is sensed in that interval). Out of the total number of buckets for that time period (24×12×3=864 for 5-minute buckets), if there is greater than a predetermined threshold percentage of buckets that are full, then "sensor confidence" is established, and if there is less than that percentage of full buckets, then there is no sensor confidence established. The predetermined threshold can be empirically determined for a particular model, version, or setting of the thermostat. In one example, it has been found that 3.5% is a suitable threshold, i.e., if there are 30 or more full buckets for the three-day sample, then "sensor confidence" is established, although this will vary for different devices models and settings.

Provided according to another preferred embodiment is a method for the automated computation of an optimal threshold value for the active proximity detector (PROX) of the thermostat 1800, by virtue of additional occupancy information provided by its PIR sensor. In order to conserve power and extend the lifetime of the LCD display and the rechargeable battery, as well as for aesthetic advantages in preventing the thermostat from acting as an unwanted nightlight, the PROX detector is integrated into the thermostat 1800 and polled and controlled by the backplate microcontroller (hereinafter "BPµC") on a consistent basis to detect the close proximity of a user, the LCD display being activated only if there is a walk-up user detected and remaining dark otherwise. Operationally, the PROX is polled by the BPµC at regular intervals, such as every ⅟₆₀th of a second, and a PROX signal comprising a DC-removed version of the PROX readings (to obviate the effects of changes in ambient lighting) is generated by the BPµC and compared to a threshold value, termed herein a "PROX threshold". If the PROX signal is greater than the PROX threshold, the BPµC wakes up the head unit microprocessor ("hereinafter "HUµP"), which then activates the LCD display. It is desirable for the PROX threshold to be judiciously chosen such that (i) the PROX facility is not overly sensitive to noise and background activity, which would lead to over-triggering of the PROX and unnecessary waking of the power-intensive HUµP and LCD display, but that (ii) the PROX is not overly insensitive such that the quality of the user experience in walk-up thermostat use will suffer (because the user needs to make unnatural motion, for example, such as waving their hand, to wake up the unit).

According to one preferred embodiment, the PROX threshold is recomputed at regular intervals (or alternatively at irregular intervals coincident with other HUµP activity) by the HUµP based on a recent history of PROX signal readings, wherein PIR data is included as a basis for selecting the historical time intervals over which the PROX signal history is processed. It has been found that the best PROX thresholds are calculated for sample periods in which the noise in the PROX signal is due to "natural" background noise in the room (such as household lamps), rather than when the PROX signal is cluttered with occupant activity that is occurring in the room which, generally speaking, can cause the determined PROX threshold to be higher than optimal, or otherwise suboptimal. Thus, according to a preferred embodiment, the HUµP keeps a recent historical record of both PIR activity (which it is collecting anyway for the auto-away facility) as well as PROX signal readings, and then periodically computes a PROX threshold from the recent historical PROX data, wherein any periods of PIR-sensed occupant activity are eliminated from the PROX data sample prior to computation of the PROX threshold. In this way, a more reliable and suitably sensitive, but not overly sensitive, PROX threshold is determined. For one embodiment, the BPµC keeps one sample of the PROX signal data for every 5 minutes, and transfers that data to the HUµP each time the HUµP is woken up. For one embodiment, the HUµP keeps at least 24 hours of the PROX signal data that is received from the BPμC, and recomputes the PROX threshold at regular 24 hour intervals based on the most recent 24 hours of PROX data (together with a corresponding 24 hours of PIR-sensed occupancy data, such as the above-described auto-away "buckets" of activity). For another embodiment, the PROX threshold is recomputed by the HUμP every time it is about to enter into a sleep state. The recomputed PROX threshold is transferred to the BPμC, which then uses that new PROX threshold in determining whether a PROX event has occurred. In other preferred embodiments, the thermostat is further configured to harness the available ALS (ambient light sensor) data to generate an event better PROX threshold, since it is known that ambient light can add to the background PROX signal noise as well as to the DC value of the PROX readings.

Studies have shown that people (segmentations) react very differently to different styles of "nudges" or prompts to change their energy behavior. For one preferred embodiment, there is provided a way on the thermostat 1800 (and on the corresponding web facility) to measure people's responses to different energy prompts. Not only can this provide the right energy saving prompts for an individual over time, but in aggregate, the data can be an enormously useful resource to drive greater efficiency nationwide. By prompt, it is meant that some people are motivated to act by comparing them to their neighbors, some by estimating the money they have lost by not taking certain steps (such as insulation), some by estimating numbers of barrels of oil saved, etc. According to a preferred embodiment, tracking software and algorithms for grouping different prompts are provided in conjunction with the thermostat 1800 (much like web portals use to target advertising or anticipate search results). By understanding what characterizes groups of people who respond to similar prompts, there could be achieved: save more energy for learning thermostat customers, further the marketing potential of the thermostat units, and contribute to some of the biggest questions governments, nonprofits, academics and utilities are dealing with today which is how to change behavior to save energy or otherwise affect the greater good?

The presently described embodiments relate to "closing the loop" on the visual reinforcement algorithms provided by the thermostat by detecting, monitoring, and measuring what the user is doing—if anything—responsive to the operation of the visual reinforcement algorithm. Data can then be collected for a large number of users, and then analyzed to see if the visual reinforcement algorithm is effective. Correlations can be made between particular groupings of users (including but not limited to age, number of people in household, income, location, etc.) and particular visual reinforcement algorithms. Based on correlations that have been found to be successful, the visual reinforcement algorithms can then be changed or "tuned" for each individual household or other applicable customer grouping.

In one example, provided is a thermostatic control system with closed-loop management of user interface features that encourage energy saving behaviors. In a simplest example of the invention, the thermostat can operate according to the following steps: (1) Carry out a first visual reinforcement algorithm, such as the "leaf algorithm". (2) When the customer earns a reward, display to them the "reward leaf". (3) For the first minute (or hour, or day) after showing the "reward leaf", monitor the customer's inputs (if any) and report those inputs to the central Nest server over the internet. (4) Analyze the customer's inputs (either separately or in conjunction with a similar group of customers) to determine if the basic "leaf algorithm" was a "success" for that customer (or that group of customers). (5) If the basic leaf algorithm was not a "success" for that customer or grouping of customers, then automatically download a different visual reinforcement algorithm to that customer's thermostat (or grouping of customer thermostats). By way of a hypothetical example, if the positive-reinforcement "leaf algorithm" was not successful, the replacement visual reinforcement algorithm could be a negative-reinforcement "smokestack" algorithm. (6) Repeat steps (2)-(5) as needed to optimize energy saving behavior according to some optimization criterion.

In one more complex embodiment of the invention, the thermostats can operate according to the following steps: (1) Over a population of different installations, carry out many different visual reinforcement algorithms for many different customers, on a random basis or according to some predetermined distribution scheme; (2) Each time a user is shown a "reward" (or "punishment") according to their particular visual reinforcement algorithm, monitor the customer's inputs (if any) for the first minute (or hour, or day) after showing the "reward" (or "punishment"), and report those inputs to the central Nest server over the internet; (3) Analyze the collected data to determine correlations between the success of certain visual reinforcement algorithms and the classifications of customers, geographies, etc. for which they are successful; (4) Automatically download the successful visual reinforcement algorithms for the corresponding customers, geographies, etc. for which they are successful. (5) When commissioning new thermostat installations, automatically program in the particular visual reinforcement algorithms most likely to be successful for that particular customer (e.g., based on the setup interview, purchase data, customer address, and so forth).

For some embodiments, what can be measured is the result of efficiency "infosnacks" shown on the thermostat display, like "You are using 40% more energy than your neighbors" or "Nest has calculated that your home would be X % more efficient with proper insulation" or "By not using the AC one day a week you would save 120$ a month." What people act on, what people ignore, what people want to get more information about can begin to be discovered. Messages could be sent to each user depending on what they respond to and in aggregate conclusions could be drawn about the kinds of efficiency information folks respond to and why. Studies have shown that when given timely and relevant information about their energy use, consumers can reduce their energy use by 4%-15%. The trouble is, no one quite sure what makes this info relevant and therefore effective. With all the data that can be gotten from users, the thermostat 1800 including its surrounding ecosystem as described hereinabove can help answer that question.

Platform Architecture. According to some embodiments, further description regarding platform architecture for a VSCU unit will now be provided. The VSCU is a powerful, flexible wall-mounted energy management solution. The hardware platform is open and extensible, allowing the system to be used in many applications besides the ones that have been targeted initially.

Overview. The VSCU unit is split into two halves. (1) A head unit: this unit contains the main processor, storage, local area wireless networking, display and user interface. Also included are a range of environmental sensors plus a rechargeable battery and power management subsystems. It is removable by the user and can be connected to a computer for configuration; and (2) a backplate: this unit installs on the wall and interfaces with the HVAC wiring. It provides power to the head unit and also facilitates control of the attached HVAC systems. Optionally, it may also include a cellular wireless interface. This split allows significant flexibility in terms of installation type whilst allowing the most complex part of the system to remain common and be mass-produced.

Head Unit. The VSCU head unit is a powerful self-contained ARM Linux system, providing ample compute resource, local storage, and networking in addition to an elegant user interface. The design has been optimized for low power operation, taking advantage of processor power saving modes and mDDR self-refresh to reduce power consumption to minimal levels when the system isn't actively being used. The main sections of the head unit are as follows.

Processor and Memory. A Texas Instruments AM3703 system-on-chip is used as the CPU. This provides: (1) ARM Cortex A8 core with 32 k I-Cache, 32 k D-Cache and 256 k of L2, running at up to 800 MHz at 1.3 v. The intended operation point for this part is however 300 MHz/1.0 v in order to conserve power; and (2) mDDR interface, connected to a 32 Mb×16 mDDR (64 MBytes). When not actively in use, the processor will be forced into a STANDBY mode (likely Standby 1). This power and clock gates most of the SoC to minimize both leakage and dynamic power consumption whilst retaining DDR contents and being able to wake on any GPIO event or timer tick. In this mode, the SoC and memory are expected to dissipate less than 5 m W of power.

Power Management. The AM3703 is powered by a TI TPS65921 PMU. This part is closely coupled to the CPU and provides power for the CPU, SoC, mDDR and 10. Peripherals that do not run from 1.8V are powered off discrete low dropout voltage regulators (LDOs) as this PMU is not intended to power the rest of the system. The PMU also provides a USB2-HS PHY which connects to the USB-mini-B connector on the back of the head unit, used for PC-based configuration.

Mass Storage. A single 256 MB/512 MB SLC NAND flash chip is used to provide the system's mass storage. SLC flash is used to ensure data integrity—we do not want to suffer from boot failures due to data degradation or read disturb. Most SLC flash retains data for 10 years and up to 100,000 cycles. In order to ensure that pages do not get worn out, MTD/JFFS2 is expected to be used for the partitions that are rewritten frequently—this is not required for area that are just read such as X-Loader, U-Boot, etc. Redundant copies of U-Boot, kernel and root file system are stored on the NAND to provide a fallback should a software update go awry.

Display & User Interface. A memory-mapped RGB color display with 320×320 pixel resolution and LED backlight provides the primary user interface. The backlight brightness can be adjusted with a CPU-driven PWM and can be automatically adjusted based on light sensed by the ambient light sensor. To deal with situations where the head unit is not running (e.g.: head unit hardware failure, battery discharged, etc.), a single tricolor LED connected to the backplate MCU provides a secondary means of informing the user about the device state. A rotary control with push actuation provides user input functionality. If the device is pushed in for 10 seconds, the head unit will reboot; this is a hardcoded feature provided by the TI PMU.

Wireless Communications. The primary communications interface is an 802.11 b/g Wi-Fi module based on the TI WL1271 chip, connected via MMC2. Through this interface the VSCU unit can communicate with the server farm and provide secure remote control of the HVAC system in addition to updating temperature and climate models, reporting problems and updating software. In addition to Wi-Fi, a ZigBee transceiver is provided to communicate both with other products (such as auxiliary thermostats, other VSCU head units, baseboard heater controllers) and also with Smart Energy profile devices. The ZigBee interface is capable of running as a coordinator (ZC) if there is sufficient power available. ZigBee uses the TI CC2533 ZigBee transceiver/controller and is connected to UART2.

Configuration Interface. A mini-B USB socket, only visible when the head unit is removed from the backplate, is provided to allow configuration of the device from a PC or Mac. The device will appear to be a USB-MSC device when connected, so no drivers are required on the host side.

Reset. The head unit can be reset by the MCU if required.

Sensors. Most sensors are located in the backplate, and are read over the serial interface; this allows more flexibility with PD to ensure that they are ideally located. However, one sensor is located on the head unit as it needs to be in close proximity to the display—the Ambient Light Sensor/Proximity. A Silicon Labs ALS/proximity sensor senses ambient light (to adjust LCM backlighting) and also near-field proximity to activate the UI when a user approaches the device. The interrupt line of this device is capable of waking the CPU from standby modes.

Backplate Unit. The backplate unit interfaces with the HV AC system, providing control of attached HV AC components and also supplying power to the head unit.

Power supplies. A high voltage LDO provides a 3.1 v bootstrap for the MCU; this can be disabled under MCU control but it is expected that this will be left enabled to provide a "safety net" if the head unit supply vanishes for any reason—such as the head unit being removed unexpectedly. The input to this LDO is provided by diode-OR'ing the heat 1, cool 1 and common wire circuits together. In normal operation, a 3.3 v LDO on the head unit powers the backplate circuitry; because of the high input voltage to this LDO, it cannot supply significant current without a lot of heat dissipation. The second supply in the backplate is the high voltage buck. The input to this supply can be switched to heat 1, cool 1 or the common wire under MCU control—only one input is expected to be selected at a time. The HV buck can supply a maximum of 100 mA at 4.5 v.

The output current of the buck is not limited; however, the input on the head unit is current limited and can be set to one of 3 valid configurations: (1) 20 mAJ4.5 v (90 mW)—low setting for troublesome HVAC systems (FORCE__100 mA low, DOUBLE_CURRENT low); (2) 40 mAJ4.5 v (180 m W)—default setting for power stealing (FORCE 100 mA low, DOUBLE CURRENT high); and (3) 100 mAJ4.5 v (450 mW)—highest setting, forced by backplate to bring a head unit with low battery back to operational state (FORCE__100 mA high, DOUBLE_CURRENT low).

The voltage on the buck's input capacitor can be measured by the MCU, allowing it to momentarily open the WI or YI contacts during an "enabled" phase in order to recharge the buck input cap and continue to power steal. This would only be used in a single circuit system (1 heat OR 1 cool). When used with two circuits (heat and cool), the system would power steal from the non-shorted circuit; with a common wire circuit, the system would not power steal at all.

Switching. The user install backplate provides switching for 1 heat (WI), 1 cool (YI), fan (G), aux heat (AUX) plus heat pump changeover control (O/B). The pro backplate adds secondary heat (W2), secondary cool (Y2), emergency heat (E), plus dry contacts for a humidifier and dehumidifier. The regular HV AC circuits are switched using source-to-source NFETs with transformer isolated gate drive, giving silent switching. The dry contact circuits use bistable relays with two coils (set and reset) to open and close the circuits.

Sensors. Several sensors are connected to the MCU so that the device can sense the local environment. Temp/Humidity and pressure sensors are connected via the I2C bus and three PIR sensors are also connected on the development board (one analog, two digital). (1) Temperature and humidity: a Sensirion SHT21 sensor provides accurate temperature and humidity sensing whilst taking less than 150 uW of power (150 uW=1 reading per second). (2) Pressure: a Freescale MEMS pressure sensor allows measurement of air pressure whilst taking less than 40 u W of power (~1 high resolution reading per second). Fast air pressure changes can indicate occupancy (and HVAC activity). (3) Passive Infra-red movement sensors: three PIR sensors are present on the board according to some embodiments: (a) Murata PIR with filter/preamp: this part is fed into an analog input on the MCU, and also to a window comparator to provide a digital output. The analog circuitry effectively provides the filtering required to remove the DC bias and provide a motion sense output to the MCU; and (b) Two Perkin-Elmer digital PIRs: these are connected to the MCU and are bit-banged to read the internal ADCs. This raw value has no DC offset but still requires software filtering to reveal motion activity.

MCU. The backplate MCU processor is a TI MSP 430F5529 CPU, providing: (1) 12 ADC channels for: (a) Voltage measurement/presence detect for common wire and 8 HV AC circuits; (b) Voltage measurement of HV buck input capacitor; and (c) Head unit VBAT measurement; (2) 3 PWM channels for driving the tricolor LED on the head unit (backplate emergency status); (3) 1 PWM channel to provide the ~5 MHz transformer drive needed to switch HV AC circuits; (4) 8 GPIOs to enable the HVAC switches once the PWM is running; (5) 4 GPIOs to set and reset the two dry contact relays; (6) 3 GPIOs to select the HV buck's input source; (7) 2 GPIOs to enable/disable the LDO and HY buck; (8) 2 I2C buses, one for the temp/humidity sensor and one for the pressure sensor; (9) 1 GPIO connected to the pressure sensors end of conversion output; (10) 3 GPIOs for PIR connection; (11) 1 GPIO to detect head unit presence; (12) 1 GPIO to reset the head unit; (13) 1 GPIO to force the head unit's charger to take 100 MA; (14) One UART for head unit communication; and (15) One UART for debug (e.g. for a development board).

Reset and watchdog. The backplate MCU uses a watchdog to recover from any crashes or instabilities (eg: ESD related events that destabilize the MCU). In addition, the head unit can reset the backplate MCU under software control by driving the RESET_BACKPLATE line high. This signal is RC filtered to prevent false triggers from transient events.

Head unit—backplate interface. The interface between the two parts of the system consists of 20 pins: (1) Power input (2 pins): power is supplied from the backplate to the head unit to nm the system and charge the head unit's local battery, which provides both a buffer for high current peaks (including radio operation) and also battery-backup for continued operation during power failures; (2) Power output (3 pins): power is supplied from the head unit to the backplate to enable high current consumption when required (for example, switching a bistable relay). The VBAT supply is intended only for use by a cellular communication device and for MCU monitoring; (3) Signal ground (2 pins): ground reference for signaling; (4) Low speed communications (2 pins): a UART interface is used for head unit-backplate communications in all configurations. This interface provides identification/authentication, sensor sampling, and control. Typically, this interface runs at 115,200 bps and is connected to a small MCU in the backplate; (5) High speed communications (3 pins): a USB1.1 12 Mbps host interface is also presented by the head unit. This can be used by advanced backplates to enable high performance networking or HV AC control, at a small power penalty above and beyond what is required for the low speed interface. Advanced backplates are not typically power-limited; (6) Detection (2 pins): one grounded at the backplate and one grounded at the head unit, allow each end to detect mating or disconnection and behave appropriately; (7) Head and backplate reset signals (active high: NFET gate drive via RC filter to pull reset lines low); (8) LED cathode connections for RGB LED mounted in head unit; and (9) 5× current limit switch to force fast charging in low battery situations Boot Scenarios. Some common boot scenarios will now be described, according to some embodiments:

Scenario 1: Out of box experience (battery not empty): (1) User has wired backplate up correctly. MCU LDO has booted MCU; (2) User connects head unit (battery PCM in protection mode); (3) Default 20 mA limit in charger resets PCM protection mode, VBAT recovers to ~3.7 v; (4) PMU turns on; (5) MCU measures VBAT, releases head unit reset; and (6) Communications established with MCU.

Scenario 2: Out of box experience (battery empty): (1) User has wired backplate up correctly. MCU LDO has booted MCU; (2) User connects head unit (battery PCM in protection mode); (3) Default 20 mA limit in charger resets PCM protection mode, VBAT is <3 Av; (4) PMU samples battery voltage but it is below the EEPROM-stored VMBCH_SEL value of 3 Av so does not power on; (5) MCU measures VBAT, sees low voltage. MCU forces 100 mA charge and turns on indicator LED; (6) When VBAT passes VMBCH_SEL voltage of 3 Av, head unit will power up; (7) Communications established with MCU; and (8) Head unit asks MCU to turn off LED.

Scenario 3: Head unit crashed: (1) Head unit in zombie state, not talking to MCU, battery voltage ok; (2) MCU notes no valid commands within timeout period; (3) MCU turns HV buck off to cut power, then asserts head unit reset; (4) MCU turns HV buck on again, releases reset; and (5) Communications established with MCU.

Scenario 4: Backplate unit crashed: (1) Backplate unit in zombie state, not replying to SoC; (2) SoC resets MCU; and (3) Communications established with MCU.

Scenario 5: Head unit VI lockup: (1) Head unit UI locked up, but lower levels are functioning (MCU comms still active, so MCU will not reset UI); (2) User notices no screen activity, presses and holds button for 10 seconds causing SoC reboot; and (3) Communications established with MCU.

Power Consumption. The system's average power consumption is determined by a few variables: (1) Power in standby mode; (2) Power in active mode; and (3) Power in interactive mode.

Standby Mode. This mode is the one in which the system will reside "most of the time". The definition of "most of the time" can vary, but it should be able to reside in this state for >95% of the product's life. In this mode, the MCU is running but the head unit is in standby mode. HVAC circuits can be active, and the head unit can be woken into active mode by several events: (1) Proximity sensor or rotary event: The interrupt line from the prox is directly connected to the SoC and so can cause a wake directly. (2) Wi-Fi: The WL IRQ line, connected to the SoC, can wake the head unit when a packet arrives over Wi-Fi (presumably, the chipset would be programmed to only interrupt the SoC on non-broadcast packets when it was in standby); (3) ZigBee: Data from the ZigBee chip can wake the SoC (eg: incoming ZigBee packets); (4) Timer: The system can wake from the RTC timer. This is likely to be used for periodic events such as maintenance of push connections over Wi-Fi and data collection; and (5) Backplate comms: Incoming communications from the backplate will wake the head unit. This could be sensor data or alarm notifications from HV AC monitoring.

The MCU is expected to enter power saving states itself regularly in order to reduce power drain—even if it is waking at 10 Hz to sample the pressure sensor, for example. Because this part of the system is always powered, improvements in efficiency here can make more difference than optimization of rarely used head unit states. The expected ballpark for head unit power consumption in this mode is: 4 mW for CPU/DDR, 2 mW for PMU, 4 mW for Wi-Fi (estimated based on other known chip sets), 2 mW for other items=11 mW. The expected ballpark for backplate power consumption in this mode (with no HVAC loads switched) is ~5 mW, but will change slightly depending on what frequency sensors are polled.

Active Mode (display off). In active mode, the head unit is powered up, but the display is off. This mode is expected to be in use hundreds of times per day, but for very short periods of time (hopefully <10 seconds each event). Typical reasons the system would transition to active mode include: (1) User activity: active mode would be transitioned through on the way to interactive mode; (2) Sensor data collection: the backplate may have buffered environmental data that needs to be fed to the control algorithm and processed in order to determine whether a response is needed; (3) Push connection: in order to maintain a TCP connection through most NAT routers, data must be transferred periodically. The head unit would use active mode to perform this connection maintenance; and (4) Website-initiated action: here, a user requested action on the servers would result in data being sent over the push connection, causing the Wi-Fi module to wake the SoC to process the data and perform any necessary actions.

Given the relatively high power nature of this mode, care should be taken to ensure that any action is completed and "tided up" before the system is put back into standby mode. For example, if a command if sent to the MCU which generates a response, the response should be gathered before the standby transition is made, otherwise the system may end up bouncing between active and standby mode, wasting power unnecessarily. The same type of problem could also occur with network connections (e.g.: TCP closes). Average power dissipated in this mode could be in the 200 mW range depending on Wi-Fi activity and processor loading.

Interactive Mode (display on): This is the mode in which the user actually interacts with the device. Given that the system is fully active—screen on, backlight on, low latency performance desired—the power footprint is the largest of any of the operational modes. However, because user interactions are likely to be brief and infrequent—especially if the device is performing as intended—their impact on average system power is expected to be very low. It is expected that interactive mode will have a relatively long timeout (maybe as much as 60 seconds) before the unit transitions into active mode and then to standby. It would be worth having the unit stay in active mode for a significant time—maybe 30 seconds or more—on the way down so that if the user starts to interact with the device again, the response is instantaneous. Average power in this mode is likely to be greater than 300 mW depending on Wi-Fi activity, processor loading, and display backlight brightness.

Example Power Consumption Calculation. Table 1 shows how the total system power consumption might be calculated.

TABLE 1

| Mode | Power | Time in mode | Times per day | % | Ave. Power per 24 h |
|---|---|---|---|---|---|
| Interactive | 300 mW | 60 s | 4 | 0.28% | 0.83 mW |
| Active | 200 mW | 10 s | 192 | 2.22% | 4.44 mW |
| Standby | 11 mW | 84,240 s | 1 | 97.50% | 10.73 mW |
| | | | | Average Power | 16 mW |

As can be seen from Table 1, the dominant power is that of standby, though waking the head unit 8 times per hour (192 times per day) is also not insignificant. Switching each HVAC zone also takes power, estimated at ~1 mA @ 3.3v (i.e., 4.5 mW of power at the HV buck output assuming the battery is full). We are likely to be switching multiple circuits concurrently—at least 1H/1C+fan. This can significantly increase our power consumption and hence also needs to be optimized appropriately.

Power Supply. From surveys, it would appear that we are likely to be able to draw 40 mA @ 5 vdc from the HV buck; as this is a switching converter, this 200 mW power should translate directly to 44 mA @ 4.5 vdc in our system. Initially, it was thought that we may only be able to take 100 mW or less from the HV AC circuits, so this is good news. Note that in any system that has both heat and cool (but NOT heat pump), the system can power steal from the non-activated circuit ensuring that we have 200 mW of power available at all times.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments are not intended to limit their scope.

What is claimed is:

1. A thermostat, comprising:
   a frustum-shaped shell body having a circular cross-section and a central axis generally perpendicular to a wall when the thermostat is wall-mounted, the frustum-shaped shell body comprising a sidewall that extends along a length of the central axis between first and second ends of the frustum-shaped shell body, the first end of the frustum-shaped shell body being wall-facing when the thermostat is wall-mounted, the second end of the frustum-shaped shell body being user-facing when the thermostat is wall-mounted, the sidewall comprising inside and outside surfaces, the inside surface defining an interior for housing components of the thermostat;
   a circular rotatable ring mounted proximate the second end of the frustum-shaped shell body, the circular rotatable ring having an axis of rotation generally perpendicular to the wall when the thermostat is wall-mounted, the circular rotatable ring being user rotatable about the axis of rotation, wherein the circular rotatable ring rotatable slides about a frame of the thermostat, the circular rotatable ring having an inwardly extending lip or edge surface that is parallel to the wall when the thermostat is wall mounted, said inwardly extending lip or edge being positioned within a groove of the frame, and wherein a corresponding bearing surface of the frame is greased or otherwise lubricated to smooth and dampen rotational movement of the circular rotatable ring;
   a circular cover mounted proximate the second end of the frustum-shaped shell body, the circular cover having a central axis generally perpendicular to the wall when the thermostat is wall-mounted, the circular cover comprising a clear circular center portion surrounded by a colored outer portion;

at least one temperature sensor for use in sensing an ambient air temperature;

a plurality of HVAC (heating, ventilation, and air conditioning) wire terminals configured to receive a plurality of HVAC wires;

a dot-matrix color display element mounted at a location between the second end of the frustum-shaped shell body and the circular cover, the dot-matrix color display element and the circular cover not rotating when the circular rotatable ring is rotated and the thermostat is wall-mounted; and a processing system provided in operative communication with the plurality of HVAC wire terminals, the circular rotatable ring, the dot-matrix color display element, and the at least one temperature sensor, the processing system configured to:

cause the dot-matrix color display element to display a numerical value representative of a temperature value;

determine a user-selected temperature value based on user rotation of the circular rotatable ring; and send a control signal to the HVAC system via at least one of the HVAC wire terminals based at least in part on a comparison of a user-selected temperature value and the sensed ambient temperature;

wherein said outside surface of said frustum-shaped shell body sidewall has a metallic appearing finish and wherein said sidewall increases in diameter along the central axis from the first end of the frustum-shaped shell body to the second end of the frustum-shaped shell body such that an acute angle is formed exterior to the thermostat between the outside surface of the sidewall and the wall when the thermostat is wall-mounted, whereby a naturally blending visual appearance of the thermostat with the wall is promoted by virtue of the frustum-shaped shell body, the metallic-appearing finish, and the acute angle when the thermostat is mounted to the wall; and wherein the dot-matrix color display element is non-circular and the clear circular center portion of the circular cover permits a circular portion of the non-circular dot-matrix color display element to be visible through the circular cover, the colored outer portion of the circular cover masking a remaining portion of the non-circular dot-matrix color display element so as to create a circular graphical user interface.

2. The thermostat of claim 1, the thermostat further comprising:

a wall-mountable back plate configured to detachably couple to the second end of the frustum-shaped shell body so as to provide electrical power to the processing system and the dot-matrix color display element, the back plate comprising:

the plurality of HVAC wire terminals configured to receive the plurality of HVAC wires; labels associated with the wire connectors to aid thermostat installation; and a bubble level to aid level wall mounting of the thermostat.

3. The thermostat of claim 1, the thermostat further comprising:

a passive infrared (PIR) sensor that senses infrared radiation to detect a proximal user presence, wherein the processing system is configured to activate the dot-matrix color display element upon receiving a signal indicating the proximal user presence from the PIR sensor.

4. The thermostat of claim 3, wherein the PIR sensor is located within the thermostat on a vertical axis that perpendicularly intersects the central axis and extends vertically in a direction parallel to the wall when the thermostat is wall-mounted.

5. The thermostat of claim 1, the thermostat further comprising:

an audio output device to output sound.

6. The thermostat of claim 5, wherein the processing system is configured to cause the audio-output device to output synthesized audible ticks in correspondence with user rotation of the circular rotatable ring.

7. The thermostat of claim 6, wherein the non-circular dot-matrix color display presents the numerical value representative of the temperature value substantially centered on the central axis.

8. The thermostat of claim 1, wherein the at least one temperature sensor comprises:

a first temperature sensor that senses a first temperature; and a second temperature sensor located in a different location within the thermostat than the first temperature sensor relative to one or more heat generating internal components of the thermostat, the second temperature sensor sensing a second temperature, wherein the processing system is configured to calculate the ambient temperature using said first and second sensed temperatures.

9. The thermostat of claim 1, wherein an exterior surface of the thermostat formed by said frustum-shaped shell body and said circular cover is free of vents and grilles.

10. A thermostat, comprising:

a frustum-shaped shell body having a circular cross-section and a central axis generally perpendicular to a wall when the thermostat is wall-mounted, the frustum-shaped shell body comprising a sidewall that extends along a length of the central axis between first and second ends of the frustum-shaped shell body, the first end of the frustum-shaped shell body being wall-facing when the thermostat is wall-mounted, the second end of the frustum-shaped shell body being user-facing when the thermostat is wall-mounted, the sidewall comprising inside and outside surfaces, the inside surface defining an interior for housing components of the thermostat, the outside surface of the sidewall having a metallic appearing finish, the sidewall increasing in diameter along the central axis from the first end of the frustum-shaped shell body to the second end of the frustum-shaped shell body such that an acute angle is formed exterior to the thermostat between the outside surface of the sidewall and the wall when the thermostat is wall-mounted, whereby a naturally blending visual appearance of the thermostat with the wall is promoted by virtue of the frustum-shaped shell body, the metallic-appearing finish, and the acute angle when the thermostat is mounted to the wall;

a circular rotatable ring mounted proximate the second end of the frustum-shaped shell body, the circular rotatable ring comprising an axis of rotation generally perpendicular to the wall when the thermostat is wall-mounted, the circular rotatable ring being user rotatable about the axis of rotation, wherein the circular rotatable ring rotatable slides about a frame of the thermostat, the circular rotatable ring having an inwardly extending lip or edge surface that is parallel to the wall when the thermostat is wall mounted, said inwardly extending lip or edge being positioned within a groove of the frame, and wherein a corresponding bearing surface of the frame is greased or otherwise lubricated to smooth and dampen rotational movement of the circular rotatable ring;

a circular cover mounted proximate the second end of the frustum-shaped shell body, the circular cover comprising a central axis generally perpendicular to the wall when the thermostat is wall-mounted, the circular cover comprising a clear circular center portion surrounded by a colored outer portion;

at least one temperature sensor for use in sensing an ambient air temperature;

a plurality of HVAC (heating, ventilation, and air conditioning) wire terminals configured to receive a plurality of HVAC wires;

a passive infrared (PIR) sensor that senses infrared radiation to detect a proximal user presence;

a dot-matrix color display element mounted at a location between the second end of the frustum-shaped shell body and the circular cover, the dot-matrix color display element and the circular cover do not rotate when the circular rotatable ring is rotated and the thermostat is wall-mounted;

a processing system provided in operative communication with the plurality of HVAC wire terminals, the PIR sensor, the circular rotatable ring, the dot-matrix color display element, and the at least one temperature sensor, the processing system configured to: activate the dot-matrix color display element upon receiving a signal indicating the proximal user presence from the PIR sensor; cause the dot-matrix color display element to display a numerical value representative of a temperature value; determine a user-selected temperature value based on user rotation of the circular rotatable ring; and send a control signal to the HVAC system via at least one of the HVAC wire terminals based at least in part on a comparison of a user-selected temperature value and the sensed ambient temperature.

11. The thermostat of claim 10, the thermostat further comprising:

a wall-mountable back plate configured to detachably couple to the second end of the frustum-shaped shell body so as to provide electrical power to the processing system and the dot-matrix color display element, the back plate comprising:

the plurality of HVAC wire terminals configured to receive the plurality of HVAC wires; labels associated with the wire connectors to aid thermostat installation; and a bubble level to aid level wall mounting of the thermostat.

12. The thermostat of claim 10, wherein the PIR sensor is located within the thermostat on a vertical axis that perpendicularly intersects the central axis and the vertical axis extends vertically when the thermostat is wall-mounted.

13. The thermostat of claim 10, wherein:

the dot-matrix color display element is non-circular and the clear circular center portion of the circular cover permits a circular portion of the non-circular dot-matrix color display element to be visible through the circular cover; and the colored outer portion of the circular cover masks a remaining portion of the non-circular dot-matrix color display element so as to create a circular graphical user interface.

14. The thermostat of claim 10, the thermostat further comprising: an audio output device to output sound.

15. The thermostat of claim 14, wherein the processing system is configured to cause the audio-output device to output synthesized audible ticks in correspondence with user rotation of the circular rotatable ring.

16. The thermostat of claim 15, wherein the non-circular dot-matrix color display presents the numerical value representative of the temperature value centered on the central axis.

17. The thermostat of claim 10, wherein the at least one temperature sensor comprises: a first temperature sensor that senses a first temperature; and a second temperature sensor located in a different location within the thermostat than the first temperature sensor relative to one or more heat generating internal components of the thermostat, the second temperature sensor sensing a second temperature, wherein the processing system is configured to calculate the ambient temperature using the first and second sensed temperatures.

18. The thermostat of claim 10, wherein an exterior surface of the thermostat formed by the frustum-shaped shell body and the circular cover is free of vents and grilles.

\* \* \* \* \*